(12) United States Patent
Yamazaki et al.

(10) Patent No.: US 9,306,079 B2
(45) Date of Patent: Apr. 5, 2016

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Shunpei Yamazaki, Setagaya (JP); Hideomi Suzawa, Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 14/054,110

(22) Filed: Oct. 15, 2013

(65) Prior Publication Data
US 2014/0103339 A1    Apr. 17, 2014

(30) Foreign Application Priority Data

Oct. 17, 2012    (JP) .................................. 2012-230351
Nov. 6, 2012    (JP) .................................. 2012-244907

(51) Int. Cl.
*H01L 29/786*    (2006.01)
*H01L 29/26*    (2006.01)
*H01L 29/66*    (2006.01)
*H01L 21/02*    (2006.01)

(52) U.S. Cl.
CPC ...... *H01L 29/78693* (2013.01); *H01L 21/0262* (2013.01); *H01L 21/02554* (2013.01); *H01L 21/02565* (2013.01); *H01L 21/02631* (2013.01); *H01L 29/263* (2013.01); *H01L 29/66969* (2013.01); *H01L 29/78696* (2013.01)

(58) Field of Classification Search
CPC ..................... H01L 29/7869; H01L 29/78696; H01L 29/42384
See application file for complete search history.

(56) References Cited

U.S. PATENT DOCUMENTS

| 5,470,762 | A | 11/1995 | Codama et al. |
| 5,528,032 | A | 6/1996 | Uchiyama |
| 5,731,856 | A | 3/1998 | Kim et al. |
| 5,744,864 | A | 4/1998 | Cillessen et al. |
| 5,757,030 | A | 5/1998 | Codama et al. |

(Continued)

FOREIGN PATENT DOCUMENTS

| CN | 101621075 | 1/2010 |
| EP | 1737044 A | 12/2006 |

(Continued)

OTHER PUBLICATIONS

U.S. Appl. No. 14/277,465.*

(Continued)

*Primary Examiner* — John C Ingham
(74) *Attorney, Agent, or Firm* — Robinson Intellectual Property Law Office; Eric J. Robinson

(57) ABSTRACT

A semiconductor device formed using an oxide semiconductor layer and having small electrical characteristic variation is provided. A highly reliable semiconductor device including an oxide semiconductor layer and exhibiting stable electric characteristics is provided. Further, a method for manufacturing the semiconductor device is provided. In the semiconductor device, an oxide semiconductor layer is used for a channel formation region, a multilayer film which includes an oxide layer in which the oxide semiconductor layer is wrapped is provided, and an edge of the multilayer film has a curvature in a cross section.

12 Claims, 49 Drawing Sheets

(56) References Cited

U.S. PATENT DOCUMENTS

| | | | |
|---|---|---|---|
| 6,030,873 A | 2/2000 | Iwamatsu et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,035,103 B2 | 10/2011 | Kimura |
| 8,148,779 B2 | 4/2012 | Jeong et al. |
| 8,237,166 B2 | 8/2012 | Kumomi et al. |
| 8,378,351 B2 | 2/2013 | Fukumoto et al. |
| 8,420,456 B2 | 4/2013 | Okamoto |
| 8,476,719 B2 | 7/2013 | Endo et al. |
| 8,525,304 B2 | 9/2013 | Endo et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1* | 11/2007 | Kim et al. ....................... 257/43 |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0180045 A1 | 7/2009 | Yoon et al. |
| 2009/0206332 A1 | 8/2009 | Son et al. |
| 2009/0236596 A1 | 9/2009 | Itai |
| 2009/0250693 A1 | 10/2009 | Jeong et al. |
| 2009/0250701 A1 | 10/2009 | Kimura |
| 2009/0278122 A1 | 11/2009 | Hosono et al. |
| 2009/0280600 A1 | 11/2009 | Hosono et al. |
| 2009/0321731 A1 | 12/2009 | Jeong et al. |
| 2009/0321732 A1 | 12/2009 | Kim et al. |
| 2010/0038641 A1 | 2/2010 | Imai |
| 2010/0059746 A1 | 3/2010 | Itai |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0283049 A1 | 11/2010 | Sato et al. |
| 2011/0127523 A1 | 6/2011 | Yamazaki |
| 2011/0140100 A1 | 6/2011 | Takata et al. |
| 2011/0156026 A1 | 6/2011 | Yamazaki et al. |
| 2011/0193083 A1 | 8/2011 | Kim et al. |
| 2011/0240990 A1 | 10/2011 | Yamazaki |
| 2011/0284846 A1 | 11/2011 | Endo et al. |
| 2011/0309411 A1 | 12/2011 | Takemura |
| 2012/0032730 A1 | 2/2012 | Koyama |
| 2012/0085974 A1 | 4/2012 | Kizaki |
| 2012/0086000 A1 | 4/2012 | Mizoguchi et al. |
| 2012/0104385 A1 | 5/2012 | Godo et al. |
| 2012/0119205 A1 | 5/2012 | Taniguchi et al. |
| 2012/0153278 A1 | 6/2012 | Jeong et al. |
| 2012/0161126 A1 | 6/2012 | Yamazaki |
| 2012/0161133 A1 | 6/2012 | Yamazaki |
| 2012/0175609 A1 | 7/2012 | Yamazaki |
| 2012/0187395 A1 | 7/2012 | Koezuka |
| 2012/0187397 A1 | 7/2012 | Yamazaki et al. |
| 2012/0229724 A1 | 9/2012 | Miyairi et al. |
| 2012/0267624 A1* | 10/2012 | Isobe et al. ....................... 257/43 |
| 2012/0305913 A1 | 12/2012 | Yamazaki et al. |
| 2012/0319183 A1 | 12/2012 | Yamazaki et al. |
| 2013/0320330 A1 | 12/2013 | Yamazaki |
| 2013/0320334 A1 | 12/2013 | Yamazaki et al. |
| 2013/0334533 A1 | 12/2013 | Yamazaki |
| 2014/0001465 A1 | 1/2014 | Yamazaki |
| 2014/0008647 A1 | 1/2014 | Yamazaki |
| 2014/0014947 A1 | 1/2014 | Yamazaki |
| 2014/0027762 A1 | 1/2014 | Tsurume et al. |
| 2014/0042433 A1 | 2/2014 | Yamazaki |
| 2014/0042434 A1 | 2/2014 | Yamazaki |
| 2014/0042435 A1 | 2/2014 | Yamazaki |
| 2014/0042436 A1 | 2/2014 | Yamazaki |
| 2014/0042437 A1 | 2/2014 | Yamazaki |
| 2014/0042438 A1 | 2/2014 | Yamazaki |
| 2014/0084287 A1 | 3/2014 | Yamazaki |
| 2014/0091301 A1 | 4/2014 | Yamazaki |

FOREIGN PATENT DOCUMENTS

| | | | |
|---|---|---|---|
| EP | 2141743 A | 1/2010 |
| EP | 2226847 A | 9/2010 |

(56) References Cited

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-132303 A | 5/1994 |
| JP | 06-268224 | 9/1994 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-236202 A | 9/2005 |
| JP | 2006-165528 A | 6/2006 |
| JP | 2007-142287 A | 6/2007 |
| JP | 2009-032794 A | 2/2009 |
| JP | 2010-016348 A | 1/2010 |
| JP | 2011-222767 | 11/2011 |
| JP | 2011-243745 | 12/2011 |
| JP | 2011-243745 A | 12/2011 |
| JP | 2012-059860 A | 3/2012 |
| JP | 2012-119564 A | 6/2012 |
| JP | 2012-119672 A | 6/2012 |
| JP | 2012-169605 A | 9/2012 |
| JP | 2012-191023 A | 10/2012 |
| KR | 2010-0002504 A | 1/2010 |
| KR | 2012-0099342 A | 9/2012 |
| TW | 201244096 | 11/2012 |
| WO | WO-2004/114391 | 12/2004 |
| WO | WO-2007/017982 | 2/2007 |

OTHER PUBLICATIONS

U.S. Appl. No. 14/053,919.*
International Search Report (Application No. PCT/JP2013/078251) Dated Jan. 21, 2014.
Written Opinion (Application No. PCT/JP2013/078251) Dated Jan. 21, 2014.
Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.
Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.
Ikeda.T et al., "Full-Functional System Liquid Crystal Display Using CG-Silicon Technology,", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.
Nakamura.M et al., "The phase relations in the In2O3—Ga2ZnO4—ZnO system at 1350° C,", Journal of Solid State Chemistry, Aug. 1, 1991, vol. 93, No. 2, pp. 298-315.
Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical Properties,", J. Appl. Phys. (Journal of Applied Physics), Feb. 1, 2003, vol. 93, No. 3, pp. 1624-1630.
Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZP (Ga2O3—In2O3—ZnO) TFT," SID Digest '08 : SID International Symposium of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.
Tsuda.K at al., "Ultra Low Power Consumption Technologies for Mobile TFT-LCDs,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase,",", Physics Letters, Sep. 10, 1973, Vol. 45A, No. 2, pp. 115-116.

(56) References Cited

OTHER PUBLICATIONS

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "SPINEL,YbFe2O4, and Yb2Fe3O7 Types of Structures for Compounds in the In2O3 and Sc2O3—A2O3—BO Systens [A; Fe, Ga, or Al; B: Mg, Mn, Fe, Ni, Cu, or Zn] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Sympoium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 97, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

FIG. 39A1
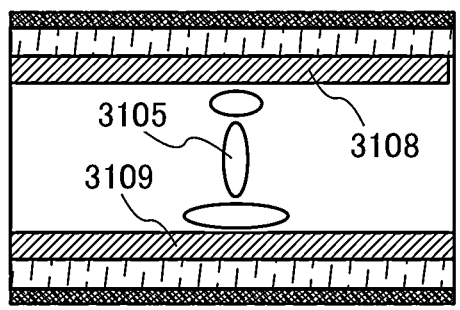
FIG. 39A2
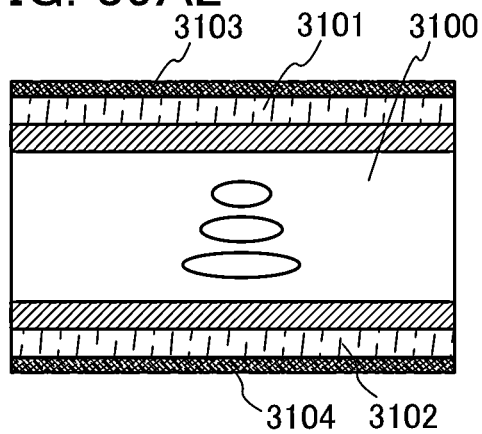
FIG. 39B1
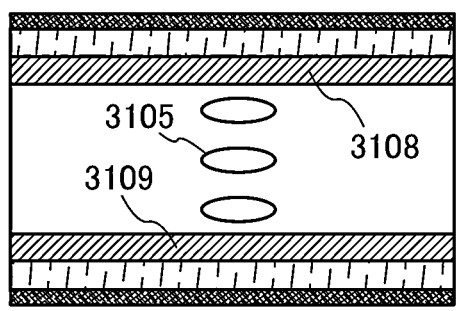
FIG. 39B2
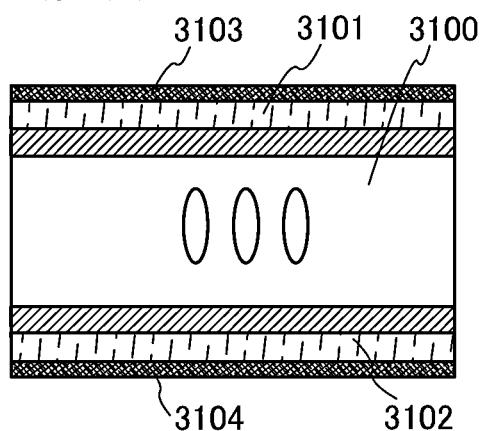
FIG. 39C1
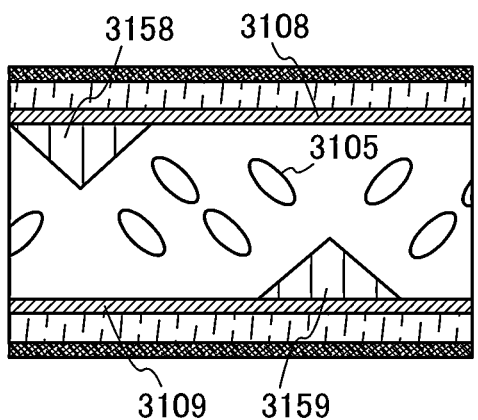
FIG. 39C2
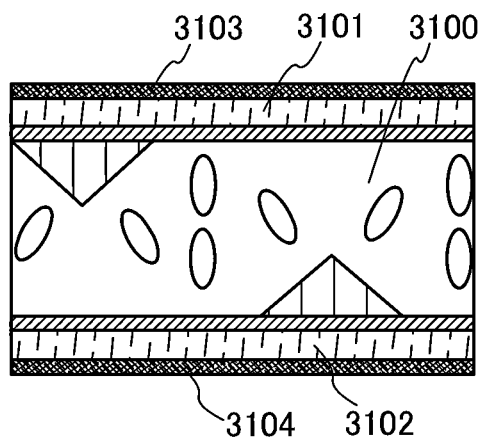

FIG. 40A1 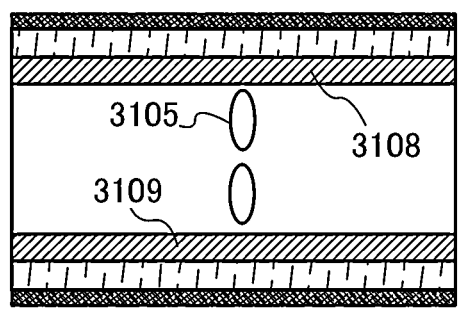
FIG. 40A2 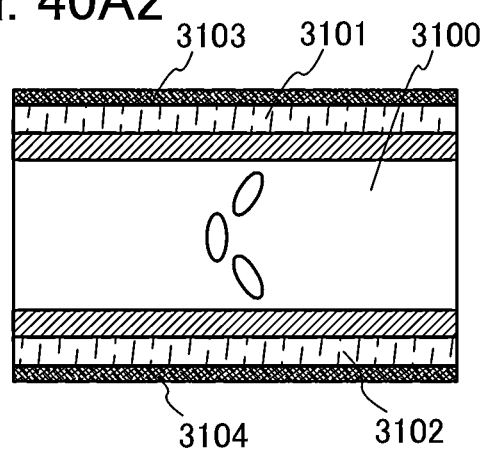
FIG. 40B1 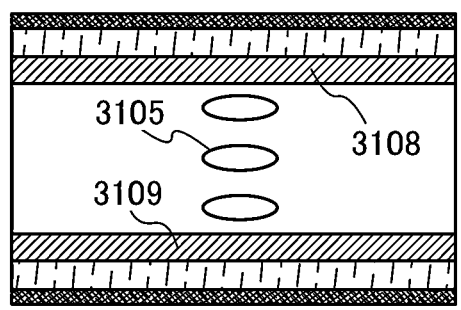
FIG. 40B2 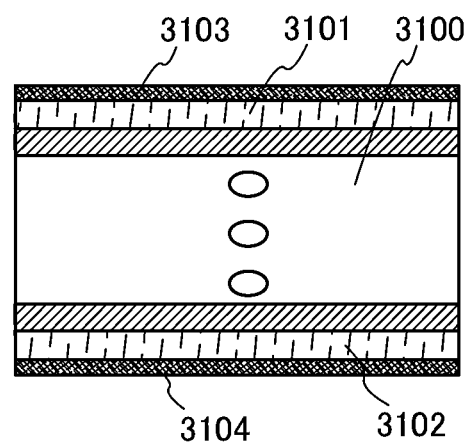

FIG. 41A1
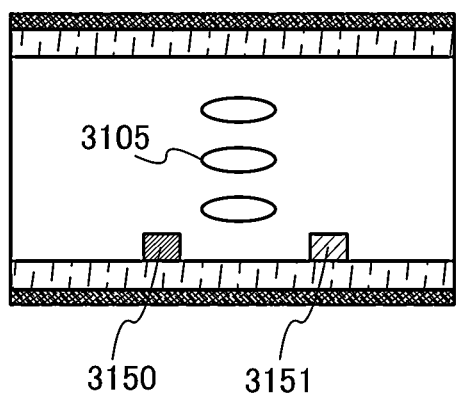
FIG. 41A2
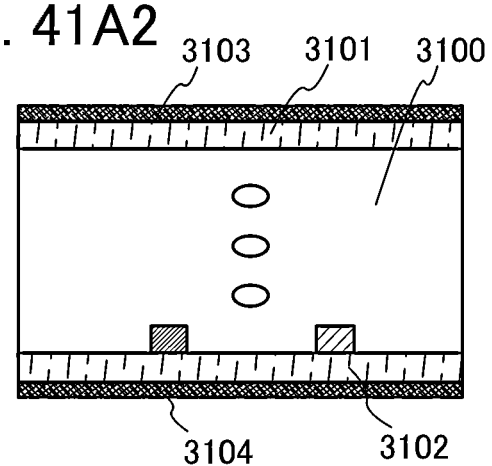
FIG. 41B1
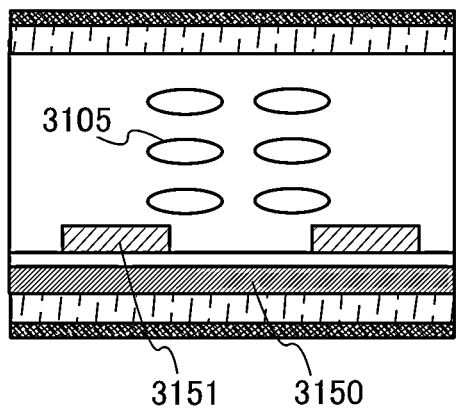
FIG. 41B2
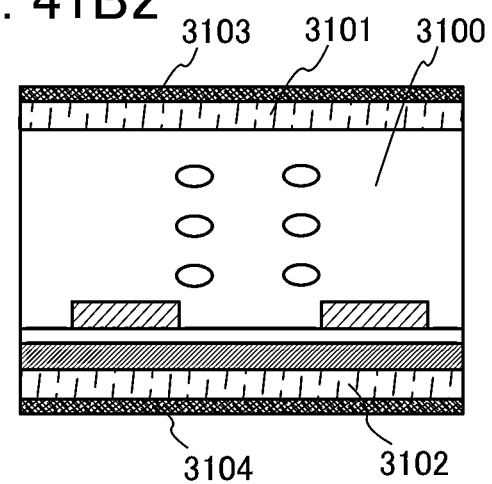

2 μm

300nm

100nm

100nm

2 μm

2 μm

SEMICONDUCTOR DEVICE AND METHOD FOR MANUFACTURING THE SAME

TECHNICAL FIELD

The present invention relates to a semiconductor device and a method for manufacturing the semiconductor device.

In this specification, a semiconductor device generally means a device which can function by utilizing semiconductor characteristics, and an electrooptic device, a semiconductor circuit, and electronic equipment are all semiconductor devices.

BACKGROUND ART

Attention has been focused on a technique for forming a transistor using a semiconductor thin film (also referred to as a thin film transistor (TFT)). Such a transistor is applied to a wide range of electronic devices such as integrated circuits (ICs) or image display devices. A silicon-based semiconductor material is widely known as a material for a semiconductor thin film applicable to a transistor. As another material, an oxide semiconductor has been attracting attention.

For example, a transistor including an amorphous oxide containing indium (In), gallium (Ga), and zinc (Zn) as a channel formation region is disclosed (see Patent Document 1).

Further, it is known that oxygen is released from an oxide semiconductor in a manufacturing process to form oxygen vacancies (see Patent Document 2).

REFERENCE

Patent Documents

[Patent Document 1] Japanese Published Patent Application No. 2006-165528

[Patent Document 2] Japanese Published Patent Application No. 2011-222767

DISCLOSURE OF INVENTION

Release of oxygen or generation of oxygen vacancies in a manufacturing process is likely to occur particularly in a side surface of an oxide semiconductor layer. When oxygen vacancies are generated in the side surface of the oxide semiconductor layer, the resistance of the side surface is reduced and an apparent threshold voltage of the transistor is changed, which causes a problem that threshold-voltage variation is increased. Further, by the change of the threshold voltage, unintended current flows between a source and a drain, so that off-state current of the transistor is increased; accordingly the electrical characteristics of the transistor deteriorate.

In view of the above problem, an object of one embodiment of the present invention is to provide a semiconductor device formed using an oxide semiconductor layer and having small electrical characteristic variation. Another object is to provide a highly reliable semiconductor device including an oxide semiconductor layer and exhibiting stable electric characteristics. Further, an object is to provide a semiconductor device having stable electric characteristics. Another object is to provide a highly reliable semiconductor device. Another object is to provide a semiconductor device with low power consumption. Another object is to provide a semiconductor device which is less likely to have a defective shape. Another object is to provide a method for manufacturing the semiconductor device. Another object is to provide a method for manufacturing a semiconductor device with high productivity. Another object is to provide a method for manufacturing a semiconductor device with high yield.

In the semiconductor device of one embodiment of the present invention, an oxide semiconductor layer is used for a channel formation region, a multilayer film which includes an oxide layer in which the oxide semiconductor layer is wrapped is provided, and an edge of the multilayer film has a curvature in a cross section.

The oxide semiconductor layer and the oxide layer contain at least indium. The oxide layer has a higher energy gap than the oxide semiconductor layer, and the oxide semiconductor layer has a higher proportion of indium than the oxide layer. Typically, an oxide containing indium, zinc, and an element M may be used for the oxide semiconductor layer and the oxide layer. Further, the oxide layer preferably has a higher proportion of the element M than the oxide semiconductor layer.

As the element M, gallium, aluminum, silicon, titanium, germanium, yttrium, zirconium, tin, lanthanum, cerium, hafnium, or the like is preferably used. For the oxide layer, an oxide which has a high proportion of the above elements is preferably used. Any of these elements strongly bonds to oxygen and high energy is needed for forming an oxygen vacancy, so that oxygen vacancies are not likely to occur. Therefore, oxygen vacancies are not likely to occur in the oxide layer having a high atomic proportion of any of these elements and the oxide layer has stable characteristics. Accordingly, when the oxide semiconductor layer is wrapped in the oxide layer, oxygen vacancies are not likely to be formed at the edge of the oxide semiconductor layer, so that a semiconductor device having stable characteristics can be obtained.

Further, since the edge of the multilayer film has a curvature in the cross section, coverage with a film to be formed over the multilayer film can be improved. With such a structure, the film formed over the multilayer film can be formed evenly, and thus a region which has a low film density or a region where a film is not formed is less likely to be formed. Accordingly deterioration of the characteristics of the semiconductor device due to the entry of an impurity element from the region having a low film density or the region where a film is not formed into the multilayer film does not occur, so that the semiconductor device can have stable characteristics. Note that it is particularly preferable that the multilayer film have a curvature at its one side surface, its bottom edge, or its bottom and top edges.

Further, the oxide layer may include a first oxide layer below the oxide semiconductor layer, a second oxide layer over the oxide semiconductor layer, and a third oxide layer covering the side surface of the oxide semiconductor layer. Further, a distance between the surface of the oxide semiconductor layer and the surface of the oxide layer in the side portion of the multilayer film may be longer than that in the top portion of the multilayer film. Further, the thickness of the multilayer film may be greater than or equal to $\frac{1}{50}$ and less than or equal to 50 times as large as a curvature radius of the side surface of the multilayer film. Such a structure enables prevention of a reduction in reliability of the semiconductor device using the oxide layer in which the oxide semiconductor layer is wrapped.

Further, a base insulating film may be provided below the multilayer film. A region of the base insulating film which overlaps with the multilayer film has a larger thickness than the other region of the base insulating film. Further, the base insulating film may include a first region overlapping with the multilayer film, a second region surrounding the first region, and a third region surrounding the second region. The second region may have a smaller thickness than the first region and the third region have a smaller thickness than the second region. The base insulating film having the steps (also referred to as a step shape) improves step coverage with a film to be formed over the base insulating film and the multilayer film, so that a shape defect or the like of the semiconductor device can be prevented.

Another embodiment of the present invention is a method for manufacturing a semiconductor device, including the steps of forming a first oxide film, an oxide semiconductor film, and a second oxide film sequentially; forming a resist mask over the second oxide film; performing first etching on the second oxide film and the oxide semiconductor film using the resist mask to form an island-shaped second oxide layer and an island-shaped oxide semiconductor layer; and forming an island-shaped first oxide layer by second etching on the first oxide film and forming a third oxide layer on a side surface of the oxide semiconductor layer by attachment of a reaction product generated in the second etching onto the side surface of the oxide semiconductor layer.

Note that heat treatment may be performed in an oxidation gas atmosphere after the resist mask is removed.

According to one embodiment of the present invention, electrical characteristic variation of a semiconductor device including an oxide semiconductor layer can be reduced. Further, a semiconductor device having improved reliability and exhibiting stable electrical characteristics can be provided. Furthermore, the semiconductor device can be manufactured.

BRIEF DESCRIPTION OF DRAWINGS

FIGS. 39A1 to 39C2 are cross-sectional views illustrating examples of a pixel of a liquid crystal device of one embodiment of the present invention.

FIGS. 40A1 to 40B2 are cross-sectional views illustrating examples of a pixel of a liquid crystal device of one embodiment of the present invention.

FIGS. 41A1 to 41B2 are cross-sectional views illustrating examples of a pixel of a liquid crystal device of one embodiment of the present invention.

BEST MODE FOR CARRYING OUT THE INVENTION

Figure 1A:
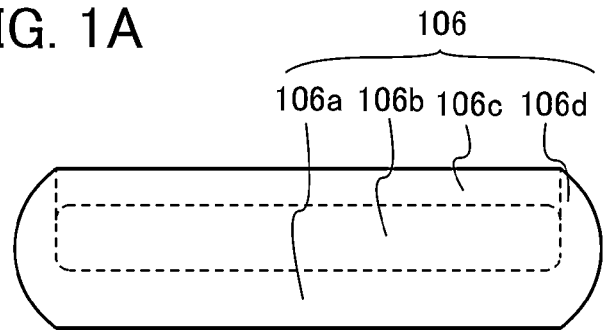
FIGS. 1A to 1D are cross-sectional views of a multilayer film of one embodiment of the present invention.

Hereinafter, embodiments of the present invention will be described in detail with reference to the accompanying drawings. However, the present invention is not limited to the following description, and it is easily understood by those skilled in the art that modes and details disclosed herein can be modified in various ways. Therefore, the present invention is not construed as being limited to description of the embodiments. In describing structures of the present invention with reference to the drawings, the same reference numerals are used in common for the same portions in different drawings. Note that the same hatch pattern is applied to similar parts, and the similar parts are not especially denoted by reference numerals in some cases.

Note that a resist mask or the like might be reduced unintentionally owing to treatment such as etching in an actual manufacturing process; however, the reduction is not shown in some cases for easy understanding.

Further, the ordinal numbers such as "first" and "second" are used for convenience and do not denote the order of steps or the stacking order of layers. In addition, the ordinal numbers in this specification do not denote particular names which specify the present invention.

Note that a voltage refers to a potential difference between a certain potential and a reference potential (e.g., a ground potential (GND) or a source potential) in many cases. Accordingly, a voltage can also be called a potential.

Even when the expression "to be electrically connected" is used, there is a case in which no physical connection is made and a wiring is just extended in an actual circuit.

Further, functions of a source and a drain might be switched when a direction of current flow is changed in circuit operation, for example. Therefore, the terms "source" and "drain" can be switched in this specification.

The descriptions in this embodiment can be combined with each other as appropriate.

<1. Multilayer Film Including Oxide Semiconductor Layer>

A multilayer film including an oxide semiconductor layer which enables a transistor to have stable electric characteristics is described.

<1-1. Structure of Multilayer Film>

In this section, the structure of the multilayer film is described.

FIGS. 1A to 1D each illustrate a cross-sectional structure of a multilayer film 106. The multilayer film 106 includes an oxide layer 106a, an oxide semiconductor layer 106b which is provided over the oxide layer 106a, an oxide layer 106c which is provided over the oxide semiconductor layer 106b, and an oxide layer 106d which is provided in contact with at least the side surface of the oxide semiconductor layer 106b. Note that the oxide layer 106d has a curved surface. Note that there is a case where the oxide layer 106a, the oxide layer 106b, and the oxide layer 106d cannot be strictly distinguished from each other; therefore, boundaries between them are not illustrated in some cases.

Figure 1B:
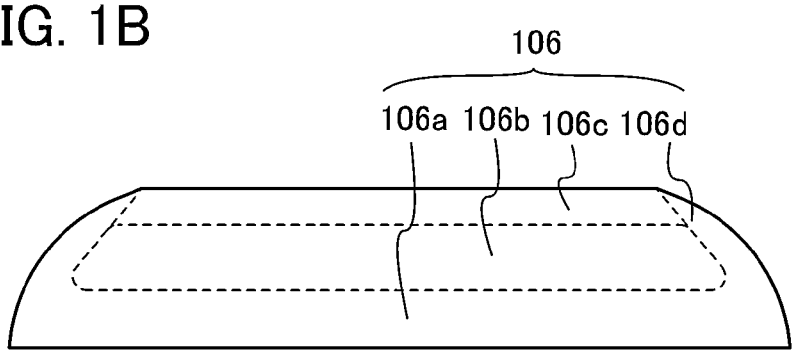

At the side surface of the multilayer film 106 in each of the cross-sections illustrated in FIGS. 1A and 1B, the oxide layer 106d has a curvature (curved surface) of one osculating circle (also referred to as a circle of curvature). Further, at the side surface of the multilayer film 106 in each of the cross-sections illustrated in FIGS. 1C and 1D, the oxide layer 106d has the top edge and bottom edge each of which has a curvature of one osculating circle.

Figure 1C:
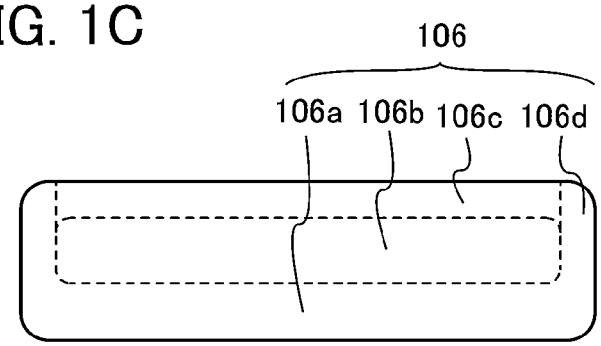
Figure 1D:
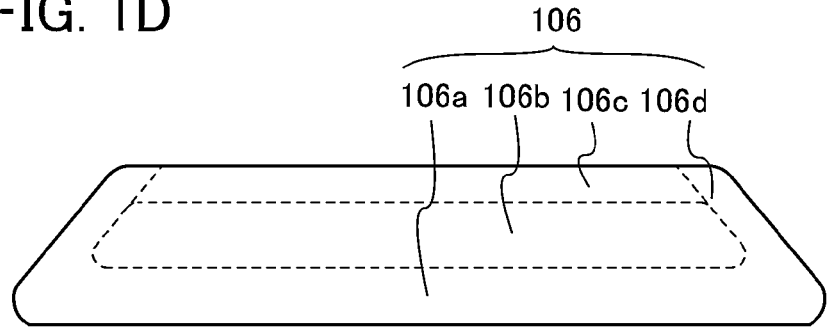

In the multilayer film 106, an angle which is formed by the bottom surface of the oxide layer 106a and the side surfaces of the oxide layer 106a, the oxide semiconductor layer 106b, and the oxide layer 106c may be a substantially right angle as illustrated in FIGS. 1A and 1C, or may be a slope angle (taper angle) as illustrated in FIGS. 1B and 1D.

In this manner, when the oxide layer 106d, which has a curved surface, is provided at the side surface, which is part of the multilayer film 106, generation of a shape defect of a transistor including the multilayer film 106 can be prevented.

<1-1-1. Oxide Layer Forming Edge of Multilayer Film>

Figure 2A:
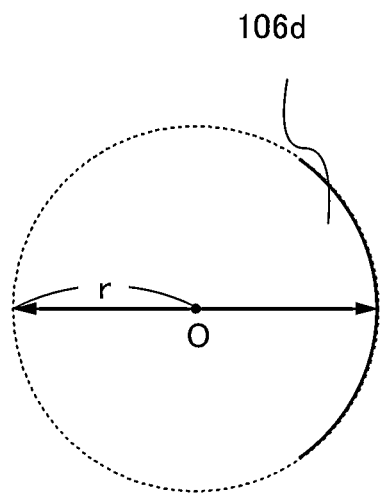
FIGS. 2A to 2C illustrate curvature radius.
Figure 2B:
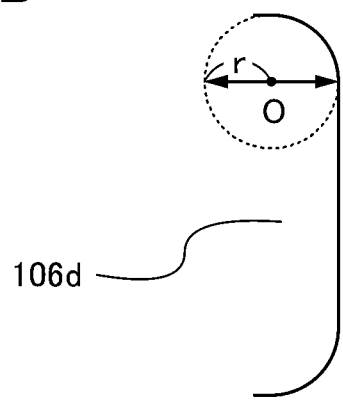
Figure 2C:
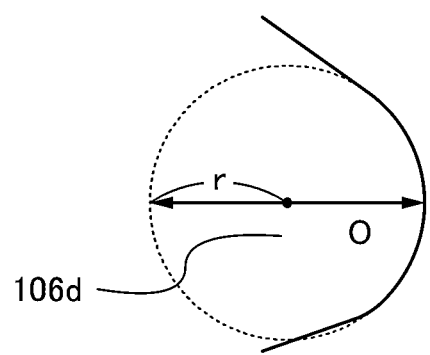

The curved surfaces of the oxide layer 106d are described using FIGS. 2A to 2C.

FIG. 2A is a cross-sectional view of the oxide layer 106d that corresponds to the side surface of the multilayer film 106 in each of the cross sections illustrated in FIGS. 1A and 1B. The oxide layer 106d illustrated in FIG. 2A has a curvature of an osculating circle having a curvature radius of r. Note that the curvature radius is equal to the radius of the osculating circle of a curve.

FIG. 2B is a cross-sectional view of the oxide layer 106d that corresponds to the side surface of the multilayer film 106 in each of the cross sections illustrated in FIGS. 1C and 1D. The oxide layer 106d in FIG. 2B has a curvature of an osculating circle having a curvature radius of r at each of its top and bottom edges. The curvature of the top edge may be different from that of the bottom edge.

The oxide layer 106d in FIG. 2C has a curvature of an osculating circle having a curvature radius of r. Note that the oxide layer 106d may have two or three curvatures of different osculating circles.

At this time, the curvature radius r is greater than or equal to $1/50$ and less than or equal to 50 times, preferably greater than or equal to $1/20$ and less than or equal to 20 times, further preferably greater than or equal to $1/10$ and less than or equal to 10 times, still further preferably greater than or equal to $1/5$ and less than or equal to 5 times as large as a thickness t of the multilayer film 106 (the total thickness of the oxide layer 106a, the oxide semiconductor layer 106b, and the oxide layer 106c)

<1-2. Formation Mechanism of Multilayer Film>

A formation mechanism of the multilayer film 106 including the oxide layer 106d having a curved surface is described.

<1-2-1. Formation Mechanism (1)>

An example of the formation mechanism of the multilayer film 106 including the oxide layer 106d having a curved surface is described with reference to FIGS. 3A to 3C, FIGS. 4A to 4C, and FIGS. 5A and 5B.

Figure 3A:
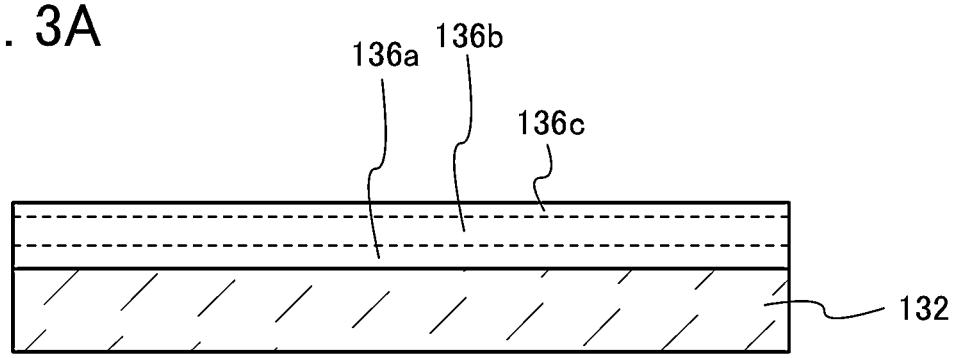
FIGS. 3A to 3C are cross-sectional views illustrating a formation mechanism of a multilayer film of one embodiment of the present invention.

First, a multilayer film which includes an oxide layer 136a provided over a base insulating film 132, an oxide semiconductor layer 136b provided over the oxide layer 136a, and an oxide layer 136c provided over the oxide semiconductor layer 136b is prepared (see FIG. 3A).

Figure 3B:
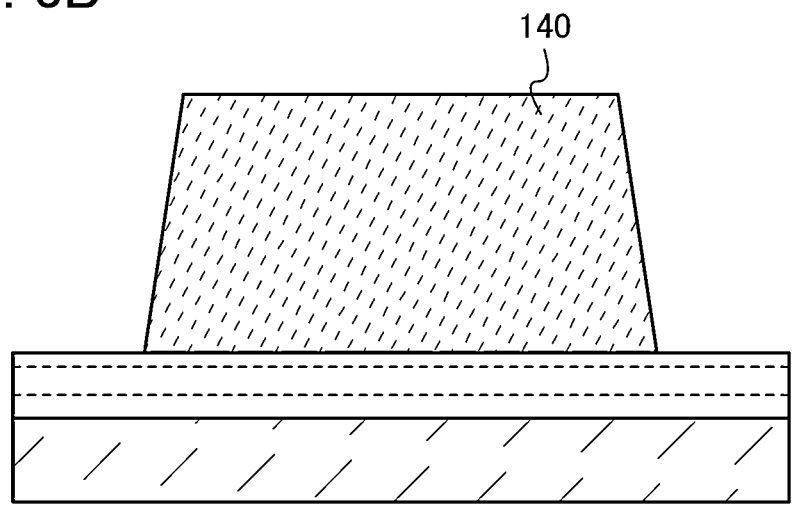

Next, a resist mask 140 is formed over part of the oxide layer 136c (see FIG. 3B).

Figure 3C:
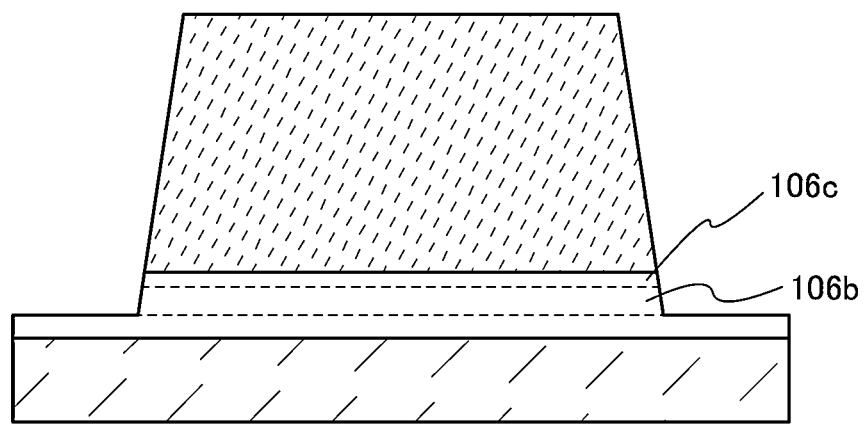

Then, part of the oxide layer 136c and part of the oxide semiconductor layer 136b over which the resist mask 140 is not provided are etched by a dry etching method, whereby the oxide layer 136a is exposed (see FIG. 3C).

Figure 4A:
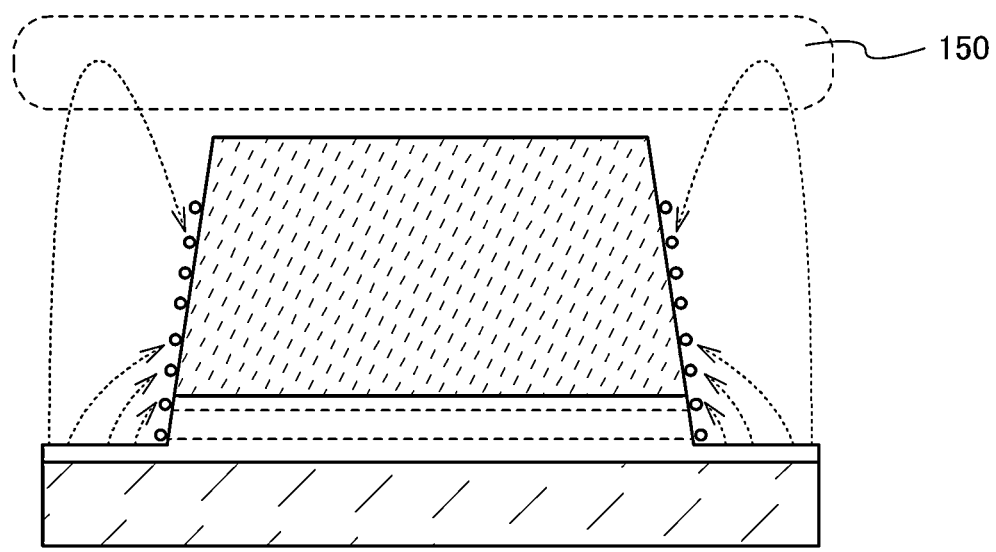
FIGS. 4A to 4C are cross-sectional views illustrating a formation mechanism of a multilayer film of one embodiment of the present invention.
Figure 4B:
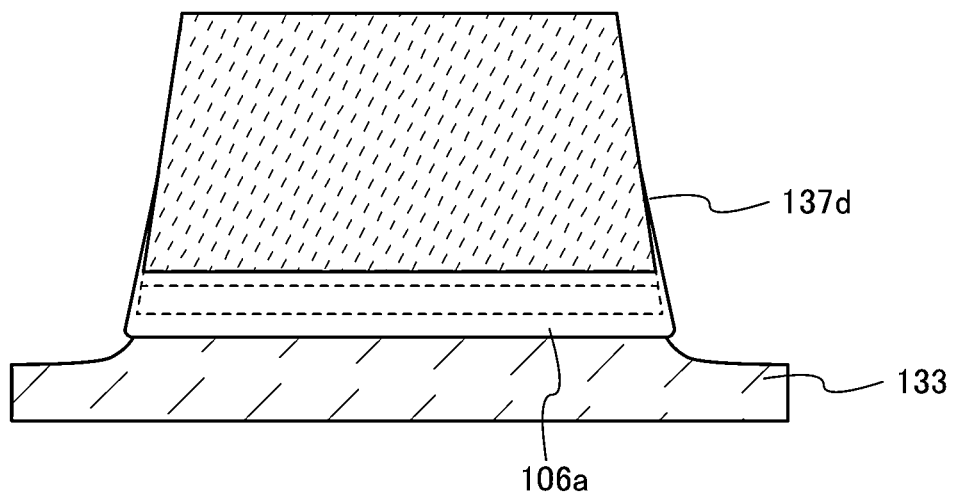
Figure 4C:
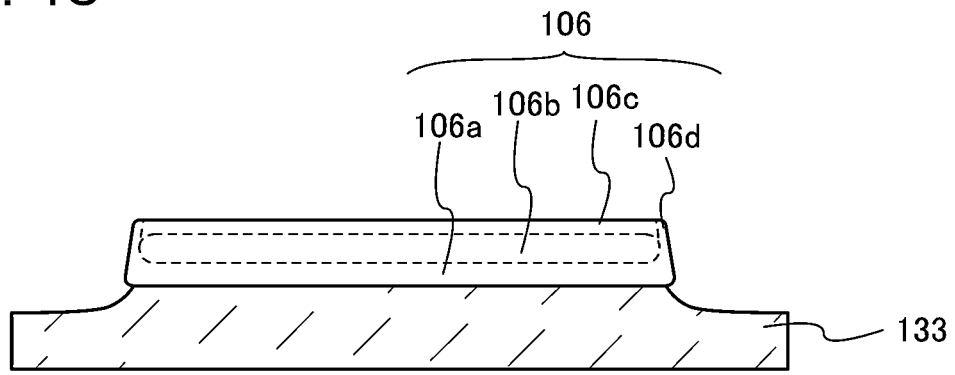

Next, the exposed oxide layer 136a is etched by a dry etching method (see FIG. 4A). At this time, a reaction product of the oxide layer 136a is attached to at least the side surface of the oxide semiconductor layer 106b of the multilayer film to form an oxide layer serving as a sidewall protective film (also referred to as a rabbit ear). The attachment of the reaction product of the oxide layer 136a occurs due to a sputtering phenomenon or plasma 150 at the dry etching. The dry etching is performed under conditions where a boron trichloride gas and a chlorine gas are used as an etching gas and inductively coupled plasma (ICP) power and substrate bias power are applied.

The etching of the oxide layer 136a proceeds, so that the oxide layer 106a and an oxide layer 137d are formed. At the same time, the base insulating film 132 is partly etched to be a base insulating film 133 (see FIG. 4B).

Note that since the oxide layer 137d is formed of the reaction product of the oxide layer 136a, components (chlorine, boron, and the like) derived from the etching gas used for the etching remain therein. When the components react with moisture or the like contained in the air, the oxide layer 137d is further etched.

Next, the components which are derived from the etching gas and remain in the etched oxide layer 137d are removed by ashing treatment, whereby an oxide layer to be the oxide layer 106d is formed.

Then, the resist mask 140 is removed.

Next, heat treatment is performed in an atmosphere containing an oxidation gas to reduce oxygen vacancies in the oxide layer 106a, the oxide semiconductor layer 106b, the oxide layer 106c, and the oxide layer to be the oxide layer 106d. Oxygen vacancies are likely to occur particularly in the oxide layer to be the oxide layer 106d because the oxide layer to be the oxide layer 106d is formed of the reaction product generated in the etching. Accordingly, the oxide layer to be the oxide layer 106d becomes the oxide layer 106d having an extremely small carrier density owing to the ashing treatment and the heat treatment (see FIG. 4C). Note that the oxidation gas refers to any of gases of oxygen, nitrous oxide, ozone, and the like. The heat treatment is performed at a temperature higher than or equal to 250° C. and lower than or equal to 650° C., preferably higher than or equal to 300° C. and lower than or equal to 500° C. The heat treatment is performed in an atmosphere containing an oxidization gas at 10 ppm or more, 1% or more, or 10% or more. Alternatively, the heat treatment may be performed in such a manner that heat treatment is performed in an inert gas atmosphere, and then another heat treatment is performed in an atmosphere containing an oxidization gas at 10 ppm or more, preferably 1% or more, further preferably 10% or more in order to compensate released oxygen.

In this manner, the multilayer film 106 including the oxide layer 106d having a curved surface can be formed. Thus, the above description shows that a special photomask for forming the oxide layer 106d is not necessary to form the multilayer film 106 including the oxide layer 106d having a curved surface.

Figure 5A:
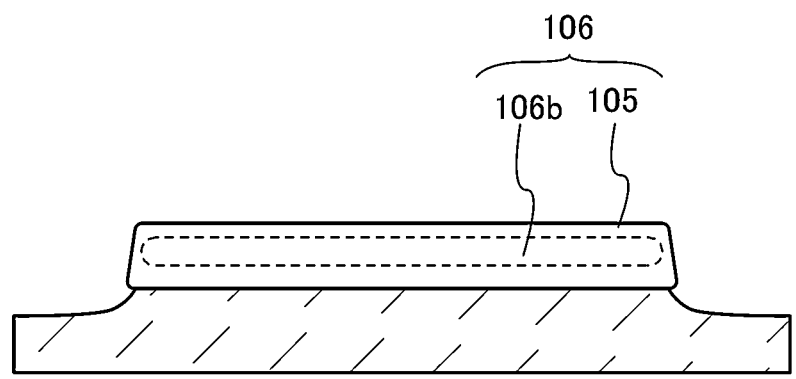
FIGS. 5A and 5B are cross-sectional views illustrating a formation mechanism of a multilayer film of one embodiment of the present invention.

The oxide layer 106a, the oxide layer 106c, and the oxide layer 106d formed in the above manner cannot be strictly distinguished from each other in some cases. Therefore, the oxide layer 106a, the oxide layer 106c, and the oxide layer 106d may be collectively referred to as an oxide layer 105. As illustrated in FIG. 5A, the multilayer film 106 may include the oxide layer 105 in which the oxide semiconductor layer 106b is wrapped.

Figure 5B:
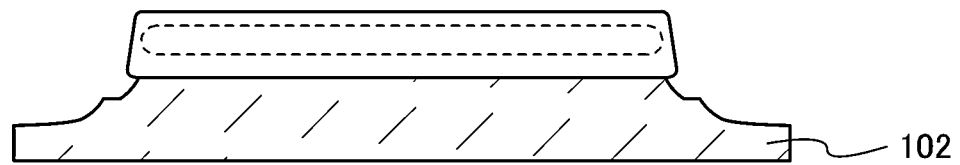

After that, the base insulating film 133 may be etched, whereby a base insulating film 102 which has a plurality of steps (two steps here) may be formed (see FIG. 5B). "The base insulating film 102 has two steps" can also be referred to as "the base insulating film 102 has three regions having different thicknesses".

<1-1-2. Formation Mechanism (2)>

An example of the formation mechanism of the multilayer film 106 including the oxide layer 106d having a curved surface is described with reference to FIGS. 6A to 6C and FIGS. 7A to 7C.

Figure 6A:
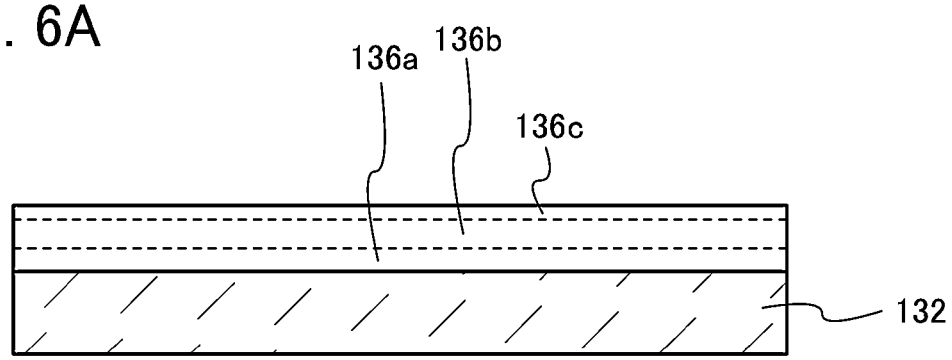
FIGS. 6A to 6C are cross-sectional views illustrating a formation mechanism of a multilayer film of one embodiment of the present invention.

First, a multilayer film which includes the oxide layer 136a provided over the base insulating film 132, the oxide semiconductor layer 136b provided over the oxide layer 136a, and the oxide layer 136c provided over the oxide semiconductor layer 136b is prepared (see FIG. 6A).

Figure 6B:
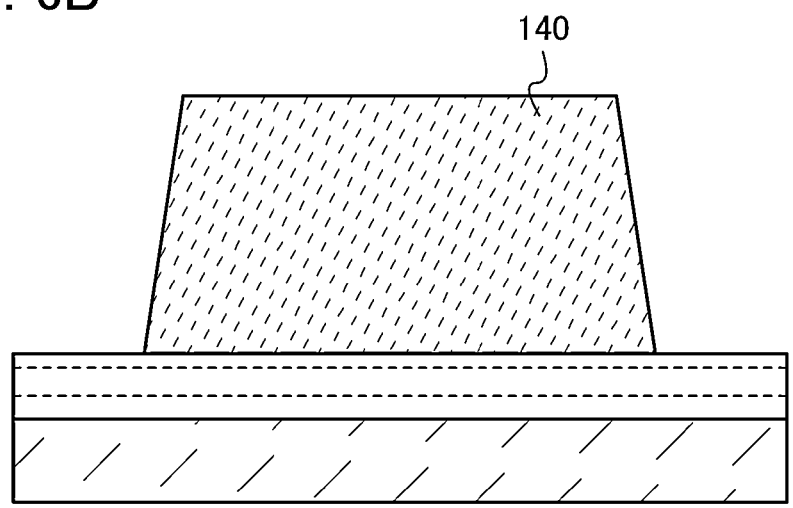
Figure 6C:
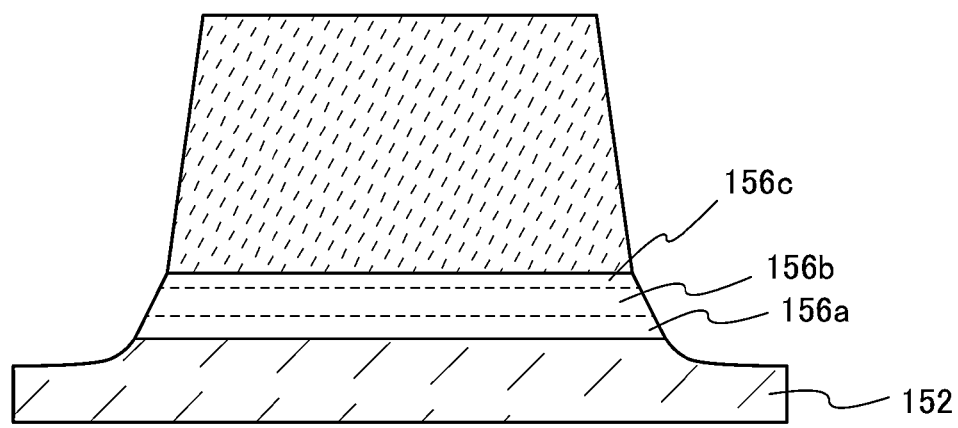

Next, the resist mask 140 is formed over part of the oxide layer 136c (see FIG. 6B).

Then, part of the oxide layer 136c, part of the oxide semiconductor layer 136b, and part of the oxide layer 136a over which the resist mask 140 is not provided are etched by a dry etching method, so that part of the oxide layer 136c, part of the oxide semiconductor layer 136b, and part the oxide layer 136a which are not etched are an oxide layer 156c, an oxide semiconductor layer 156b, and an oxide layer 156a, respectively. At the same time, the base insulating film 132 is partly etched to be a base insulating film 152 (see FIG. 6C). Note that the oxide layer 156c, the oxide semiconductor layer 156b, and the oxide layer 156a have taper angles.

Next, the oxide layer 156c, the oxide semiconductor layer 156b, and the oxide layer 156a are etched by a dry etching method to be the oxide layer 106c, the oxide semiconductor layer 106b, and the oxide layer 106a, respectively. At this time, a reaction product of the oxide layer 156a is attached to at least the side surface of the multilayer film to form an oxide layer serving as a sidewall protective film (also referred to as a rabbit ear) which is to be the oxide layer 106d. The attachment of the reaction product of the oxide layer 156a occurs due to a sputtering phenomenon or plasma at the dry etching. At the same time, the base insulating film 152 is partly etched to be the base insulating film 102 (see FIG. 7A)

Note that since the oxide layer to be the oxide layer 106d is formed of the reaction product of the oxide layer 156a, components (chlorine, boron, and the like) derived from the etching gas used for the etching remain therein.

Next, the components which are derived from the etching gas and remain in the oxide layer to be the oxide layer 106d are removed by ashing treatment.

Then, the resist mask 140 is removed.

Next, heat treatment is performed in an atmosphere containing an oxidation gas to reduce oxygen vacancies in the oxide layer 106a, the oxide semiconductor layer 106b, the oxide layer 106c, and the oxide layer to be the oxide layer 106d. Oxygen vacancies are likely to occur particularly in the oxide layer to be the oxide layer 106d because the oxide layer to be the oxide layer 106d is formed of the reaction product generated in the etching. Accordingly, the oxide layer to be the oxide layer 106d becomes the oxide layer 106d having an extremely small carrier density owing to the ashing treatment and the heat treatment (see FIG. 7B).

In this manner, the multilayer film 106 including the oxide layer 106d having a curved surface can be formed. Thus, the above description shows that a special photomask for forming the oxide layer 106d is not necessary to form the multilayer film 106 including the oxide layer 106d having a curved surface.

Figure 7A:
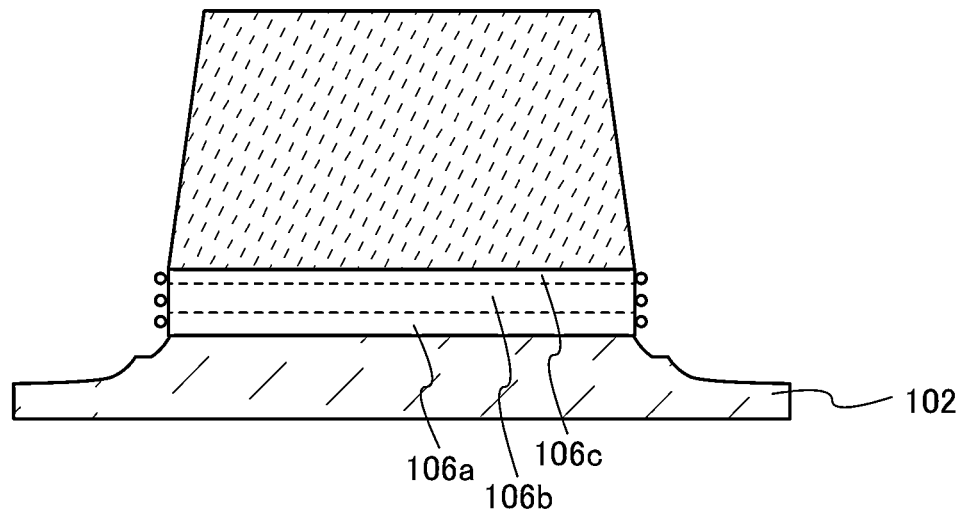
FIGS. 7A to 7C are cross-sectional views illustrating a formation mechanism of a multilayer film of one embodiment of the present invention.
Figure 7B:
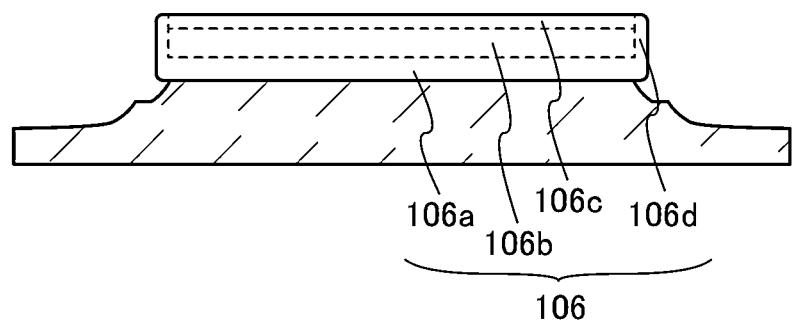
Figure 7C:
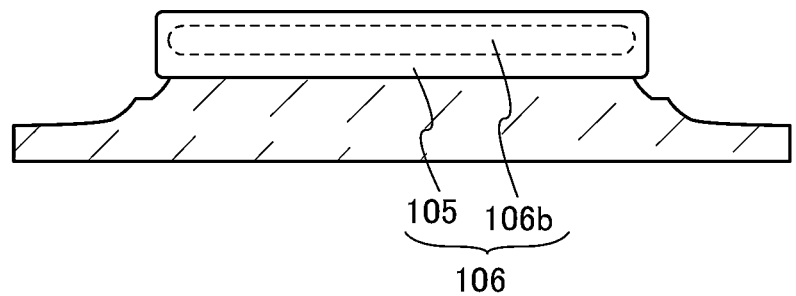

As described above, the oxide layer 106d is formed of the reaction product of the oxide layer 136a which is to be the oxide layer 106a. Therefore, the oxide layer 106a and the oxide layer 106d cannot be distinguished from each other by analysis or the like in some cases. In other words, the oxide layer 106d may have physical properties similar to those of the oxide layer 106a. Accordingly, the description of the oxide layer 106a can be referred to for the physical properties of the oxide layer 106d unless otherwise specified. Further, the oxide layer 106c also cannot be distinguished from the oxide layer 106d in some cases when the oxide layer 106c has a structure similar to that of the oxide layer 106a. Therefore, the oxide layer 106a, the oxide layer 106c, and the oxide layer 106d may be collectively referred to as the oxide layer 105. As illustrated in FIG. 7C, the multilayer film 106 may also include the oxide semiconductor layer 106b and the oxide layer 105 in which the oxide semiconductor layer 106b is wrapped.

The multilayer film 106 has the structure in which the oxide semiconductor layer 106b is wrapped in (covered with) the oxide layer 106a, the oxide layer 106c, and the oxide layer 106d. Accordingly, impurities entering the oxide semiconductor layer 106b can be reduced. Further, the oxide semiconductor layer 106b does not have a level with another oxide layer and thus can have high carrier mobility (electron mobility).

<1-3. Physical Properties of Multilayer Film>

In this section, the physical properties of the multilayer film are described.

<1-3-1. Composition of Multilayer Film>

Compositions of the multilayer film 106, and the oxide layer 106a, the oxide semiconductor layer 106b, the oxide layer 106c, and the oxide layer 106d in the multilayer film 106 are described below.

The oxide layer 106a is an oxide layer which includes one or more kinds of elements other than oxygen included in the oxide semiconductor layer 106b. Note that the oxide semiconductor layer 106b preferably contains at least indium in order that the carrier mobility (electron mobility) is high. Further, since the oxide layer 106a includes one or more kinds of elements other than oxygen included in the oxide semiconductor layer 106b, interface scattering is unlikely to occur at the interface between the oxide semiconductor layer 106b and the oxide layer 106a. Thus, the transistor can have high field-effect mobility because the movement of carriers is not hindered at the interface.

The oxide layer 106a may contain, for example, aluminum, titanium, silicon, gallium, germanium, yttrium, zirconium, tin, lanthanum, cerium, or hafnium at a higher atomic proportion than the oxide semiconductor layer 106b. Specifically, as the oxide layer 106a, an oxide layer containing the above element at proportion 1.5 times or more, preferably twice or more, more preferably 3 times or more that in the oxide semiconductor layer 106b is used. The above element is strongly bonded to oxygen and thus has a function of preventing generation of an oxygen vacancy in the oxide layer. That is, an oxygen vacancy is less likely to be generated in the oxide layer 106a than in the oxide semiconductor layer 106b.

Alternatively, when each of the oxide layer 106a and the oxide semiconductor layer 106b is an In-M-Zn oxide and the oxide layer 106a and the oxide semiconductor layer 106b contain In, m, and Zn at an atomic ratio of $x_1:y_1:z_1$ and an atomic ratio of $x_2:y_2:z_2$ respectively, $y_1/x_1$ needs to be larger than $y_2/x_2$. Note that the element M is a metal element whose bonding strength to oxygen is larger than that of In, and Al, Ti, Ga, Y, Zr, Sn, La, Ce, Nd, and Hf can be given as examples. Preferably, the oxide layer 106a and the oxide semiconductor layer 106b in which $y_1/x_1$ is 1.5 times or more as large as $y_2/x_2$ are selected. More preferably, the oxide layer 106a and the oxide semiconductor layer 106b in which $y_1/x_1$ is twice or more as large as $y_2/x_2$ are selected. Still more preferably, the oxide layer 106a and the oxide semiconductor layer 106b in which $y_1/x_1$ is three times or more as large as $y_2/x_2$ are selected. Here, in the oxide semiconductor layer 106b, $y_1$ is preferably larger than or equal to $x_1$ because the transistor can have stable electrical characteristics. However, when $y_1$ is three times or more as large as $x_1$, the field-effect mobility of the transistor is reduced; accordingly, $y_1$ is preferably smaller than three times $x_1$.

The oxide layer 106c includes one or more kinds of elements other than oxygen included in the oxide semiconductor layer 106b. Further, since the oxide layer 106c includes one or more kinds of elements other than oxygen included in the oxide semiconductor layer 106b, an interface state is unlikely to be formed at the interface between the oxide semiconductor layer 106b and the oxide layer 106c. When the interface has an interface state, in some cases, a second transistor in which the interface serves as a channel and which has a different threshold voltage is formed; accordingly, the apparent threshold voltage of the transistor is changed. Thus, with the oxide layer 106c, variation in electrical characteristics of the transistors, such as a threshold voltage, can be reduced.

For example, the oxide layer 106c may contain, for example, aluminum, silicon, titanium, gallium, germanium, yttrium, zirconium, tin, lanthanum, cerium, or hafnium at a higher atomic proportion than the oxide semiconductor layer 106b. Specifically, as the oxide layer 106c, an oxide layer containing the above element at proportion 1.5 times or more, preferably twice or more, more preferably 3 times or more that in the oxide semiconductor layer 106b is used. The above element is strongly bonded to oxygen and thus has a function of preventing generation of an oxygen vacancy in the oxide layer. That is, an oxygen vacancy is less likely to be generated in the oxide layer 106c than in the oxide semiconductor layer 106b.

Further alternatively, when each of the oxide semiconductor layer 106b and the oxide layer 106c is an In-M-Zn oxide and the oxide semiconductor layer 106b and the oxide layer 106c contain In, M, and Zn at an atomic ratio of $x_2:y_2:z_2$ and an atomic ratio of $x_3:y_3:z_3$ respectively, $y_3/x_3$ needs to be larger than $y_2/x_2$. Note that the element M is a metal element whose bonding strength to oxygen is larger than that of In, and Al, Ti, Ga, Y, Zr, Sn, La, Ce, Nd, and Hf can be given as examples. Preferably, the oxide semiconductor layer 106b and the oxide layer 106c in which $y_3/x_3$ is 1.5 times or more as large as $y_2/x_2$ are selected. Further preferably, the oxide semiconductor layer 106b and the oxide layer 106c in which $y_3/x_3$ is twice or more as large as $y_2/x_2$ are selected. Still further preferably, the oxide semiconductor layer 106b and the oxide layer 106c in which $y_3/x_3$ is three times or more as large as $y_2/x_2$ are selected. Here, in the oxide semiconductor layer 106b, $y_2$ is preferably larger than or equal to $x_2$ because the transistor can have stable electrical characteristics. However, when $y_2$ is three times or more as large as $x_2$, the field-effect mobility of the transistor is reduced; accordingly, $y_2$ is preferably smaller than three times $x_2$.

The description of the oxide layer 106a is referred to for the oxide layer 106d. The oxide layer 106d is a layer forming the side surface of the multilayer film 106. Therefore, in the case where oxygen vacancies occur in the oxide layer 106d, a second transistor whose channel is formed at an interface between the oxide layer 106d and the oxide semiconductor layer 106b and which has a different threshold voltage is formed in the interface, whereby apparent threshold voltage of the transistor might be changed. Thus, providing the oxide layer 106d in which oxygen vacancies does not easily occur makes it possible to reduce variation in the electrical characteristics of the transistor, such as threshold voltage. As the transistor has a smaller channel length, electrical characteristic variation of the second transistor is increased. Accordingly, as the size of the transistor is reduced, an effect due to the oxide layer 106d in which oxygen vacancies does not easily occur is increased.

Note that diffusion of indium contained in the oxide layer 106c toward the outside might causes deterioration in electrical characteristics of the transistor. Therefore, it is preferable that the oxide layer 106c have a smaller atomic percentage of indium than the oxide semiconductor layer 106b.

Note that the oxide layer 106a and the oxide layer 106d are each preferably an oxide layer in which oxygen vacancies are less likely to occur than in the oxide layer 106c. Further, the oxide layer 106a and the oxide layer 106d preferably have higher insulating properties than the oxide layer 106c. In order that oxygen vacancies are less likely to occur in the oxide layer 106a and the oxide layer 106d than in the oxide layer 106c, and the that oxide layer 106a and the oxide layer 106d have higher insulating properties than the oxide layer 106c, it is preferable that the oxide layer 106a and the oxide layer 106d each have a higher concentration of an element which prevents generation of oxygen vacancies in the oxide layer or a higher concentration of a metal element having high bonding strength to oxygen than the oxide layer 106c.

Note that when the oxide layer 106a is an In-M-Zn oxide, the atomic ratio between In and M is preferably as follows: the atomic percentage of In is less than 50 atomic % and the atomic percentage of M is greater than or equal to 50 atomic %, further preferably the atomic percentage of In is less than 25 atomic % and the atomic percentage of M is greater than or equal to 75 atomic %. When the oxide semiconductor layer 106b is an In-M-Zn oxide, the atomic ratio between In and M is preferably as follows: the atomic percentage of In is greater than or equal to 25 atomic % and the atomic percentage of M is less than 75 atomic %, further preferably the atomic percentage of In is greater than or equal to 34 atomic % and the atomic percentage of M is less than 66 atomic %. When the oxide layer 106c is an In-M-Zn oxide, the atomic ratio between In and M is preferably as follows: the atomic percentage of In be less than 50 atomic % and the atomic percentage of M is greater than or equal to 50 atomic %, further preferably the atomic percentage of In is less than 25 atomic % and the atomic percentage of M is greater than or equal to 75 atomic %. When the oxide layer 106d is an In-M-Zn oxide, the atomic ratio between In and M is preferably as follows: the atomic percentage of In be less than 50 atomic % and the atomic percentage of M is greater than or equal to 50 atomic %, further preferably the atomic percentage of In is less than 25 atomic % and the atomic percentage of M is greater than or equal to 75 atomic %.

Note that the oxide layer 106a has a thickness of greater than or equal to 3 nm and less than or equal to 100 nm, preferably greater than or equal to 3 nm and less than or equal to 50 nm. The oxide semiconductor layer 106b has a thickness of greater than or equal to 3 nm and less than or equal to 200 nm, preferably greater than or equal to 3 nm and less than or equal to 100 nm, more preferably greater than or equal to 3 nm and less than or equal to 50 nm. The oxide layer 106c has a thickness of greater than or equal to 3 nm and less than or equal to 50 nm, preferably greater than or equal to 3 nm and less than or equal to 20 nm. Note that it is preferable that the oxide layer 106a and the oxide layer 106d each have a larger thickness than the oxide layer 106c. In other words, the oxide layer 106c preferably has a smaller thickness than the oxide layer 106a and the oxide layer 106d.

Next, an oxide layer applicable to each of the oxide layers 106a, the oxide layer 106c, and the oxide layer 106d used in the multilayer film 106 was formed by a sputtering method, and the number of particles with a size of 1 μm or more was measured.

The measurement was performed on the following samples: a sample formed using a gallium oxide target; a sample formed using a Ga—Zn oxide (having an atomic ratio of Ga:Zn=2:5) target; a sample formed using an In—Ga—Zn oxide (having an atomic ratio of In:Ga:Zn=3:1:2) target; a sample formed using an In—Ga—Zn oxide (having an atomic ratio of In:Ga:Zn=1:1:1) target; and a sample formed using an In—Ga—Zn oxide (having an atomic ratio of In:Ga:Zn=1:3:2) target.

Figure 8:
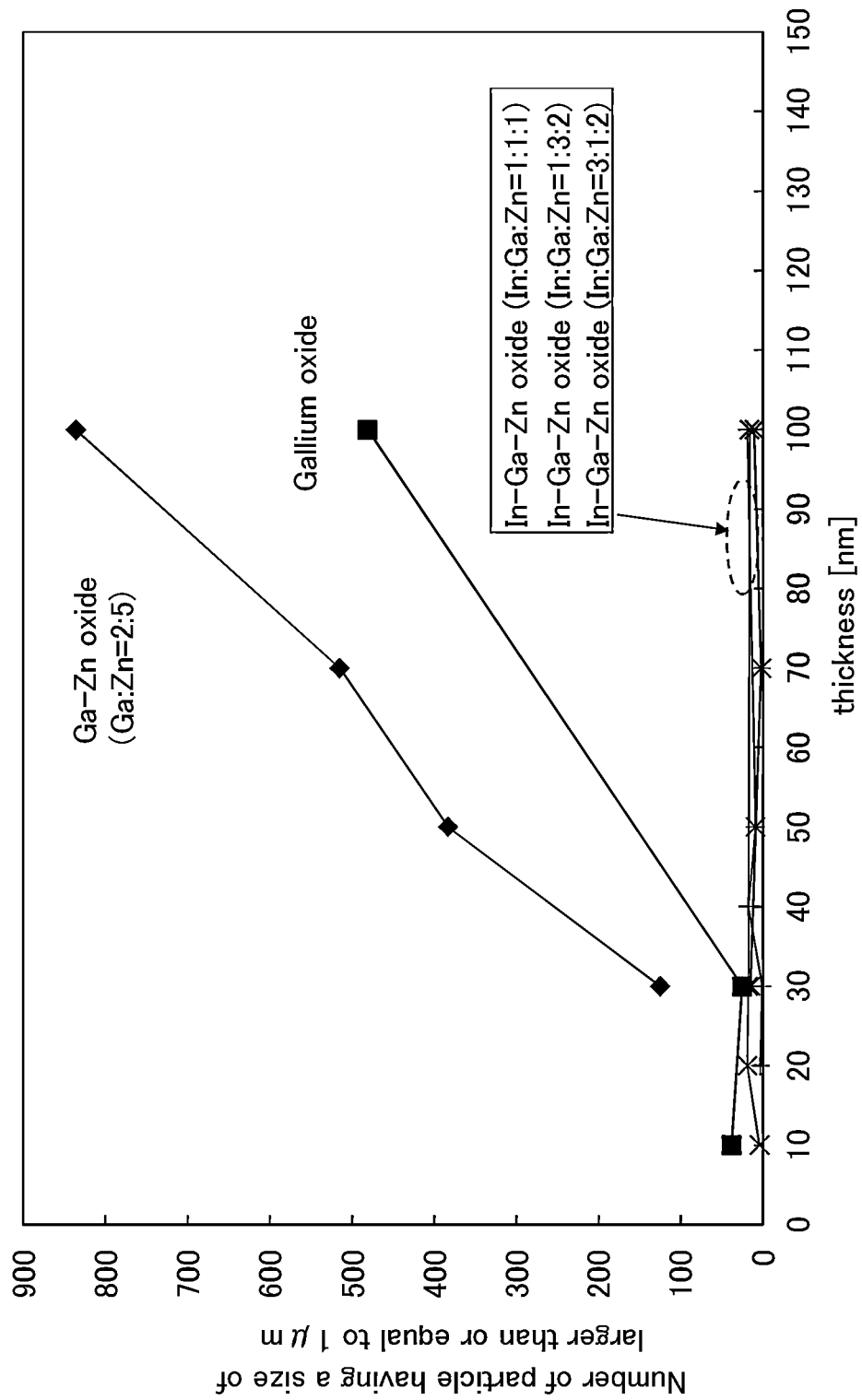
FIG. 8 shows the number of particles in an oxide layer and an oxide semiconductor layer of one embodiment of the present invention.

FIG. 8 shows that in the sample formed using the gallium oxide target and the sample formed using the Ga—Zn oxide target, the number of particles with a size of 1 μm or more is rapidly increased as the thickness of the oxide layer is increased. On the other hand, in the samples formed using the In—Ga—Zn oxide target, the number of particles with a size of 1 μm or more is unlikely to be increased even when the thickness of the oxide layer is increased.

Thus, in the case where the oxide layer is formed by a sputtering method, a target containing indium is preferably used in order not to increase the number of particles. Moreover, it is preferable to use an oxide target in which the proportion of gallium is relatively small. Particularly in the case where a target containing indium is used, the conductivity of the target can be increased and DC discharge and AC discharge are facilitated; therefore, film formation over a large-sized substrate can be easily performed. Thus, semiconductor devices can be manufactured with improved productivity.

<1-3-2. Impurity in Multilayer Film>

In the description below, the silicon concentration of each of the layers included in the multilayer film 106 is described with reference to FIG. 9.

Here, the oxide layer 106a is an oxide layer formed by a sputtering method using an In—Ga—Zn oxide (having an atomic ratio of In:Ga:Zn=1:3:2) target. Note that an argon gas (flow rate: 30 sccm) and an oxygen gas (flow rate: 15 sccm) were used as a deposition gas, the pressure was set to 0.4 Pa, the substrate temperature was set to 200° C., and a DC power of 0.5 kW was applied.

The oxide semiconductor layer 106b is an oxide semiconductor layer formed by a sputtering method using an In—Ga—Zn oxide (having an atomic ratio of In:Ga:Zn=1:1:1) target. Note that an argon gas (flow rate: 30 sccm) and an oxygen gas (flow rate: 15 sccm) were used as a deposition gas, the pressure was set to 0.4 Pa, the substrate temperature was set to 300° C., and a DC power of 0.5 kW was applied.

The oxide layer 106c is an oxide layer formed by a sputtering method using an In—Ga—Zn oxide (having an atomic ratio of In:Ga:Zn=1:3:2) target. Note that an argon gas (flow rate: 30 sccm) and an oxygen gas (flow rate: 15 sccm) were used as a deposition gas, the pressure was set to 0.4 Pa, the substrate temperature was set to 200° C., and a DC power of 0.5 kW was applied.

The multilayer film 106 is provided over a silicon wafer, and a sample not subjected to heat treatment and a sample subjected to heat treatment at 450° C. for two hours are prepared. The secondary ion intensities of In, Ga, and Zn in a depth direction, and the silicon concentration (atoms/cm$^3$) in a depth direction which is converted from the secondary ion intensity of SiO$_3$, of the samples measured by ToF-SIMS (time-of-flight secondary ion mass spectrometry) are shown. The multi-layer film 106 includes the oxide layer 106a having a thickness of 10 nm, the oxide semiconductor layer 106b having a thickness of 10 nm over the oxide layer 106a, and the oxide layer 106c having a thickness of 10 nm over the oxide semiconductor layer 106b.

Figure 9:
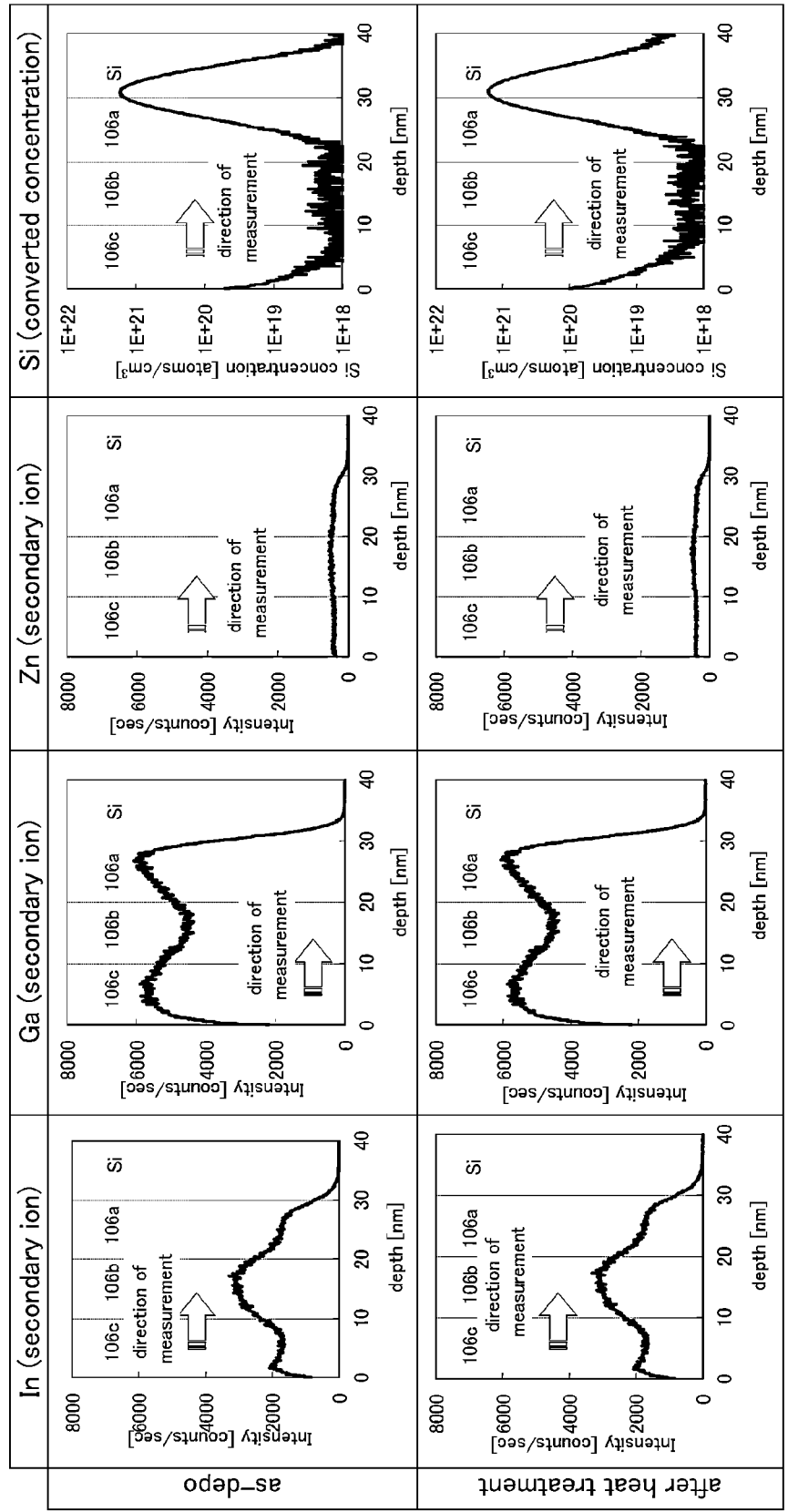
FIG. 9 shows ToF-SIMS results of a multilayer film according to one embodiment of the present invention.

FIG. 9 shows that the compositions of the layers included in the multilayer film 106 are changed depending on the compositions of the respective targets used at the time of the deposition. Note that the compositions of the layers cannot be simply compared using FIG. 9.

FIG. 9 indicates that the interface between the silicon wafer and the oxide layer 106a of the multilayer film 106 and the top surface of the oxide layer 106c have high SiO$_3$ concentrations. Moreover, FIG. 9 shows that the concentration of SiO$_3$ in the oxide semiconductor layer 106b is about 1×10$^{18}$ atoms/cm$^3$, which is the lower limit of detection in ToF-SIMS. This is probably because, owing to the existence of the oxide layers 106a and 106c, the oxide semiconductor layer 106b is not influenced by silicon due to the silicon wafer or the surface contamination.

Further, comparison of the sample subjected to the heat treatment with an as-deposited sample (the sample not subjected to heat treatment, referred to as "as-depo" in FIG. 9) indicates that silicon is not likely to be diffused through the heat treatment though entry of silicon mainly occurs at the time of deposition.

It is effective to highly purify the oxide semiconductor layer 106b to be a highly purified intrinsic oxide semiconductor layer so that a transistor including the multilayer film 106 has stable electrical characteristics. Specifically, the carrier density of the oxide semiconductor layer 106b is set to be lower than 1×10$^{17}$/cm$^3$, lower than 1×10$^{15}$/cm$^3$, or lower than 1×10$^{13}$/cm$^3$. In the oxide semiconductor layer 106b, hydrogen, nitrogen, carbon, silicon, and a metal element other than a main component become impurities. In order to reduce the concentration of impurities in the oxide semiconductor layer 106b, it is preferable to also reduce the concentration of impurities in the oxide layers 106a and 106c which are close to the oxide semiconductor layer 106b to a value almost equal to that in the oxide semiconductor layer 106b.

Particularly when silicon is contained in the oxide semiconductor layer 106b at a high concentration, an impurity state due to silicon is formed in the oxide semiconductor layer 106b. In some cases, the impurity state becomes a trap, which degrades electrical characteristics of the transistor. In order to make the deterioration of the electrical characteristics of the transistor small, the concentration of silicon in the oxide semiconductor layer 106b is set to be lower than 1×10$^{19}$ atoms/cm$^3$, preferably lower than 5×10$^{18}$ atoms/cm$^3$, further preferably lower than 1×10$^{18}$ atoms/cm$^3$. Moreover, the concentrations of silicon at the interface between the oxide layer 106a and the oxide semiconductor layer 106b and the interface between the oxide semiconductor layer 106b and the oxide layer 106c are each set to be lower than 1×10$^{19}$ atoms/cm$^3$, preferably lower than 5×10$^{18}$ atoms/cm$^3$, more preferably lower than 1×10$^{18}$ atoms/cm$^3$.

Further, hydrogen and nitrogen in the oxide semiconductor layer 106b form donor levels, which increase carrier density. In order to make the oxide semiconductor layer 106b intrinsic or substantially intrinsic, the concentration of hydrogen in the oxide semiconductor layer 106b, which is measured by SIMS, is set to be lower than or equal to 2×10$^{20}$ atoms/cm$^3$, preferably lower than or equal to 5×10$^{19}$ atoms/cm$^3$, more preferably lower than or equal to 1×10$^{19}$ atoms/cm$^3$, still more preferably lower than or equal to 5×10$^{18}$ atoms/cm$^3$. The concentration of nitrogen in the oxide semiconductor layer 106b, which is measured by SIMS, is set to be lower than 5×10$^{19}$ atoms/cm$^3$, preferably lower than or equal to 5×10$^{18}$ atoms/cm$^3$, further preferably lower than or equal to 1×10$^{18}$ atoms/cm$^3$, still further preferably lower than or equal to 5×10$^{17}$ atoms/cm$^3$.

Note that when silicon and carbon are contained in the oxide semiconductor layer 106b at a high concentration, the crystallinity of the oxide semiconductor layer 106b is lowered in some cases. In order not to lower the crystallinity of the oxide semiconductor layer 106b, the concentration of silicon in the oxide semiconductor layer 106b is set to be lower than 1×10$^{19}$ atoms/cm$^3$, preferably lower than 5×10$^{18}$ atoms/cm$^3$, further preferably lower than 1×10$^{18}$ atoms/cm$^3$. Moreover, in order not to lower the crystallinity of the oxide semiconductor layer 106b, the concentration of carbon in the oxide semiconductor layer 106b is set to be lower than 1×10$^{19}$ atoms/cm$^3$, preferably lower than 5×10$^{18}$ atoms/cm$^3$, further preferably lower than 1×10$^{18}$ atoms/cm$^3$. Description of the crystallinity of the multi-layer film 106 is made later.

<1-3-3. Band Structure of Multilayer Film>

The oxide layer 106a, the oxide semiconductor layer 106b, the oxide layer 106c, and the oxide layer 106d which form the multilayer film 106 are described below using the band structure of the multilayer film 106.

The oxide layer 106a, the oxide semiconductor layer 106b, the oxide layer 106c, and the oxide layer 106d are selected so that a relation shown in Formula (1) is satisfied, where the energies of the bottoms of the conduction band in the oxide layer 106a, the oxide semiconductor layer 106b, the oxide layer 106c, and the oxide layer 106d are EcS1, EcS2, EcS3, and EcS4, respectively.

$$EcS1 \approx EcS4 \geq EcS3 > EcS2 \quad \text{[Formula 1]}$$

Here, an energy difference between the vacuum level and the bottom of the conduction band (the difference is also referred to as electron affinity) corresponds to a value obtained by subtracting an energy gap from an energy difference between the vacuum level and the top of the valence band (the difference is also referred to as an ionization potential). Note that the energy gap can be measured using a spectroscopic ellipsometer (UT-300 manufactured by HORIBA JOBIN YVON S.A.S.). The energy difference between the vacuum level and the top of the valence band can be measured using an ultraviolet photoelectron spectroscopy (UPS) device (VersaProbe manufactured by ULVAC-PHI, Inc.).

Specifically, the oxide layer 106a satisfies the above formula (1), and the energy of the bottom of the conduction band in the oxide layer 106a is located closer to the vacuum level than that in the oxide semiconductor layer 106b by 0.05 eV or more, 0.07 eV or more, 0.1 eV or more, or 0.15 eV or more and 2 eV or less, 1 eV or less, 0.5 eV or less, or 0.4 eV or less.

The oxide layer 106c satisfies the above formula (1) and the energy of the bottom of the conduction band in the oxide layer 106c is located closer to the vacuum level than that in the oxide semiconductor layer 106b by 0.05 eV or more, 0.07 eV or more, 0.1 eV or more, or 0.15 eV or more and 2 eV or less, 1 eV or less, 0.5 eV or less, or 0.4 eV or less.

The oxide layer 106d satisfies the above formula (1) and the energy of the bottom of the conduction band in the oxide layer 106d is located closer to the vacuum level than that in the oxide semiconductor layer 106b by 0.05 eV or more, 0.07 eV or more, 0.1 eV or more, or 0.15 eV or more and 2 eV or less, 1 eV or less, 0.5 eV or less, or 0.4 eV or less. Note that as the energy difference between the bottom of the conduction band in the oxide layer 106d and that in the oxide semiconductor layer 106b becomes larger (as a barrier becomes higher), the second transistor is less likely to be formed in the interface between the oxide layer 106d and the oxide semiconductor layer 106b.

Figure 10A:
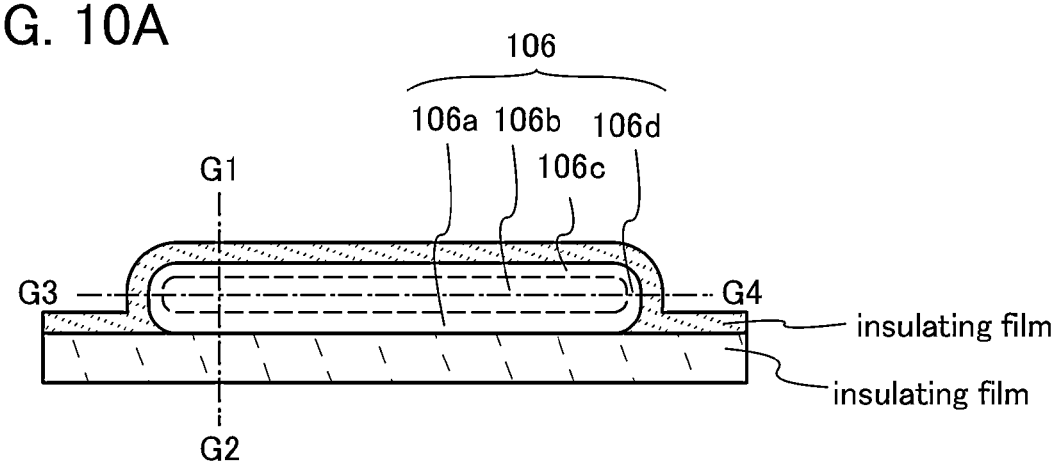
FIGS. 10A to 10C illustrate a band structure of a multilayer film of one embodiment of the present invention.
Figure 10B:
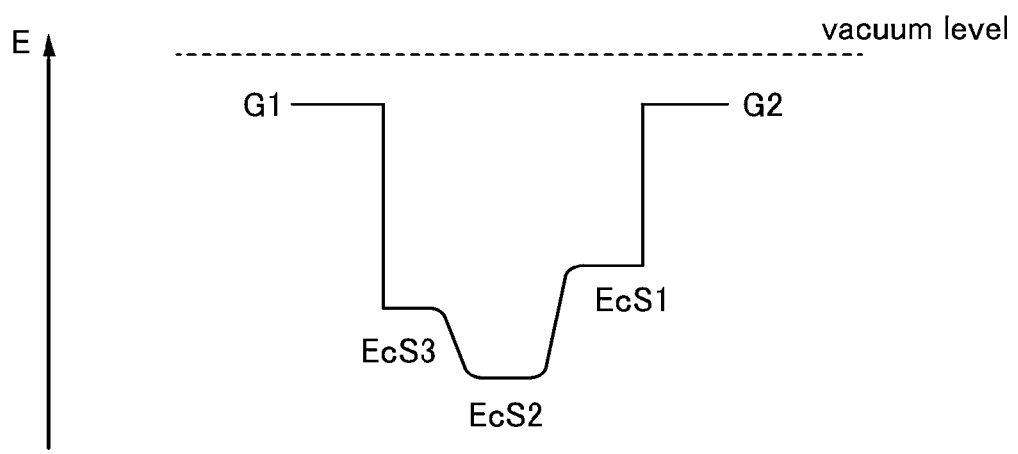
Figure 10C:
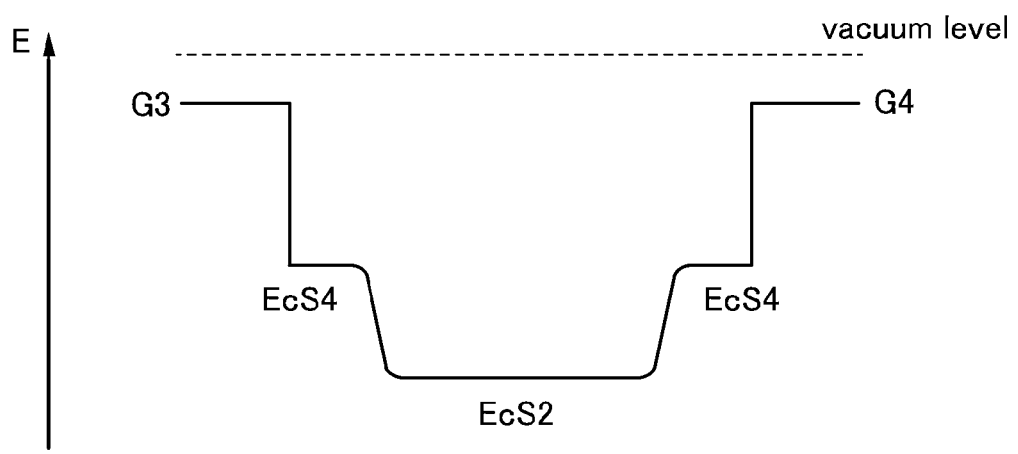

FIG. 10A is a cross-sectional view of the multilayer film 106. FIG. 10B illustrates a band structure of a cross section of the multilayer film 106 along a dashed dotted line G1-G2 in FIG. 10A. FIG. 10C illustrates a band structure of a cross section of the multilayer film 106 along a dashed dotted line G3-G4 in FIG. 10A. FIGS. 10B and 10C illustrate a case where insulating films whose energy of the bottom of the conduction band is high (e.g., silicon oxide films) are provided in contact with the oxide layer 106a, the oxide layer 106c, and the oxide layer 106d.

By selecting the oxide layer 106a, the oxide semiconductor layer 106b, the oxide layer 106c, and the oxide layer 106d so as to satisfy the relation shown in Formula (1), in the band structure of the multilayer film 106, the oxide layer 106a, the oxide layer 106c, and the oxide layer 106d, whose energy of the bottom of the conduction band is higher than that in the semiconductor layer 106b, surround the oxide semiconductor layer 106b, whose energy of the bottom of the conduction band is the lowest (see FIGS. 10B and 10C).

Further, the energy of the bottom of the conduction band continuously changes between the oxide layer 106a and the oxide semiconductor layer 106b, between the oxide semiconductor layer 106b and the oxide layer 106c, and between the oxide semiconductor layer 106b and the oxide layer 106d. In other words, no state or few states exist at these interfaces.

Accordingly, electrons transfer mainly through the oxide semiconductor layer 106b in the multilayer film 106 having the above band structure. Therefore, even when a state exists at an interface between the multilayer film 106 and the insulating film that is the outside of the multilayer film 106, the state hardly influences the transfer of the electrons. In addition, since no state or few states exist between the layers included in the multilayer film 106, the transfer of electrons is not interrupted in the region. Accordingly, the oxide semiconductor layer 106b of the multilayer film 106 has high electron mobility.

Figure 11:
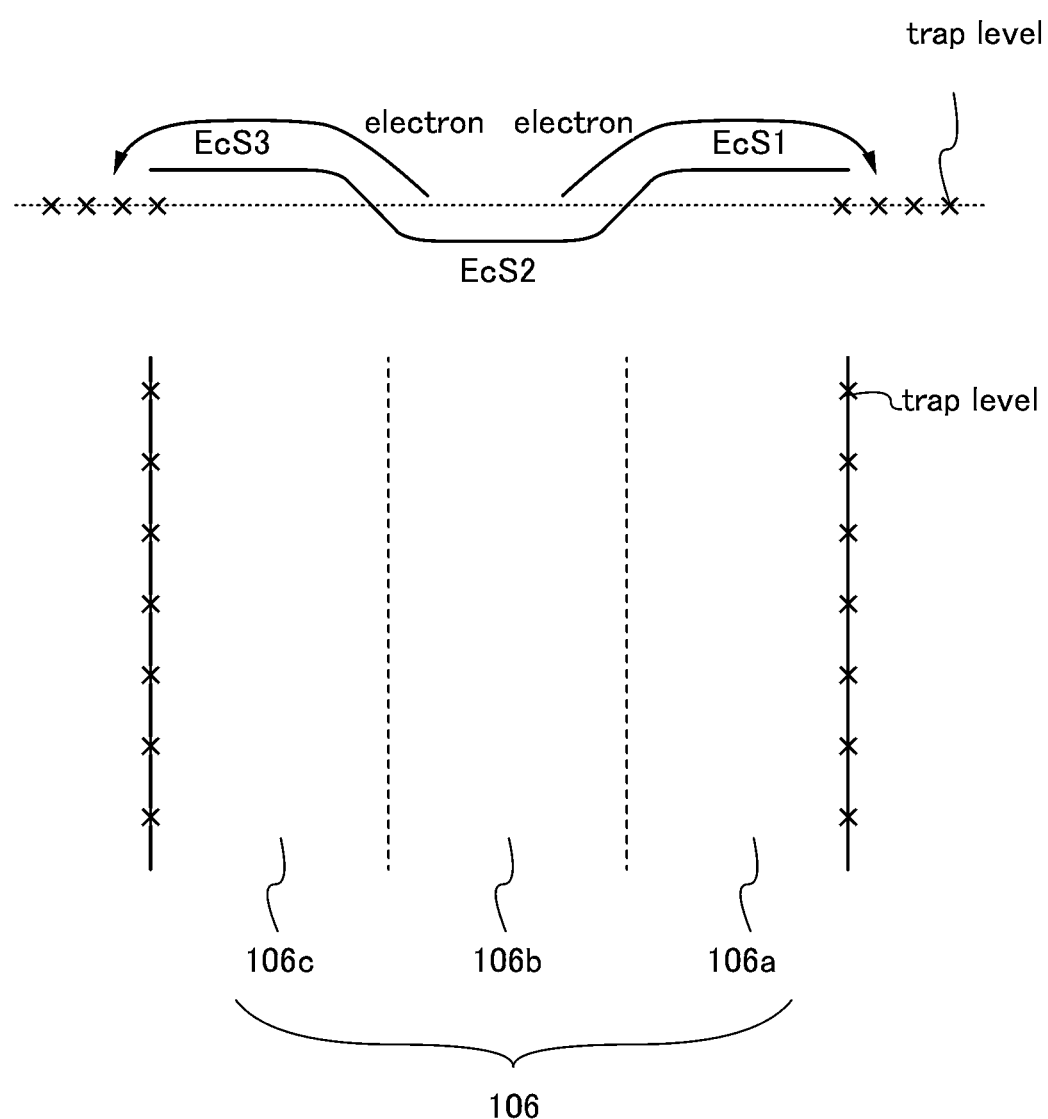
FIG. 11 shows a band structure of a multilayer film of one embodiment of the present invention.

Note that although trap states due to impurities or defects might be formed in the vicinity of the interface between an insulating film and each of the oxide layers 106a and 106c as shown in FIG. 11, the oxide semiconductor layer 106b can be distanced away from the trap states owing to existence of the oxide layers 106a and 106c. However, in the case where an energy difference between EcS1 or EcS3 and EcS2 is small, electrons might reach the trap state by passing over the energy gap. Since the electron is trapped in the trap state, a negative fixed charge is caused at the interface with the insulating film; thus, the threshold voltage of the transistor is shifted in the positive direction.

Similarly, although trap states due to impurities or defects might be formed in the vicinity of the interface between the insulating film and the oxide layer 106d, the oxide semiconductor layer 106b can be distanced away from the trap states owing to existence of the oxide layer 106d. However, in the case where an energy difference between EcS4 and EcS2 is small, electrons might reach the trap state by passing over the energy gap. Since the electron is trapped at the trap state, a negative fixed charge is generated at the interface with the insulating film, causing the threshold voltage of the transistor to be shifted in the positive direction.

Thus, the energy difference between EcS2 and each of EcS1, EcS2, and EcS4 is preferably greater than or equal to 0.1 eV, further preferably greater than or equal to 0.15 eV because the amount of change of the threshold voltage of the transistor is reduced and the transistor has stable electrical characteristics.

Here, diffusion of oxygen in the multilayer film 106 by heat treatment at 350° C. or heat treatment at 450° C. is described with reference to FIGS. 12A to 12C.

Figure 12A:
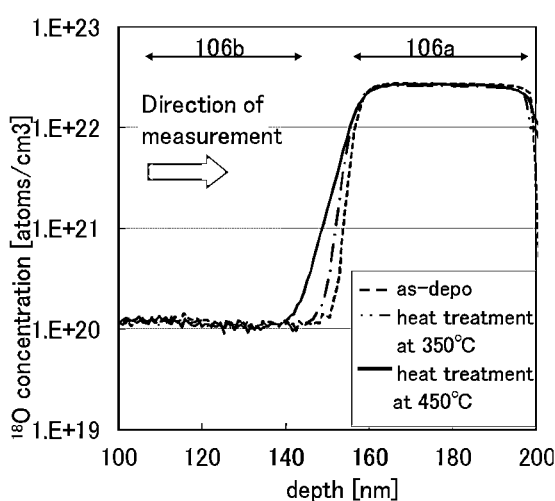
FIGS. 12A to 12C each show diffusion of oxygen in a multilayer film of one embodiment of the present invention.
Figure 12B:
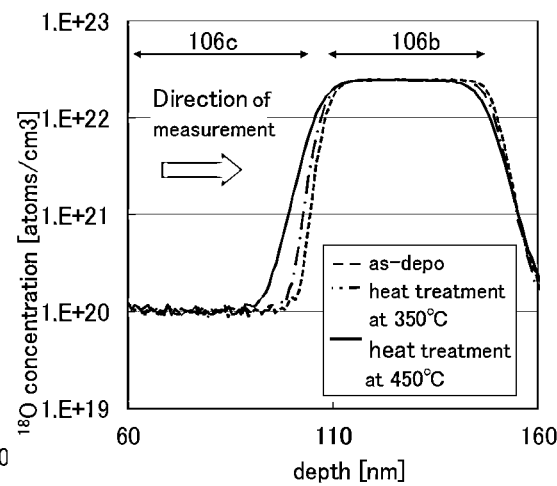
Figure 12C:
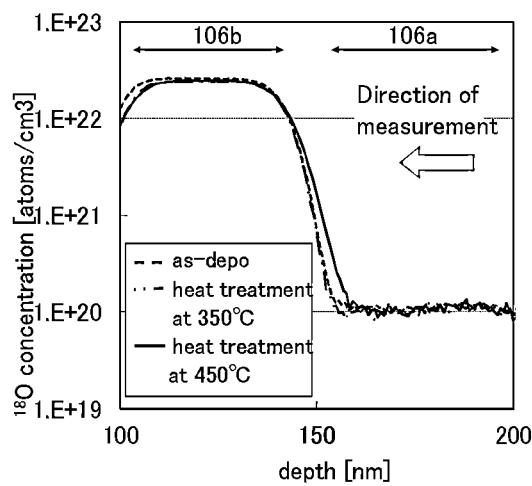

FIGS. 12A to 12C each show SIMS measurement results of concentration distribution of $^{18}O$ in a depth direction in samples in which any of the layers of the multilayer film 106 is formed using an $^{18}O_2$ gas.

Here, the oxide layer 106a is an oxide layer formed by a sputtering method using an In—Ga—Zn oxide (having an atomic ratio of In:Ga:Zn=1:1:1) target.

The oxide semiconductor layer 106b is an oxide semiconductor layer formed by a sputtering method using an In—Ga—Zn oxide (having atomic ratio of In:Ga:Zn is 3:1:2) target.

The oxide layer 106c is an oxide layer formed by a sputtering method using an In—Ga—Zn oxide (the atomic ratio of In to Ga and Zn is 1:1:1) target.

Here, FIG. 12A shows $^{18}O$ concentration distributions in a depth direction of the oxide layer 106a, the oxide semiconductor layer 106b, and the interface therebetween of samples in each of which an $^{18}O_2$ gas is used for forming the oxide layer 106a but is not used for forming the other layers. The SIMS measurement results show as follows: $^{18}O$ is more diffused from the oxide layer 106a to the oxide semiconductor layer 106b in a sample subjected to the heat treatment at 350° C. (shown as "after heat treatment at 350° C." with a dashed dotted line) and a sample subjected to the heat treatment at 450° C. (shown as "after heat treatment at 450° C." with a solid line) than in a sample not subjected to heat treatment (shown as "as-depo" with a dotted line).

FIG. 12B shows $^{18}O$ concentration distributions in a depth direction of the oxide semiconductor layer 106b, the oxide layer 106c, and the interface therebetween of samples in each of which an $^{18}O_2$ gas is used for forming the oxide semiconductor layer 106b but is not used for forming the other layers. The SIMS measurement results show as follows: $^{18}O$ is more diffused from the oxide semiconductor layer 106b to the oxide layer 106c in a sample subjected to the heat treatment at 350° C. (shown as "after heat treatment at 350° C." with a dashed dotted line) and a sample subjected to the heat treatment at 450° C. (shown as "after heat treatment at 450° C." with a solid line) than in a sample not subjected to heat treatment (shown as "as-depo" with a dotted line).

FIG. 12C shows $^{18}O$ concentration distributions in a depth direction of the oxide layer 106a, the oxide semiconductor layer 106b, and the interface therebetween of samples in each of which an $^{18}O_2$ gas is used for forming the oxide semiconductor layer 106b but is not used for forming the other layers. The SIMS measurement results show as follows: $^{18}O$ is more diffused from the oxide semiconductor layer 106b to the oxide layer 106a in a sample subjected to the heat treatment at 450° C. (shown as "after heat treatment at 450° C." with a solid line) than in a sample not subjected to heat treatment (shown as "as-depo" with a dotted line) and in a sample subjected to the heat treatment at 350° C. (shown as "after heat treatment at 350° C." with a dashed dotted line).

As shown in FIGS. 12A to 12C, in the multi-layer film 106, oxygen is diffused from one layer to the other layer. In other words, an interface formed by a combination of any two layers selected from the oxide layer 106a, the oxide semiconductor layer 106b, the oxide layer 106c, and the oxide layer 106d forms a layer in which component elements of the two layers are mixed (the layer is also referred to as a mixed layer). Note that the mixed layer has an intermediate property between the two layers.

By reducing the density of the localized state of the multilayer film 106, the transistor including the multilayer film 106 can have stable electrical characteristics. In the description below, the density of the localized state of the multilayer film 106 was measured by a constant photocurrent method (CPM).

In order that the transistor has high field-effect mobility and stable electrical characteristics, the absorption coefficient due to the density of the localized state of the multilayer film 106 measured by CPM is preferably lower than $1\times10^{-3}$ cm$^{-1}$, further preferably lower than $3\times10^{-4}$ cm$^{-1}$.

A sample on which CPM measurement was performed will be described below.

The oxide layer 106a was formed by a sputtering method using an In—Ga—Zn oxide (having an atomic ratio of In:Ga:Zn=1:3:2) target. Note that an argon gas (flow rate: 30 sccm) and an oxygen gas (flow rate: 15 sccm) were used as a deposition gas, the pressure was set to 0.4 Pa, the substrate temperature was set to 200° C., and a DC power of 0.5 kW was applied.

The oxide semiconductor layer 106b is an oxide semiconductor layer formed by a sputtering method using an In—Ga—Zn oxide (having an atomic ratio of In:Ga:Zn=1:1:1) target. Note that an argon gas (flow rate: 30 sccm) and an oxygen gas (flow rate: 15 sccm) were used as a deposition gas, the pressure was set to 0.4 Pa, the substrate temperature was set to 200° C., and a DC power of 0.5 kW was applied.

The oxide layer 106c is an oxide layer formed by a sputtering method using an In—Ga—Zn oxide (having an atomic ratio of In:Ga:Zn=1:3:2) target. Note that an argon gas (flow rate: 30 sccm) and an oxygen gas (flow rate: 15 sccm) were used as a deposition gas, the pressure was set to 0.4 Pa, the substrate temperature was set to 200° C., and a DC power of 0.5 kW was applied.

Here, in order to improve the accuracy of the CPM measurement, the multilayer film 106 needs to have a certain thickness. Specifically, the thicknesses of the oxide layer 106a, the oxide semiconductor layer 106b, and the oxide layer 106c which are included in the multilayer film 106 were set to 30 nm, 100 nm, and 30 nm, respectively.

In the CPM measurement, the amount of light with which a surface of the sample between terminals is irradiated is adjusted so that a photocurrent value is kept constant in the state where voltage is applied between a first electrode and a second electrode provided in contact with the multilayer film 106 that is the sample, and then an absorption coefficient is derived from the amount of the irradiation light at each wavelength. In the CPM measurement, when the sample has a defect, the absorption coefficient of energy which corresponds to a level at which the defect exists (calculated from a wavelength) is increased. The increase in the absorption coefficient is multiplied by a constant, whereby the defect density of the sample can be obtained.

Figure 13A:
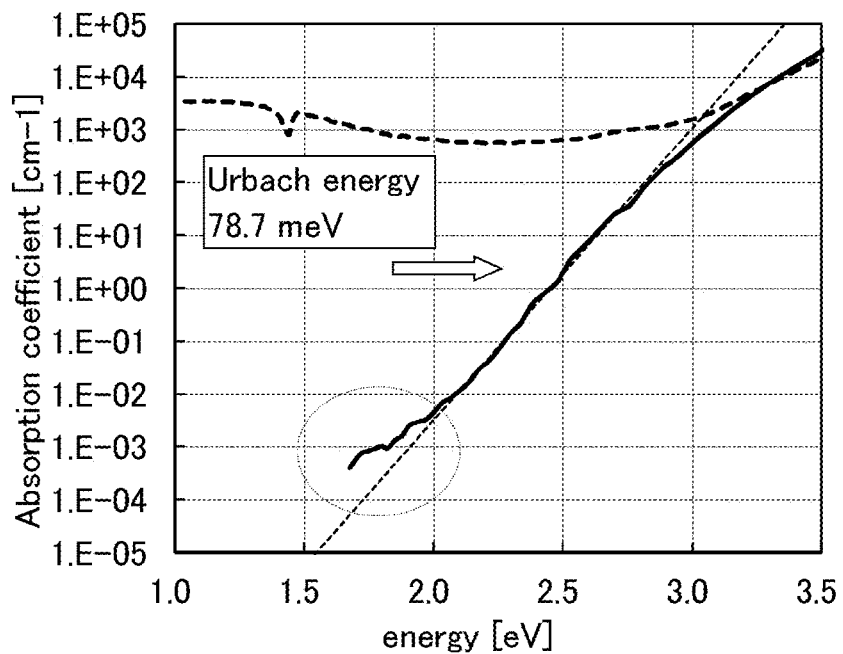
FIGS. 13A and 13B show CPM measurement results of a multilayer film of one embodiment of the present invention.
Figure 13B:
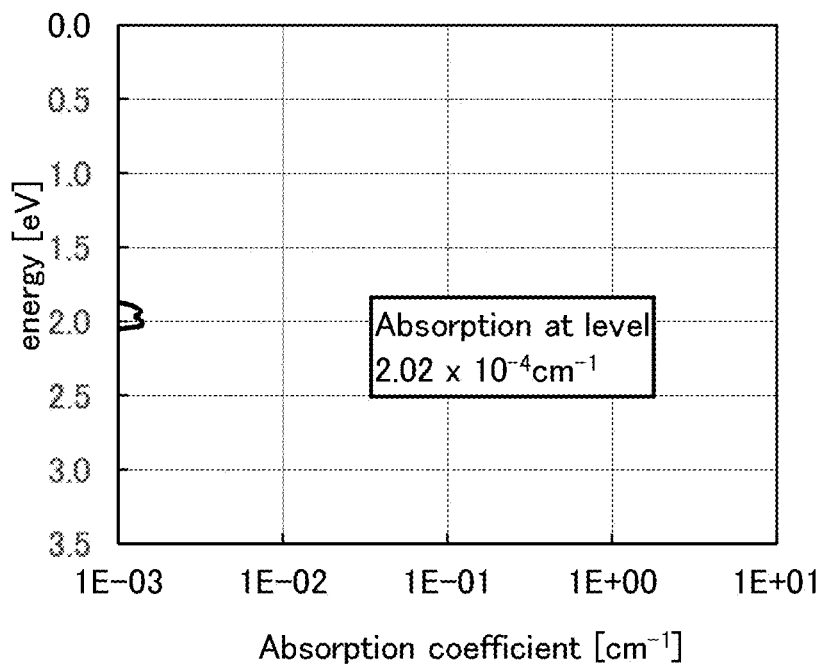

FIG. 13A shows results of fitting the absorption coefficient (dotted line) measured using a spectrophotometer and the absorption coefficient (solid line) measured by CPM in the range of energy higher than or equal to the energy gap of each layer in the multi-layer film 106. Note that the Urbach energy obtained based on the absorption coefficient measured by CPM was 78.7 meV. The integral value of the absorption coefficient in the energy range was derived in such a manner that a background (thin dotted line) was subtracted from the absorption coefficient measured by CPM in the energy range shown with a dashed-line circle in FIG. 13A (see FIG. 13B). As a result, the absorption coefficient due to the density of the localized state of this sample was found to be $2.02\times10^{-4}$ cm$^{-1}$.

The density of the localized state obtained here is probably due to an impurity or a defect. From the above, the multi-layer film 106 has an extremely low state due to an impurity or a defect. That is, the transistor including the multilayer film 106 has high field-effect mobility and stable electrical characteristics.

<1-3-4. Crystallinity of Multilayer Film>

The crystallinity of each of the oxide layer 106a, the oxide semiconductor layer 106b, the oxide layer 106c, and the oxide layer 106d included in the multilayer film 106 is described below.

The oxide layer 106a, the oxide semiconductor layer 106b, the oxide layer 106c, and the oxide layer 106d in the multi-layer film 106 each have an amorphous structure or a crystallinity structure.

A structure of an oxide semiconductor layer (oxide layer) is described below.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

Further, the trigonal and rhombohedral crystal systems are included in the hexagonal crystal system.

An oxide semiconductor layer is classified roughly into a single-crystal oxide semiconductor layer and a non-single-crystal oxide semiconductor layer. The non-single-crystal oxide semiconductor layer includes any of an amorphous oxide semiconductor layer, a microcrystalline oxide semiconductor layer, a polycrystalline oxide semiconductor layer, a c-axis aligned crystalline oxide semiconductor (CAAC-OS) layer, and the like.

The amorphous oxide semiconductor layer has disordered atomic arrangement and no crystalline component. A typical example thereof is an oxide semiconductor layer in which no crystal part exists even in a microscopic region, and the whole of the film is amorphous.

The microcrystalline oxide semiconductor layer includes a microcrystal (also referred to as nanocrystal) with a size greater than or equal to 1 nm and less than 10 nm, for example. Thus, the microcrystalline oxide semiconductor layer has a higher degree of atomic order than the amorphous oxide semiconductor layer. Hence, the density of defect states of the microcrystalline oxide semiconductor layer is lower than that of the amorphous oxide semiconductor layer.

The CAAC-OS layer is one of oxide semiconductor layers including a plurality of crystal parts, and most of the crystal parts each fit inside a cube whose one side is less than 100 nm. Thus, there is a case where a crystal part included in the CAAC-OS layer fits a cube whose one side is less than 10 nm, less than 5 nm, or less than 3 nm. The density of defect states of the CAAC-OS layer is lower than that of the microcrystalline oxide semiconductor layer. The CAAC-OS layer is described in detail below.

In a transmission electron microscope (TEM) image of the CAAC-OS layer, a boundary between crystal parts, that is, a grain boundary is not clearly observed. Thus, in the CAAC-OS layer, a reduction in electron mobility due to the grain boundary is less likely to occur.

According to the TEM image of the CAAC-OS layer observed in a direction substantially parallel to a sample surface (cross-sectional TEM image), metal atoms are arranged in a layered manner in the crystal parts. Each metal atom layer has a morphology reflected by a surface over which the CAAC-OS layer is formed (hereinafter, a surface over which the CAAC-OS layer is formed is referred to as a formation surface) or a top surface of the CAAC-OS layer, and is arranged in parallel to the formation surface or the top surface of the CAAC-OS layer.

On the other hand, according to the TEM image of the CAAC-OS layer observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS layer.

A CAAC-OS layer is subjected to structural analysis with an X-ray diffraction (XRD) apparatus. For example, when the CAAC-OS layer including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS layer have c-axis alignment, and that the c-axes are aligned in a direction substantially perpendicular to the formation surface or the top surface of the CAAC-OS layer.

On the other hand, when the CAAC-OS layer is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under a condition where the sample is rotated around a normal vector of a sample surface as an axis (φ axis) with 2θ fixed at around 56°. In the case where the sample is a single-crystal oxide semiconductor layer of InGaZnO$_4$, six peaks appear. The six peaks are derived from crystal planes equivalent to the (110) plane. On the other hand, in the case of a CAAC-OS layer, a peak is not clearly observed even when θ scan is performed with 2θ fixed at around 56°.

According to the above results, in the CAAC-OS layer having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS layer or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS layer is changed by etching or the like, the c-axis might not be necessarily parallel to a normal vector of a formation surface or a normal vector of a top surface of the CAAC-OS layer.

Further, the degree of crystallinity in the CAAC-OS layer is not necessarily uniform. For example, in the case where crystal growth leading to the CAAC-OS layer occurs from the vicinity of the top surface of the layer, the degree of the crystallinity in the vicinity of the top surface is higher than that in the vicinity of the formation surface in some cases. Further, when an impurity is added to the CAAC-OS layer, the crystallinity in a region to which the impurity is added is changed, and the degree of crystallinity in the CAAC-OS layer varies depends on regions.

Note that when the CAAC-OS layer with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS layer. It is preferable that in the CAAC-OS layer, a peak of 2θ appear at around 31° and a peak of 2θ do not appear at around 36°.

With use of the CAAC-OS layer in a transistor, change in electric characteristics of the transistor due to irradiation with visible light or ultraviolet light can be reduced. Thus, the transistor has high reliability.

Note that an oxide semiconductor layer may be a stacked film including two or more layers of an amorphous oxide semiconductor layer, a microcrystalline oxide semiconductor layer, and a CAAC-OS layer, for example.

It is preferable that at least the oxide semiconductor layer 106b of the multilayer film 106 have a crystalline structure, and is particularly preferably a CAAC-OS layer.

In order that the oxide semiconductor layer 106b is a CAAC-OS layer, it is preferable that the oxide layer 106a serving as a base have a crystalline structure similar to that of a CAAC-OS layer or have an amorphous structure. Further, when the oxide semiconductor layer 106b is a CAAC-OS layer, the oxide layer 106c for which the oxide semiconductor layer 106b serves as a base is likely to have a crystalline structure similar to that of a CAAC-OS layer. However, the oxide layer 106c does not necessarily have the crystalline structure but may have an amorphous structure.

Note that the oxide layer 106d may have an amorphous structure or a crystalline structure.

The oxide semiconductor layer 106b serves as a channel in the transistor including the multilayer film 106; therefore, it is preferable that the oxide semiconductor layer 106b have high crystallinity in order that the transistor can have stable electrical characteristics.

Here, as for the crystallinity of the multilayer film 106, atomic arrangement was evaluated with a transmission electron microscope (TEM). The description is made below using FIGS. 14A to 14D.

Here, the oxide layer 106a is an oxide layer formed by a sputtering method using an In—Ga—Zn oxide (having an atomic ratio of In:Ga:Zn=1:3:2) target. Note that an argon gas (flow rate: 30 sccm) and an oxygen gas (flow rate: 15 sccm) were used as a deposition gas, the pressure was set to 0.4 Pa, the substrate temperature was set to 200° C., and a DC power of 0.5 kW was applied.

The oxide semiconductor layer 106b is an oxide semiconductor layer formed by a sputtering method using an In—Ga—Zn oxide (having an atomic ratio of In:Ga:Zn=1:1:1) target. Note that an argon gas (flow rate: 30 sccm) and an oxygen gas (flow rate: 15 sccm) were used as a deposition gas, the pressure was set to 0.4 Pa, the substrate temperature was set to 400° C., and a DC power of 0.5 kW was applied.

The oxide layer 106c is an oxide layer formed by a sputtering method using an In—Ga—Zn oxide (having an atomic ratio of In to Ga and Zn=1:3:2) target. Note that an argon gas (flow rate: 30 sccm) and an oxygen gas (flow rate: 15 sccm) were used as a deposition gas, the pressure was set to 0.4 Pa, the substrate temperature was set to 200° C., and a DC power of 0.5 kW was applied.

FIGS. 14A to 14D are transmission electron images of samples each including the multilayer film 106 provided over a silicon oxide film over a silicon wafer. Note that each sample was not subjected to heat treatment. The transmission electron images were measured using Hitachi H-9500 transmission electron microscope (TEM).

Figure 14A:
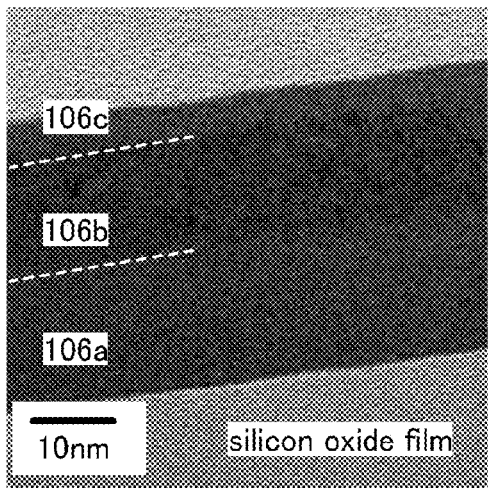
FIGS. 14A to 14D are each a transmission electron image of a multilayer film of one embodiment of the present invention, which is obtained with a TEM.
Figure 14C:
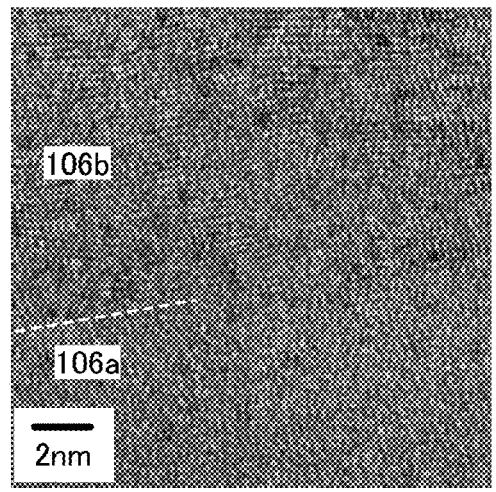
Figure 14B:
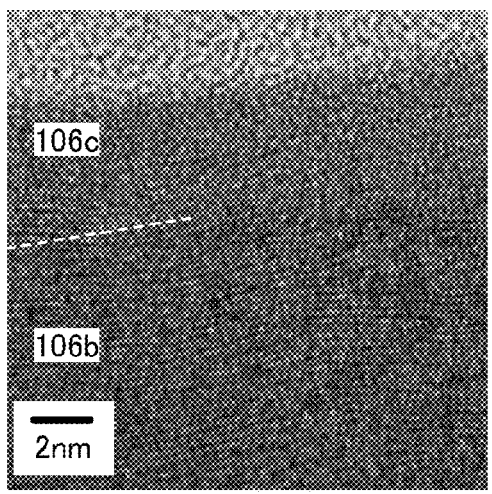
Figure 14D:
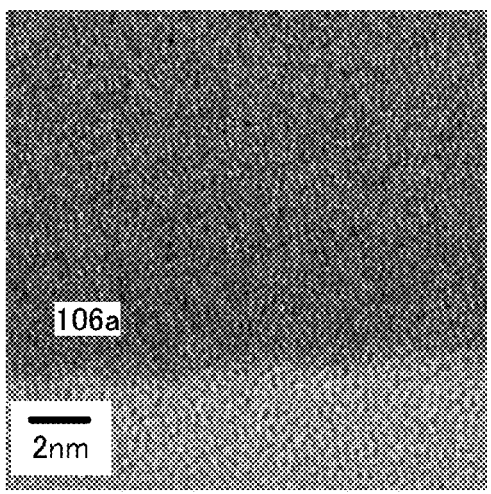

Here, the multilayer film 106 includes a 20-nm-thick In—Ga—Zn oxide as the oxide layer 106a, a 15-nm-thick In—Ga—Zn oxide as the oxide semiconductor layer 106b, and a 5-nm-thick In—Ga—Zn oxide as the oxide layer 106c. FIG. 14A is a transmission electron image showing the oxide layer 106a, the oxide semiconductor layer 106b, and the oxide layer 106c. FIG. 14B is an enlarged image of a portion in the vicinity of the interface between the oxide semiconductor layer 106b and the oxide layer 106c, FIG. 14C is an enlarged image of a portion in the vicinity of the interface between the oxide layer 106a and the oxide semiconductor layer 106b, and FIG. 14D is an enlarged image of a portion in the vicinity of the interface between the silicon oxide film and the oxide layer 106a.

FIGS. 14A to 14D show that the oxide layer 106a is amorphous. Note that it was found that the oxide layer 106c had a crystalline structure in which a crystal part exists in the vicinity of the interface with the oxide semiconductor layer 106b. Further, the oxide semiconductor layer 106b has a crystalline structure with high crystallinity from the interface with the oxide layer 106a to the interface with the oxide layer 106c. Note that the atomic arrangement in the crystal part of the oxide semiconductor layer 106b was found to be in a layered manner in a plane parallel to the upper surface of the oxide semiconductor layer 106b. Moreover, a clear crystal grain boundary was not seen between crystal parts in the oxide semiconductor layer 106b.

The fact that the oxide semiconductor layer 106b has a crystalline structure is also compatible with the ToF-SIMS results shown in FIG. 9. That is, the crystallinity of the oxide semiconductor layer 106b was not lowered probably because entry of an impurity such as silicon into the oxide semiconductor layer 106b was reduced owing to existence of the oxide layers 106a and 106c.

In this manner, it seems that the oxide semiconductor layer 106b where a channel is formed has a high degree of crystallinity and there are few states due to impurities or defects; therefore, the transistor including the multi-layer film 106 has stable electrical characteristics.

Here, a model in which an oxide semiconductor layer having high crystallinity is formed over an insulating surface, an amorphous film, or an amorphous insulating film is described with reference to FIGS. 15A and 15B, FIGS. 16A and 16B, and FIGS. 17A and 17B.

Figure 15A:
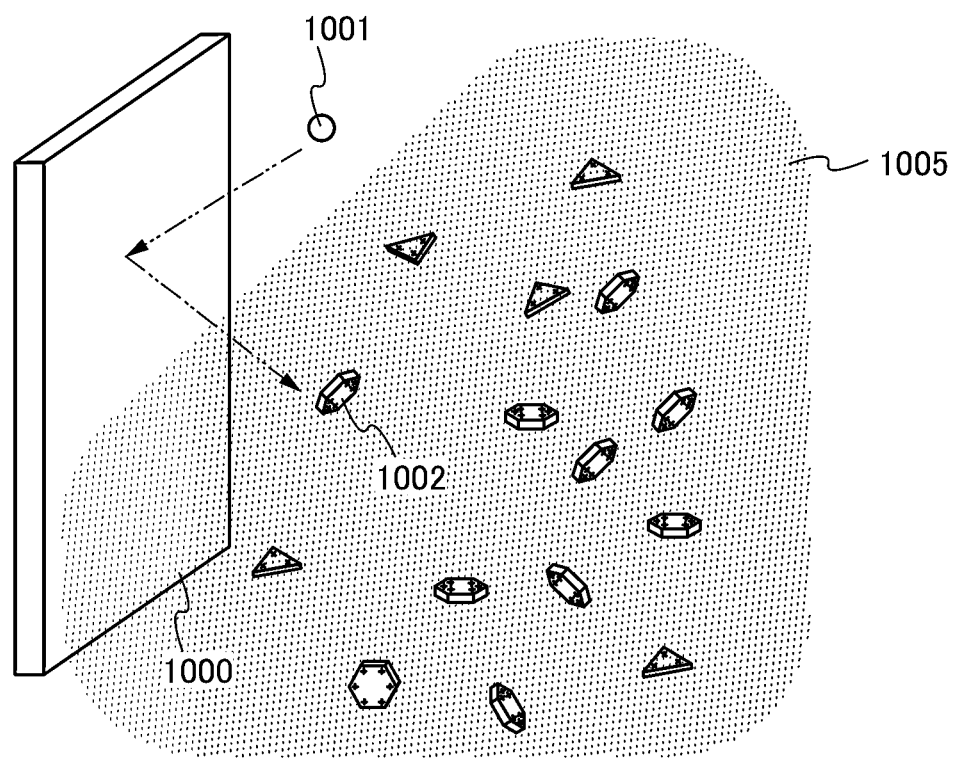
FIGS. 15A and 15B illustrate a situation where spattered particles are separated from a sputtering target.
Figure 15B:
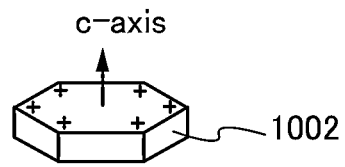

FIG. 15A is a schematic diagram illustrating a state in which an ion 1001 collides with a target 1000 containing a polycrystalline oxide semiconductor having high alignment to separate a sputtered particle 1002 with crystallinity from the sputtering target 1000. A crystal grain in the sputtering target 1000 has a cleavage plane parallel to a surface of the target 1000. The crystal grain has a portion with a weak interatomic bond. When the ion 1001 collides with the crystal grain, an interatomic bond of the portion where an interatomic bond is weak is cut. Accordingly, the sputtered particle 1002 is cut along the cleavage plane and the portion with the weak interatomic bond and separated in a flat-plate (or a pellet) form. For example, the c-axis direction of the sputtered particle 1002 corresponds to a direction perpendicular to a flat plane of the sputtered particle 1002 (see FIG. 15B). Note that the equivalent circle diameter of a flat plane of the sputtered particle 1002 is greater than or equal to 1/3000 and less than or equal to 1/20, preferably greater than or equal to 1/1000 and less than or equal to 1/30 of an average grain size of the crystal grains. Here, the term "equivalent circle diameter on a plane" refers to the diameter of a perfect circle having the same area as the plane.

Alternatively, when part of the crystal grain is separated as a particle from a cleavage plane and exposed to plasma 1005, cutting of a bond starts at the portion where an interatomic bond is weak, so that a plurality of sputtered particles 1002 are generated.

With the use of an oxygen cation as the ion 1001, plasma damage at the film formation can be alleviated. Specifically, when the ion 1001 collides with the surface of the target 1000, a lowering in crystallinity of the target 1000 can be prevented or a change of the target 1000 into an amorphous state can be prevented.

Figure 16A:
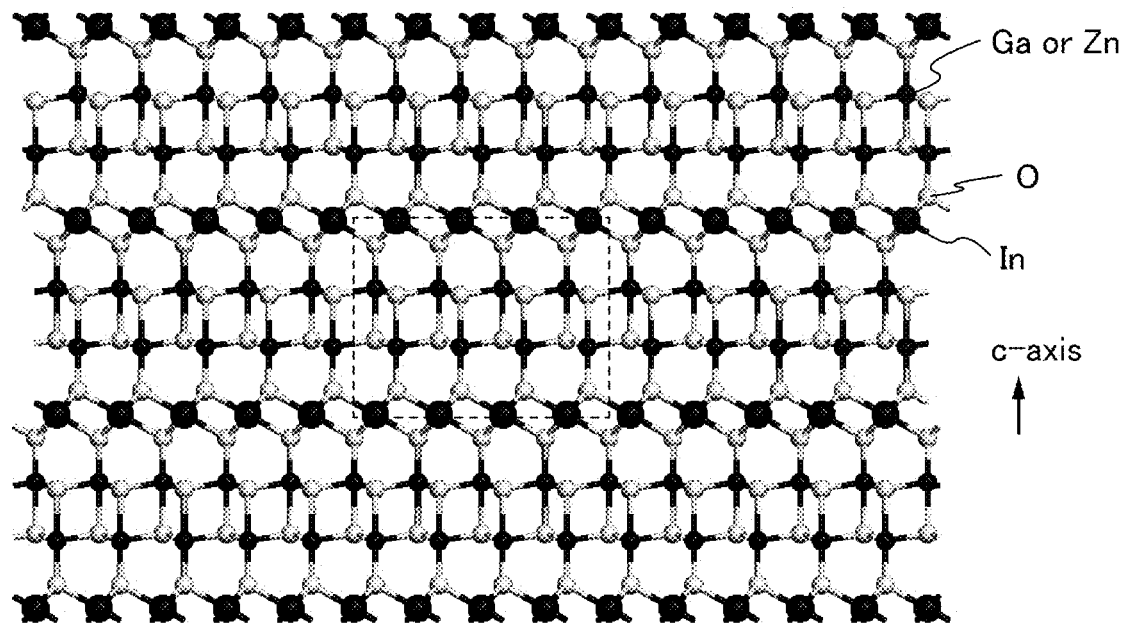
FIGS. 16A and 16B illustrate an example of a crystal structure of an In—Ga—Zn oxide.
Figure 16B:
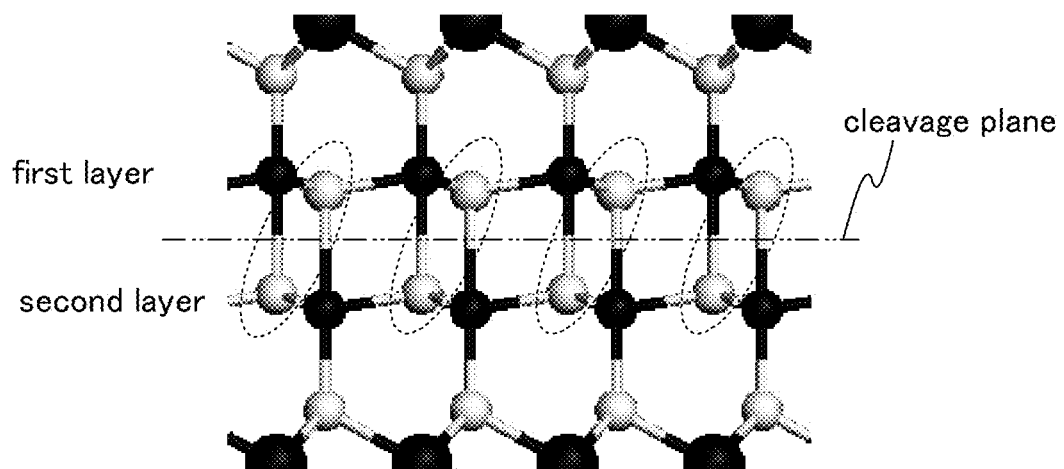

FIG. 16A illustrates a crystal structure of an In—Ga—Zn oxide viewed from a direction parallel to an a-b plane of the crystal as an example of the target 1000 containing a polycrystalline oxide semiconductor with high alignment. FIG. 16B illustrates an enlarged view of a portion surrounded by a dashed line in FIG. 16A.

For example, in a crystal grain of an In—Ga—Zn oxide, a cleavage plane is a plane between a first layer and a second layer as illustrated in FIG. 16B. The first layer includes a gallium atom and/or zinc atom and an oxygen atom, and the second layer includes a gallium atom and/or zinc atom and an oxygen atom. This is because oxygen atoms having negative charge in the first layer and oxygen atoms having negative charge in the second layer are close to each other (see surrounded portions in FIG. 16B). In this manner, the cleavage plane is a plane parallel to an a-b plane. Further, the crystal of the In—Ga—Zn oxide shown in FIGS. 16A and 16B is a hexagonal crystal; thus the flat-plate-like particle is likely to have a hexagonal prism shape with a regular hexagonal plane whose internal angle is 120°.

It is preferable that the sputtered particles 1002 be positively charged. Note that it is preferable that corner portions of the sputtered particles 1002 have charges with the same polarity because interaction between the sputtered particles occurs (the sputtered particles repel with each other) so that the shapes of the sputtered particles maintain (see FIG. 15B). For example, the sputtered particles 1002 may be positively charged. There is no particular limitation on a timing of when the sputtered particle 1002 is positively charged, but it is preferably positively charged by receiving an electric charge when an ion 1001 collides. Alternatively, in the case where the plasma 1005 is generated, the sputtered particle 1002 is preferably exposed to the plasma 1005 to be positively charged. Further alternatively, the ion 1001 which is an oxygen cation is preferably bonded to a side surface, a top surface, or a bottom surface of the sputtered particle 1002, whereby the sputtered particle 1002 is positively charged.

A state where a sputtered particle is deposited on a deposition surface is described with reference to FIGS. 17A and 17B. Note that in FIGS. 17A and 17B, sputtered particles which have been already deposited are shown by dotted lines.

Figure 17A:
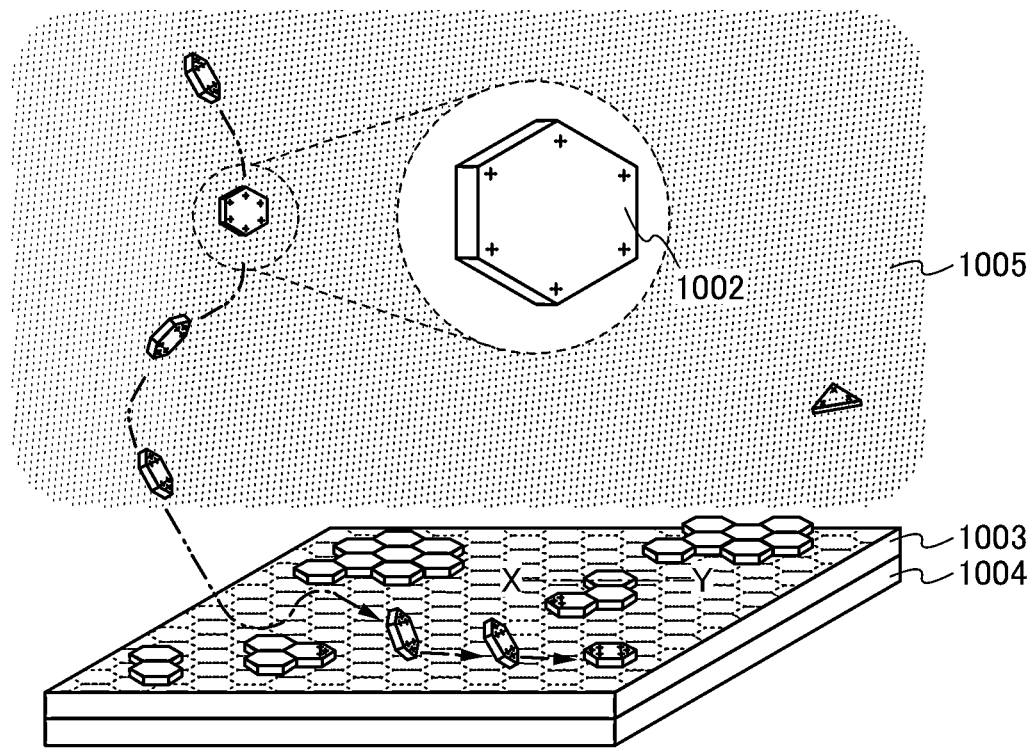
FIGS. 17A and 17B are schematic views illustrating a situation where a sputtered particle reaches a deposition surface and is deposited.

FIG. 17A illustrates an oxide semiconductor layer 1003 which is formed by deposition of the sputtering particles 1002 on an amorphous film 1004. As shown in FIG. 17A, the sputtered particle 1002 is exposed to the plasma 1005 to be positively charged, and accordingly the sputtered particle 1002 is deposited on a region where other sputtered particles 1002 have not been deposited yet. This is because the sputtered particles 1002 that are positively charged repel each other. The sputtering particles can be deposited in the above manner on an insulating surface or on an amorphous insulating film.

Figure 17B:
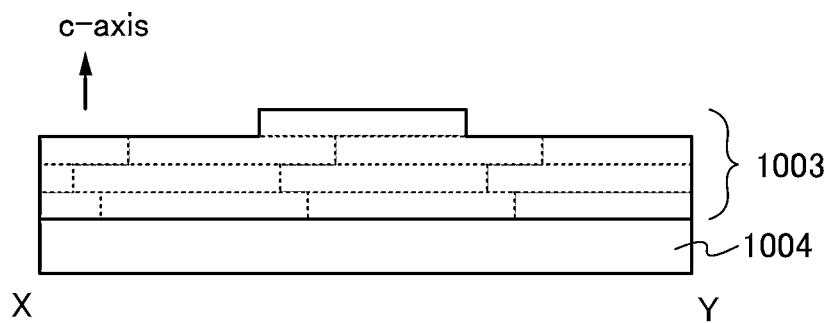

FIG. 17B is a cross-sectional view taken along dashed-dotted line X-Y in FIG. 17A. The oxide semiconductor layer 1003 is formed in such a manner that the plate-like sputtered particles 1002 whose c-axis direction is perpendicular to their flat planes are deposited orderly. Accordingly, the oxide semiconductor layer 1003 is a CAAC-OS whose c-axes are aligned in a direction perpendicular to a surface on which the layer is formed. According to the above model, a CAAC-OS film having high crystallinity can be formed even on an insulating surface, an amorphous film, or an amorphous insulating film.

<1-4. Manufacturing Apparatus>

A low impurity concentration of the oxide semiconductor layer 106b leads to stable electrical characteristics of a transistor. Further, the transistor has stable electrical characteristics in the case where the oxide semiconductor layer 106b has high crystallinity as compared to the case where the oxide semiconductor layer 106b has an amorphous structure. A deposition apparatus for depositing the oxide semiconductor layer 136b to be the oxide semiconductor layer 106b with a low impurity concentration and high crystallinity is described below.

First, a structure of a deposition apparatus which allows the entry of few impurities during deposition is described with reference to FIGS. 18A and 18B.

Figure 18A:
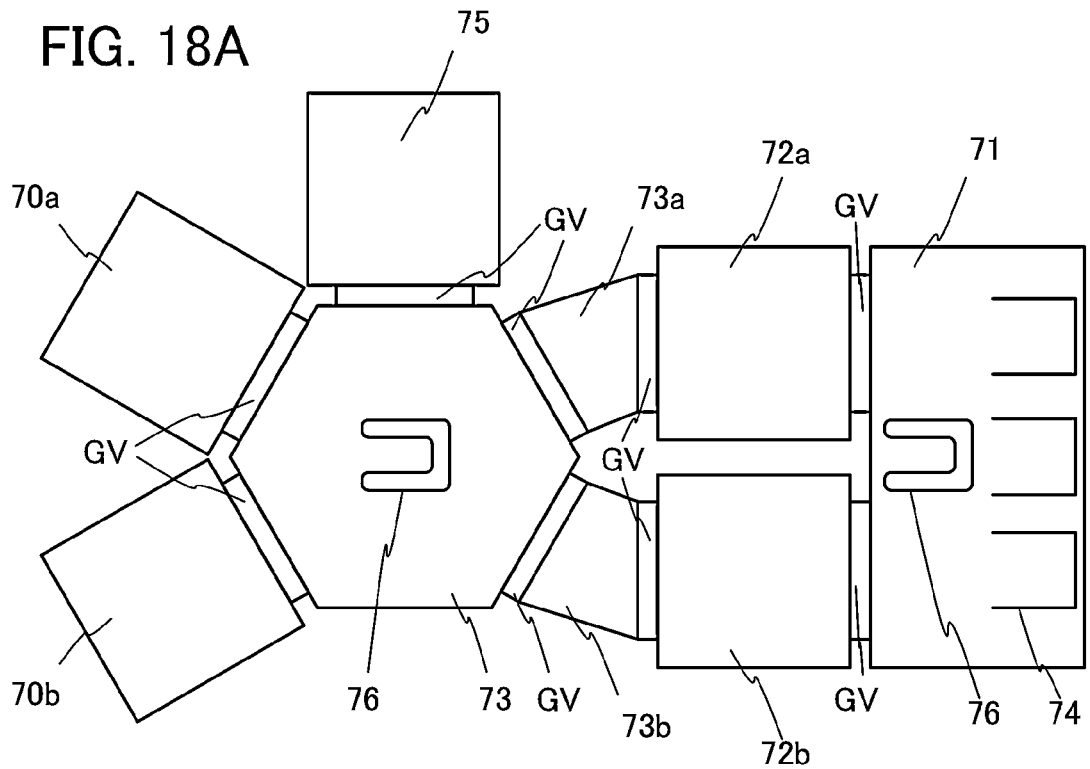
FIGS. 18A and 18B are each a top view illustrating an example of a deposition apparatus.

FIG. 18A is a top view of a multi-deposition-chamber deposition apparatus. The deposition apparatus includes an atmosphere-side substrate supply chamber 71 including three cassette ports 74 for holding substrates, a load lock chamber 72a, an unload lock chamber 72b, a transfer chamber 73, a transfer chamber 73a, a transfer chamber 73b, a substrate heating chamber 75, and deposition chambers 70a and 70b. The atmosphere-side substrate supply chamber 71 is connected to the load lock chamber 72a and the unload lock chamber 72b. The load lock chamber 72a and the unload lock chamber 72b are connected to the transfer chamber 73 with the transfer chambers 73a and 73b positioned therebetween. The substrate heating chamber 75 and the deposition chambers 70a and 70b are each connected only to the transfer chamber 73. Note that connection portions between the chambers are each provided with a gate valve (GV), and the chambers expect the atmosphere-side substrate supply chamber 71 can be independently kept at a vacuum state. Further, the atmosphere-side substrate supply chamber 71 and the transfer chamber 73 each include one or more substrate transfer robots 76 which are capable of transferring a substrate. Here, the substrate heating chamber 75 preferably also serves as a plasma treatment chamber. With a single wafer multi-deposition chamber deposition apparatus, it is possible to transfer a substrate without exposure to the air between treatment and treatment, and adsorption of impurities to a substrate can be suppressed. In addition, the order of deposition, heat treatment, or the like can be freely created. Note that the number of the transfer chambers, the number of the deposition chambers, the number of the load lock chambers, the number of the unload lock chambers, and the number of the substrate heating chambers are not limited to the above, and may be determined as appropriate depending on the space for placement or the process.

Figure 18B:
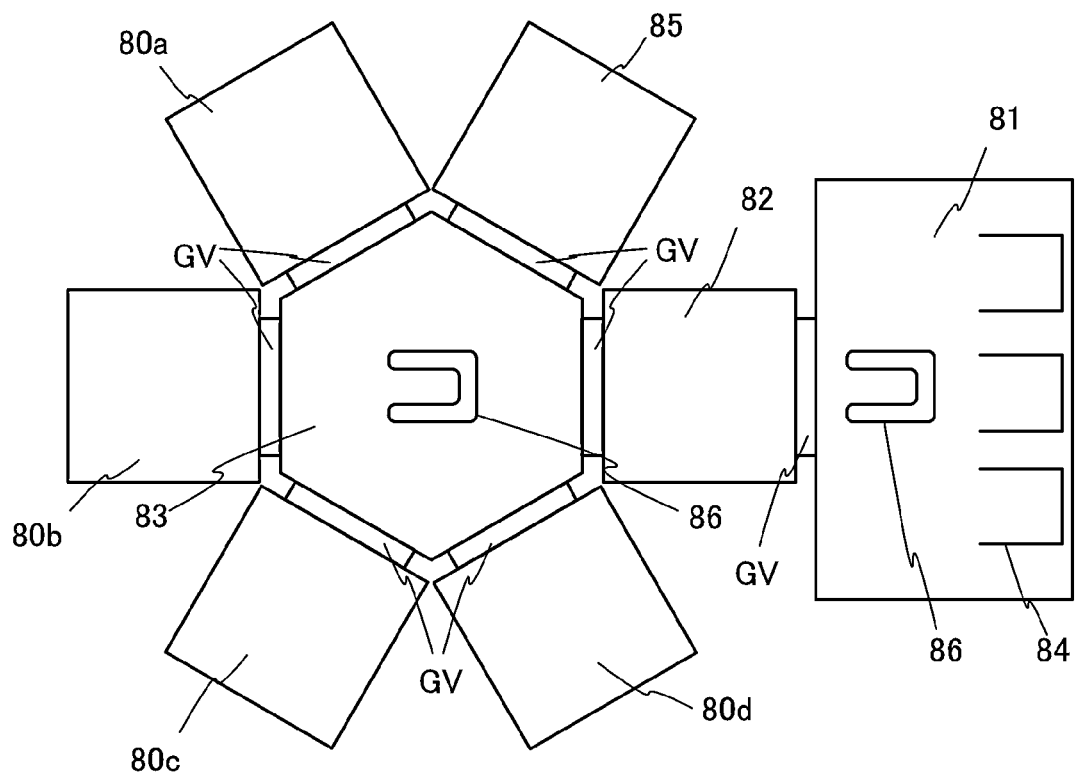

FIG. 18B is a top view of a multi-deposition-chamber deposition apparatus which has a different structure from the deposition chamber of FIG. 18A. The deposition apparatus includes an atmosphere-side substrate supply chamber 81 including cassette ports 84, a load and unload lock chamber 82, a transfer chamber 83, a substrate heating chamber 85, and deposition chambers 80a, 80b, 80c, and 80d. The load and unload lock chamber 82, the substrate heating chamber 85, and the deposition chambers 80a, 80b, 80c, and 80d are connected to each other with the transfer chamber 83 positioned therebetween.

Note that connection portions between the chambers are each provided with a gate valve (GV), and the chambers expect the atmosphere-side substrate supply chamber 81 can be independently kept at a vacuum state. Further, the atmosphere-side substrate supply chamber 81 and the transfer chamber 83 each include one or more substrate transfer robots 86 which are capable of transferring a glass substrate.

Here, the details of the deposition chamber (sputtering chamber) illustrated in FIG. 18B are described with reference to FIG. 19A. The deposition chamber 80b includes a target 87, a deposition-preventing plate 88, and a substrate stage 90. Note that a glass substrate 89 is set on the substrate stage 90. Although not illustrated, the substrate stage 90 may include a substrate holding mechanism which holds the glass substrate 89, a rear heater which heats the glass substrate 89 from the back surface, or the like. The deposition-preventing plate 88 can prevent particles which are sputtered from the target 87 from being deposited on a region where deposition is not needed.

Figure 19A:
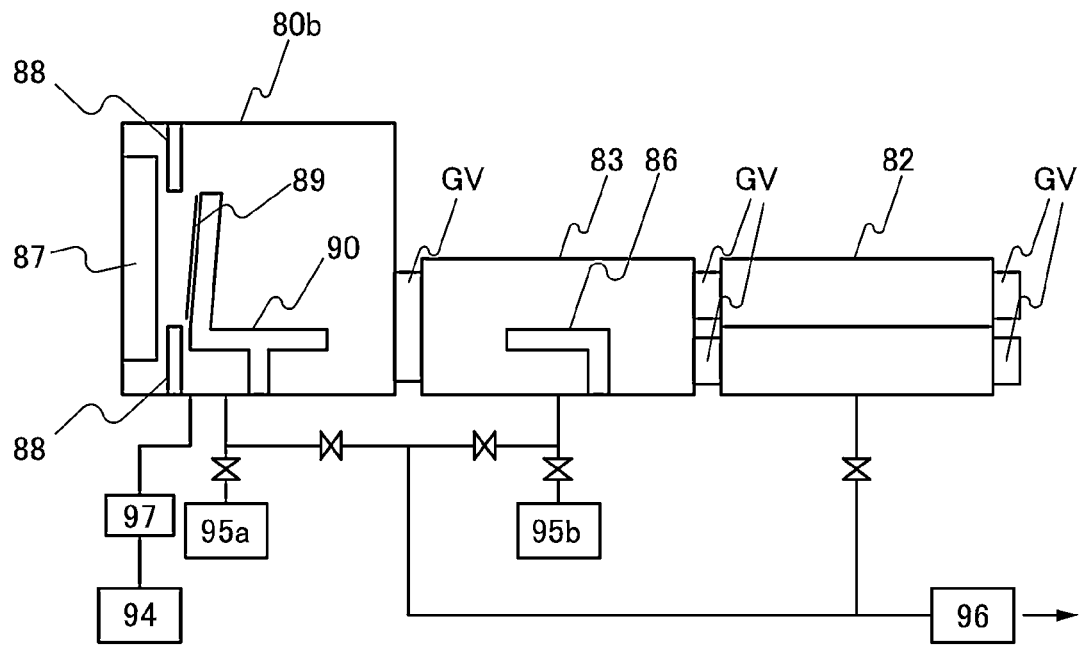
FIGS. 19A and 19B are each a cross-sectional view illustrating an example of a deposition chamber.

The deposition chamber 80b in FIG. 19A is connected to the transfer chamber 83 with a gate valve positioned therebetween, and the transfer chamber 83 is connected to the load and unload lock chamber 82 with a gate valve positioned therebetween. The transfer chamber 83 is provided with the substrate transfer robot 86 which can deliver the glass substrate from the deposition chamber 80b to the load and unload lock chamber 82 and deliver it from the load and unload lock chamber 82 to the deposition chamber 80b. The load and unload lock chamber 82 that is a vacuum chamber is split into an upper part and a bottom part. One of the upper and bottom parts can be used as a load chamber and the other thereof can be used as an unload chamber. Such a structure is preferable because the structure enables a reduction in installation area of the sputtering apparatus.

Further, the deposition chamber 80b in FIG. 19A is connected to a refiner 94 with a mass flow controller 97 positioned therebetween. Although the number of the refiners 94 and the number of the mass flow controllers 97 each correspond to the number of kinds of gases, only one refiner 94 and one mass flow controller 97 are illustrated for simplicity. As the gas used for the deposition chamber 80b and the like, a gas having a dew point of −80° C. or lower, preferably −100° C. or lower, is used. An oxygen gas, a rare gas (such as an argon gas), or the like, which has a low dew point, is used, whereby the amount of moisture mixing into the film during deposition can be reduced.

Further, the deposition chamber 80b in FIG. 19A is connected to a cryopump 95a with a valve positioned therebetween, the transfer chamber 83 is connected to a cryopump 95b with a gate valve positioned therebetween, and the load and unload lock chamber 82 is connected to a vacuum pump 96 with a gate valve positioned therebetween. Note that the load lock chamber and the unload lock chamber in the load and unload lock chamber 82 may be each independently connected to the vacuum pump. The deposition chamber 80b and the transfer chamber 83 are each connected to the vacuum pump 96 with a gate valve positioned therebetween.

Note that the vacuum pump 96 can be a pump in which a dry pump and a mechanical booster pump are connected in series. With such a structure, evacuation can be performed using the vacuum pump 96 when the pressure inside the deposition chamber 80b and the transfer chamber 83 is in the range of atmospheric pressure to low vacuum (about 0.1 Pa to 10 Pa) and then evacuation can be performed using the cryopump 95a or 95b when the pressure inside the deposition chamber 80b and the transfer chamber 83 is in the range of low vacuum to high vacuum ($1\times10^{-4}$ Pa to $1\times10^{-7}$ Pa) by switching the valve.

Figure 19B:
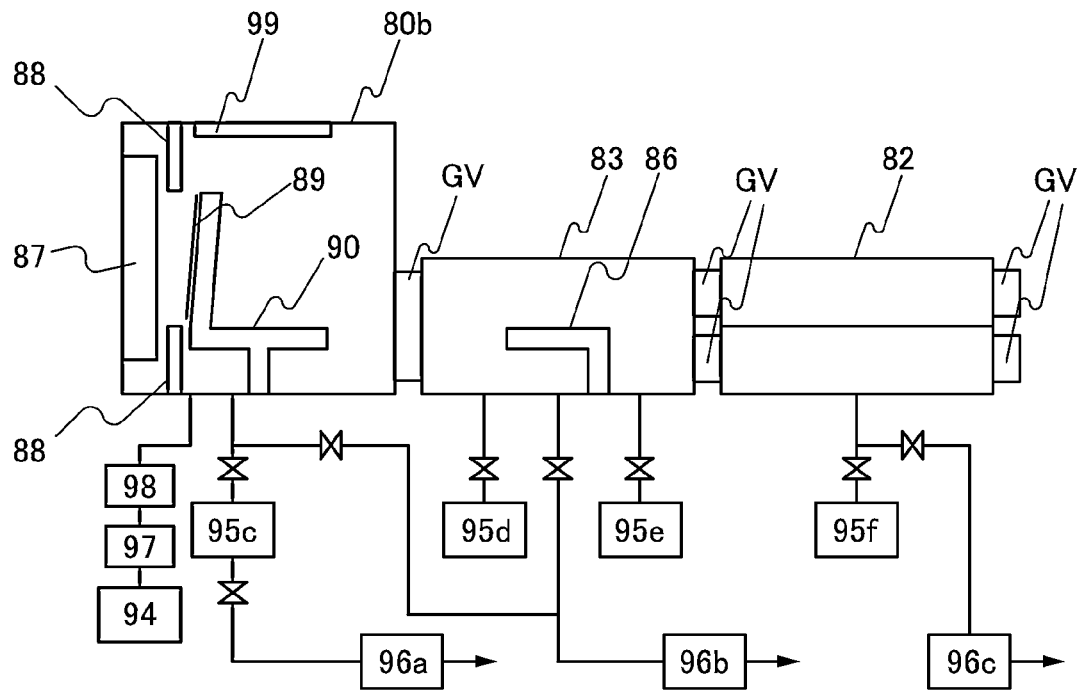

Next, another example of the deposition chamber in FIG. 18B is described using FIG. 19B.

The deposition chamber 80b illustrated in FIG. 19B is connected to the transfer chamber 83 through a gate valve, and the transfer chamber 83 is connected to the load and unload lock chamber 82 through a gate valve.

The deposition chamber 80b in FIG. 19B is connected to the mass flow controller 97 through a gas heating system 98, and the gas heating system 98 is connected to the refiner 94 through the mass flow controller 97. With the gas heating system 98, a gas to be used for the deposition chamber 80b can be heated to a temperature higher than or equal to 40° C. and lower than or equal to 400° C., or higher than or equal to 50° C. and lower than or equal to 200° C. Note that although the number of gas heating systems 98, the number of refiners 94, and the number of the mass flow controllers 97 each correspond to the number of kinds of gases, only one gas heating system 98 and one mass flow controller 97 are provided for simplicity.

The deposition chamber 80b in FIG. 19B is connected to each of a turbo molecular pump 95c and a vacuum pump 96b with valves positioned therebetween. Note that as an auxiliary pump, a vacuum pump 96a is provided for the turbo molecular pump 95c with a valve positioned therebetween. The vacuum pump 96a and the vacuum pump 96b each may have a structure similar to that of the vacuum pump 96.

In addition, the deposition chamber 80b in FIG. 19B is provided with a cryotrap 99.

It is known that the turbo molecular pump 95c is capable of stably evacuating a large-sized molecule (atom), needs low frequency of maintenance, and thus enables high productivity, whereas it has a low capability in evacuating hydrogen and water. Hence, the cryotrap 99 having a high capability in evacuating a molecule (atom) having a relatively high melting point, such as water, is connected to the deposition chamber 80b. The temperature of a refrigerator of the cryotrap 99 is set to lower than or equal to 100 K, preferably lower than or equal to 80 K. In the case where the cryotrap 99 includes a plurality of refrigerators, it is preferable to set the temperature of each refrigerator at a different temperature because efficient evacuation is possible. For example, the temperatures of a first-stage refrigerator and a second-stage refrigerator may be set at 100 K or lower and 20 K or lower, respectively.

The transfer chamber 83 in FIG. 19B is connected to the vacuum pump 96b and cryopumps 95d and 95e each through a valve. In the case of one cryopump, evacuation cannot be performed while the cryopump is in regeneration; however, in the case of two or more cryopumps which are connected in parallel, even when one of the cryopumps is in regeneration, evacuation can be performed using any of the other cryopumps. Note that the above regeneration of a cryopump refers to treatment for discharging molecules (atoms) entrapped in the cryopump. When molecules (atoms) are entrapped too much in a cryopump, the evacuation capability of the cryopump is lowered; therefore, regeneration is performed regularly.

The load and unload lock chamber 82 in FIG. 19B is connected to a cryopump 95f and a vacuum pump 96c each with a valve positioned therebetween. Note that the vacuum pump 96c can have a structure similar to that of the vacuum pump 96.

In the deposition chamber 80b, a target-facing-type sputtering apparatus may be employed.

Note that a parallel-plate-type sputtering device or an ion beam sputtering apparatus may be provided in the deposition chamber 80b.

Next, an example of exhaustion of the substrate heating chamber illustrated in FIG. 18B is described with reference to FIG. 20.

Figure 20:
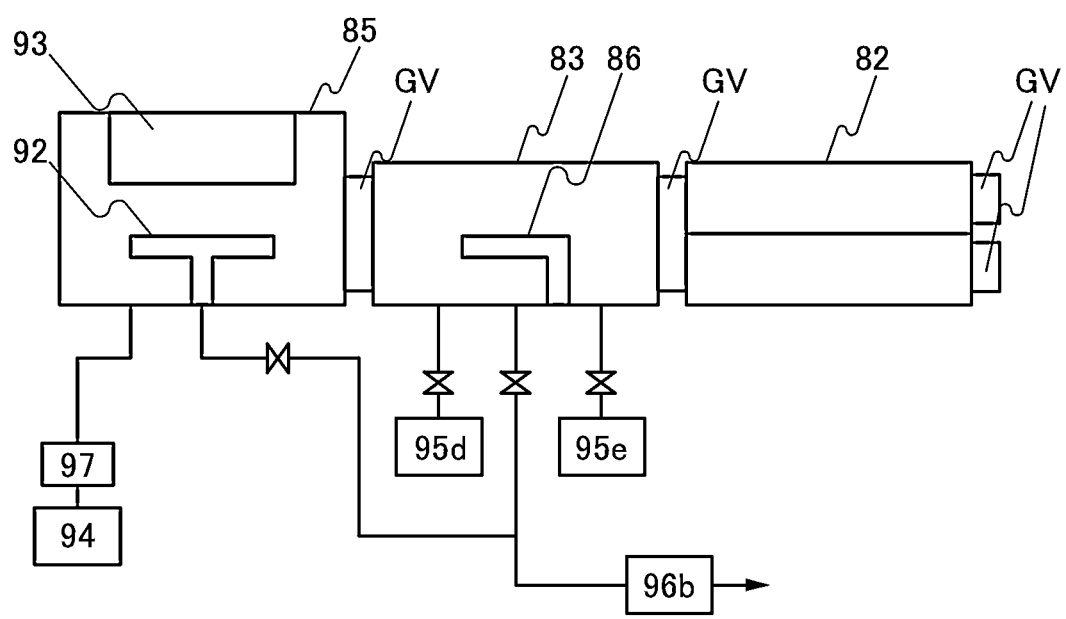
FIG. 20 illustrates an example of a heat treatment chamber.

The substrate heating chamber 85 illustrated in FIG. 20 is connected to the transfer chamber 83 with a gate valve positioned therebetween. The transfer chamber 83 is connected to the load and unload lock chamber 82 with a gate valve positioned therebetween. Note that the exhaustion of the load and unload lock chamber 82 can be similar to that of FIG. 19A or FIG. 19B.

The substrate heating chamber 85 in FIG. 20 is connected to the refiner 94 through the mass flow controller 97. Note that although the number of the refiners 94 and the number of the mass flow controllers 97 each correspond to the number of kinds of gases, only one refiner 94 and one mass flow controller 97 are provided for simplicity. The substrate heating chamber 85 is connected to the vacuum pump 96b with a valve positioned therebetween.

The substrate heating chamber 85 includes a substrate stage 92. The substrate stage 92 holds at least one substrate and may hold a plurality of substrates. In addition, the substrate heating chamber 85 includes a heating system 93. As the heating system 93, for example, a heating system which heats an object using a resistance heater or the like may be used. Alternatively, heat conduction or heat radiation from a medium such as a heated gas may be used as the heating system. For example, RTA (rapid thermal anneal) treatment, such as GRTA (gas rapid thermal anneal) treatment or LRTA (lamp rapid thermal anneal) treatment, can be used. The LRTA treatment is treatment for heating an object by radiation of light (an electromagnetic wave) emitted from a lamp, such as a halogen lamp, a metal halide lamp, a xenon arc lamp, a carbon arc lamp, a high-pressure sodium lamp, or a high-pressure mercury lamp. A GRTA apparatus is an apparatus for performing heat treatment using a high-temperature gas. An inert gas is used as a gas.

Note that the back pressure of each of the deposition chamber 80b and the substrate heating chamber 85 is less than or equal to $1\times10^{-4}$ Pa, preferably less than or equal to $3\times10^{-5}$ Pa, more preferably less than or equal to $1\times10^{-5}$ Pa.

In each of the deposition chamber 80b and the substrate heating chamber 85, the partial pressure of a gas molecule (atom) having a mass-to-charge ratio (m/z) of 18 is less than or equal to $3\times10^{-5}$ Pa, preferably less than or equal to $1\times10^{-5}$ Pa, more preferably less than or equal to $3\times10^{-6}$ Pa.

In each of the deposition chamber 80b and the substrate heating chamber 85, the partial pressure of a gas molecule (atom) having a mass-to-charge ratio (m/z) of 28 is less than or equal to $3\times10^{-5}$ Pa, preferably less than or equal to $1\times10^{-5}$ Pa, more preferably less than or equal to $3\times10^{-6}$ Pa.

Moreover in each of the deposition chamber 80b and the substrate heating chamber 85, the partial pressure of a gas molecule (atom) having a mass-to-charge ratio (m/z) of 44 is lower than or equal to $3\times10^{-5}$ Pa, preferably lower than or equal to $1\times10^{-5}$ Pa, more preferably lower than or equal to $3\times10^{-6}$ Pa.

Further, in each of the deposition chamber 80b and the substrate heating chamber 85, the leakage rate is $3\times10^{-6}$ Pa·m³/s or less, preferably $1\times10^{-6}$ Pa·m³/s or less.

In each of the deposition chamber 80b and the substrate heating chamber 85, the leakage rate of a gas molecule (atom) having a mass-to-charge ratio (m/z) of 18 is less than or equal to $1\times10^{-7}$ Pa·m³/s, preferably less than or equal to $3\times10^{-8}$ Pa·m³/s.

In each of the deposition chamber 80b and the substrate heating chamber 85, the leakage rate of a gas molecule (atom) having a mass-to-charge ratio (m/z) of 28 is less than or equal to $1\times10^{-5}$ Pa·m³/s, preferably less than or equal to $1\times10^{-6}$ Pa·m³/s.

In each of the deposition chamber 80b and the substrate heating chamber 85, the leakage rate of a gas molecule (atom) having a mass-to-charge ratio (m/z) of 44 is less than or equal to $3\times10^{-6}$ Pa·m³/s, preferably less than or equal to $1\times10^{-6}$ Pa·m³/s.

Note that a total pressure and a partial pressure in a vacuum chamber such as the deposition chamber, the substrate heating chamber, or the transfer chamber can be measured using a mass analyzer. For example, Qulee CGM-051, a quadrupole mass analyzer (also referred to as Q-mass) manufactured by ULVAC, Inc. can be used. Note that a leakage rate can be derived from the total pressure and partial pressure measured using the mass analyzer.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate is lower than or equal to the above value.

For example, an open/close portion of the deposition chamber is preferably sealed with a metal gasket. For the metal gasket, metal covered with an iron fluoride, an aluminum oxide, or a chromium oxide is preferably used. The metal gasket realizes higher adhesion than an O-ring, and can reduce the external leakage. Further, with use of the metal covered with an iron fluoride, an aluminum oxide, a chromium oxide, or the like which is in the passive state, the release of gas containing impurities released from the metal gasket is suppressed, so that the internal leakage can be reduced.

For a member of the deposition apparatus, aluminum, chromium, titanium, zirconium, nickel, or vanadium, which releases a smaller amount of gas containing impurities, is used. Alternatively, an alloy containing iron, chromium, nickel, and the like covered with the above member may be used. The alloy containing iron, chromium, nickel, and the like is rigid, resistant to heat, and suitable for processing. Here, when surface unevenness of the member is decreased by polishing or the like to reduce the surface area, the released gas can be reduced.

Alternatively, the above-mentioned member of the deposition apparatus may be covered with iron fluoride, aluminum oxide, chromium oxide, or the like.

The member of the deposition apparatus is preferably formed with only metal as much as possible. For example, in the case where a viewing window formed with quartz or the like is provided, it is preferable that the surface of the member be thinly covered with an iron fluoride, an aluminum oxide, a chromium oxide, or the like so as to suppress the released gas.

In the case where the refiner is provided just before a deposition gas flows, the length of a pipe between the refiner and the deposition chamber is less than or equal to 10 m, preferably less than or equal to 5 m, more preferably less than or equal to 1 m. When the length of the pipe is less than or equal to 10 m, less than or equal to 5 m, or less than or equal to 1 m, the effect of the release of gas from the pipe can be reduced accordingly.

Furthermore, as the pipe for the deposition gas, a metal pipe the inside of which is covered with iron fluoride, aluminum oxide, chromium oxide, or the like is preferably used. With the above pipe, the amount of released gas containing impurities is made small and the entry of impurities into the deposition gas can be reduced as compared with a SUS316L-EP pipe, for example. Further, a high-performance ultra-compact metal gasket joint (a UPG joint) is preferably used as a joint of the pipe. A structure where all the materials of the pipe are metals is preferable because the effect of the generated released gas or the external leakage can be reduced compared with a structure where resin or the like is used.

When an adsorbate is present in the deposition chamber, the adsorbate does not affect the pressure in the deposition chamber because it is adsorbed onto an inner wall or the like; however, the adsorbate causes gas to be released when the inside of the deposition chamber is evacuated. Therefore, although there is no correlation between the leakage rate and the evacuation rate, it is important that the adsorbate present in the deposition chamber be desorbed as much as possible and evacuation be performed in advance with the use of a pump with high evacuation capability. Note that the deposition chamber may be subjected to baking for promotion of desorption of the adsorbate. By the baking, the rate of desorption of the adsorbate can be increased about tenfold. The baking should be performed at a temperature greater than or equal to 100° C. and less than or equal to 450° C. At this time, when the adsorbate is removed while an inert gas flows in the deposition chamber, the desorption rate of water or the like, which is difficult to desorb simply by evacuation, can be further increased. Note that the rate of desorption of the adsorbate can be further increased by heating of the inert gas at substantially the same temperature as the temperature of the baking. Here, a rare gas is preferably used as an inert gas. Depending on the kind of a film to be formed, oxygen or the like may be used instead of an inert gas. For example, in the case of depositing an oxide semiconductor layer, using oxygen, which is the main component of the oxide, is preferable in some cases.

Alternatively, treatment for evacuating the inside of the deposition chamber is preferably performed a certain period of time after a heated oxygen gas, a heated inert gas such as a heated rare gas, or the like flows to increase pressure in the deposition chamber. The flowing of the heated gas can desorb the adsorbate in the deposition chamber, and the impurities present in the deposition chamber can be reduced. Note that a positive effect can be achieved when this treatment is repeated 2 to 30 times inclusive, preferably 5 to 15 times inclusive. Specifically, an inert gas, oxygen, or the like with a temperature higher than or equal to 40° C. and lower than or equal to 400° C., or higher than or equal to 50° C. and lower than or equal to 500° C. flows in the deposition chamber, so that the pressure therein can be kept to be greater than or equal to 0.1 Pa and less than or equal to 10 kPa, preferably greater than or equal to 1 Pa and less than or equal to 1 kPa, further preferably greater than or equal to 5 Pa and less than or equal to 100 Pa in the time range of 1 minute to 300 minutes, preferably 5 minutes to 120 minutes. After that, the inside of the deposition chamber is evacuated for longer than or equal to 5 minutes and shorter than or equal to 300 minutes, preferably longer than or equal to 10 minutes and shorter than or equal to 120 minutes.

The rate of desorption of the adsorbate can be further increased also by dummy deposition. Here, the dummy deposition refers to deposition on a dummy substrate by sputtering or the like, in which a film is formed on the dummy substrate and the inner wall of the deposition chamber so that impurities in the deposition chamber and an adsorbate on the inner wall of the deposition chamber are confined in the film. For a dummy substrate, a substrate which releases a smaller amount of gas is preferably used and for example, a substrate similar to a substrate 100 described later may be used. By performing dummy deposition, impurity concentration in a film to be formed can be reduced. Note that the dummy deposition may be performed at the same time as the baking of the deposition chamber.

When an oxide semiconductor layer is formed with the use of the above deposition apparatus, the mixing of impurities into the oxide semiconductor layer can be suppressed. Further, when a film in contact with the oxide semiconductor layer is formed with use of the above deposition apparatus, the mixing of impurities into the oxide semiconductor layer from the film in contact therewith can be prevented.

Next, a method for depositing the oxide layer 136a to be the oxide layer 106a, the oxide semiconductor layer 136b to be the oxide semiconductor layer 106b, and the oxide layer 136c to be the oxide layer 106c using the above deposition apparatus is described.

The oxide layer 136a is deposited. The oxide layer 136a is formed in an oxygen gas atmosphere at a substrate heating temperature of higher than or equal to room temperature (25° C.) and lower than or equal to 600° C., preferably higher than or equal to 70° C. and lower than or equal to 550° C., further preferably higher than or equal to 100° C. and lower than or equal to 500° C. As the substrate heating temperature at the time of the deposition is higher, the concentration of impurities in the oxide layer 136a becomes lower. Further, migration of sputtered particles on a deposition surface is likely to occur; therefore, the atomic arrangement is ordered and the density is increased, so that the crystallinity of the oxide layer 136a is high. Furthermore, when the deposition is performed in an oxygen gas atmosphere, plasma damage is alleviated and a surplus atom such as a rare gas atom is not contained, whereby the oxide layer 136a with high crystallinity is deposited. Note that the deposition may be performed in a mixed atmosphere including an oxygen gas and a rare gas. In that case, the percentage of an oxygen gas is set to be greater than or equal to 30 vol. %, preferably greater than or equal to 50 vol. %, further preferably greater than or equal to 80 vol. %. The oxide layer 136a is formed after the following steps: a substrate is transferred to the deposition chamber; a deposition gas is introduced; the deposition pressure is set to 0.8 Pa or lower, preferably 0.4 Pa or lower; and the deposition pressure is kept for longer than or equal to 10 seconds and shorter than or equal to 1000 seconds, preferably longer than or equal to 15 seconds and shorter than or equal to 720 seconds to be stabilized. Since the deposition pressure is kept for the above period of time to be stabilized, the amount of impurities entering the oxide layer 136a during the deposition can be reduced. However, since the oxide layer 136a may have an amorphous structure, a low temperature of lower than 70° C. and a percentage of an oxygen gas of less than 30 vol. % may be intentionally employed in the deposition.

Next, the oxide semiconductor layer 136b is deposited. The surface temperature of the target is set to lower than or equal to 100° C., preferably lower than or equal to 50° C., further preferably about room temperature (typically, 20° C. or 25° C.). In a sputtering apparatus for a large substrate, a target having a large area is often used. However, it is difficult to form a target for a large substrate without a juncture. In fact, although to obtain a large shape a plurality of targets are arranged so that there is as little space as possible therebetween, a slight space is inevitably generated. When the surface temperature of the target increases, in some cases, Zn or the like is volatilized from such a slight space, and the space might be expanded gradually. When the space expands, a metal of a backing plate or a metal used for adhesion might be sputtered and cause an increase in impurity concentration. Thus, it is preferable that the target be cooled sufficiently.

Specifically, for the backing plate, a metal having high conductivity and a high heat dissipation property (specifically Cu) is used. The target can be cooled efficiently by making a sufficient amount of cooling water flow through a water channel which is formed in the backing plate. Here, the sufficient amount of cooling water, which depends on the size of the target, is set to greater than or equal to 3 L/min, greater than or equal to 5 L/min, or greater than or equal to 10 L/min in the case of, for example, a circular target whose diameter is 300 mm.

The oxide semiconductor layer 136b is formed in an oxygen gas atmosphere at a substrate heating temperature of higher than or equal to 100° C. and lower than or equal to 600° C., preferably higher than or equal to 150° C. and lower than or equal 550° C., and further preferably higher than or equal to 200° C. and lower than or equal 500° C. As the heating temperature during the deposition is higher, the impurity concentration in the oxide semiconductor layer 136b is lower. Further, migration of sputtered particles on a deposition surface is likely to occur; therefore, the atomic arrangement in the oxide semiconductor layer 136b is ordered and the density thereof is increased, so that the crystallinity of the oxide semiconductor layer 136b is increased. Furthermore, when the deposition is performed in an oxygen gas atmosphere, plasma damage is alleviated and a surplus atom such as a rare gas atom is not contained, whereby the oxide semiconductor layer 136b with high crystallinity is formed. Note that the deposition may be performed in a mixed atmosphere of an oxygen gas and a rare gas. In that case, the percentage of the oxygen gas is higher than or equal to 30 vol. %, preferably higher than or equal to 50 vol. %, further preferably higher than or equal to 80 vol. %.

Note that in the case where the target includes Zn, plasma damage is alleviated by the deposition in an oxygen gas atmosphere; thus, the oxide semiconductor layer 136b in which Zn is unlikely to be volatilized can be obtained.

The oxide semiconductor layer 136b is formed after the following steps: a substrate is transferred to the deposition chamber; a deposition gas is introduced; the deposition pressure is set to 0.8 Pa or lower, preferably 0.4 Pa or lower; and the deposition pressure is kept for longer than or equal to 10 seconds and shorter than or equal to 1000 seconds, preferably longer than or equal to 15 seconds and shorter than or equal to 720 seconds to be stabilized. Since the deposition pressure is kept for the above period of time to be stabilized, the amount of impurities entering the oxide semiconductor layer 136b during the deposition can be reduced. At this time, the distance between the target and the substrate is less than or equal to 40 mm, preferably less than or equal to 25 mm. When the oxide semiconductor layer 136b is deposited under such a condition, the frequency of the collision between a sputtered particle and another sputtered particle, a gas molecule, or an ion can be reduced. That is, depending on the deposition pressure, the distance between the target and the substrate is made shorter than the mean free path of a sputtered particle, a gas molecule, or an ion, so that the concentration of impurities to be mixed into the film can be reduced.

For example, when the pressure is 0.4 Pa and the temperature is 25° C. (the absolute temperature is 298 K), a hydrogen molecule ($H_2$) has a mean free path of 48.7 mm, a helium atom (He) has a mean free path of 57.9 mm, a water molecule ($H_2O$) has a mean free path of 31.3 mm, an methane molecule ($CH_4$) has a mean free path of 13.2 mm, a neon atom (Ne) has a mean free path of 42.3 mm, a nitrogen molecule ($N_2$) has a mean free path of 23.2 mm, a carbon monoxide molecule (CO) has a mean free path of 16.0 mm, an oxygen molecule ($O_2$) has a mean free path of 26.4 mm, an argon atom (Ar) has a mean free path of 28.3 mm, a carbon dioxide molecule ($CO_2$) has a mean free path of 10.9 mm, a krypton atom (Kr) has a mean free path of 13.4 mm, and a xenon atom (Xe) has a mean free path of 9.6 mm Note that doubling of the pressure halves a mean free path and doubling of the absolute temperature doubles a mean free path.

The mean free path depends on pressure, temperature, and the diameter of a molecule (atom). In the case where pressure and temperature are constant, as the diameter of a molecule (atom) is larger, the mean free path is shorter. Note that the diameters of the molecules (atoms) are as follows: $H_2$: 0.218 nm; He: 0.200 nm; $H_2O$: 0.272 nm; $CH_4$: 0.419 nm; Ne: 0.234 nm; $N_2$: 0.316 nm; CO: 0.380 nm; $O_2$: 0.296 nm; Ar: 0.286 nm; $CO_2$: 0.460 nm; Kr: 0.415 nm; and Xe: 0.491 nm.

Thus, as the diameter of a molecule (atom) is larger, the mean free path is shorter and the degree of crystallinity is lowered due to the large diameter of the molecule (atom) when the molecule (atom) enters the film. For this reason, it can be said that, for example, a molecule (atom) whose diameter is larger than that of Ar is likely to behave as an impurity.

The oxide layer 136c is deposited. The oxide layer 136c is formed in an oxygen gas atmosphere at a substrate heating temperature of higher than or equal to room temperature (25° C.) and lower than or equal to 600° C., preferably higher than or equal to 70° C. and lower than or equal to 550° C., further preferably higher than or equal to 100° C. and lower than or equal to 500° C. As the substrate heating temperature at the time of the deposition is higher, the concentration of impurities in the oxide layer 136c becomes lower. Further, migration of sputtered particles on a deposition surface is likely to occur; therefore, the atomic arrangement is ordered and the density is increased, so that the crystallinity of the oxide layer 136c is high. Furthermore, when the deposition is performed in an oxygen gas atmosphere, plasma damage is alleviated and a surplus atom such as a rare gas atom is not contained, whereby the oxide layer 136c with high crystallinity is deposited. Note that the deposition may be performed in a mixed atmosphere including an oxygen gas and a rare gas. In that case, the percentage of an oxygen gas is set to be greater than or equal to 30 vol. %, preferably greater than or equal to 50 vol. %, further preferably greater than or equal to 80 vol. %. The oxide layer 136c is formed after the following steps: a substrate is transferred to the deposition chamber; a deposition gas is introduced; the deposition pressure is set to 0.8 Pa or lower, preferably 0.4 Pa or lower; and the deposition pressure is kept for longer than or equal to 10 seconds and shorter than or equal to 1000 seconds, preferably longer than or equal to 15 seconds and shorter than or equal to 720 seconds to be stabilized. Since the deposition pressure is kept for the above period of time to be stabilized, the amount of impurities entering the oxide layer 136c during the deposition can be reduced.

Next, heat treatment is performed. The heat treatment is performed under reduced pressure or in an inert atmosphere or an oxidation atmosphere. By the heat treatment, the impurity concentration in the oxide semiconductor layer 136b can be reduced.

The heat treatment is preferably performed in a manner such that after heat treatment is performed under reduced pressure or in an inert atmosphere, the atmosphere is switched to an oxidation atmosphere with the temperature maintained and heat treatment is further performed. When the heat treatment is performed under reduced pressure or in an inert atmosphere, the impurity concentration in the oxide semiconductor layer 136b can be reduced; however, oxygen vacancies are generated at the same time. By the heat treatment in an oxidation atmosphere, the generated oxygen vacancies can be reduced.

When heat treatment is performed on the oxide semiconductor layer 136b in addition to the substrate heating during the deposition, the impurity concentration in the film can be reduced.

Specifically, the concentration of hydrogen in the oxide semiconductor layer 136b, which is measured by SIMS, can be set to lower than or equal to $2 \times 10^{20}$ atoms/$cm^3$, preferably lower than or equal to $5 \times 10^{19}$ atoms/$cm^3$, further preferably lower than or equal to $1 \times 10^{19}$ atoms/$cm^3$, still further preferably lower than or equal to $5 \times 10^{18}$ atoms/$cm^3$.

The concentration of nitrogen in the oxide semiconductor layer 136b, which is measured by SIMS, can be set to lower than $5 \times 10^{19}$ atoms/$cm^3$, preferably lower than or equal to $5 \times 10^{18}$ atoms/$cm^3$, further preferably lower than or equal to $1 \times 10^{18}$ atoms/$cm^3$, still further preferably lower than or equal to $5 \times 10^{17}$ atoms/$cm^3$.

The concentration of carbon in the oxide semiconductor layer 136b, which is measured by SIMS, can be set to lower than $5 \times 10^{19}$ atoms/$cm^3$, preferably lower than or equal to $5 \times 10^{18}$ atoms/$cm^3$, further preferably lower than or equal to $2 \times 10^{18}$ atoms/$cm^3$, still further preferably lower than or equal to $5 \times 10^{17}$ atoms/$cm^3$.

The amount of each of the following gas molecules (atoms) released from the oxide semiconductor layer 136b can be less than or equal to $1 \times 10^{19}$/$cm^3$, preferably less than or equal to $1 \times 10^{18}$/$cm^3$ or less, which is measured by TDS analysis: a gas molecule (atom) having a mass-to-charge ratio (m/z) of 2 (e.g., hydrogen molecule), a gas molecule (atom) having a mass-to-charge ratio (m/z) of 18, a gas molecule (atom) having a mass-to-charge ratio (m/z) of 28, and a gas molecule (atom) having a mass-to-charge ratio (m/z) of 44.

Description of a measurement method of the amount of released oxygen atoms, which is described later, is referred to for a measurement method of the release amount using TDS analysis.

The oxide semiconductor layer 136b and the oxide layer 136c are deposited as described above, whereby the crystallinity of the oxide semiconductor layer 136b can be increased, and the concentrations of impurities in the oxide semiconductor layer 136b and the oxide layer 136c and at the interface between the oxide semiconductor layer 136b and the oxide layer 136c can be reduced.

Although the oxide layers and the oxide semiconductor layer of one embodiment of the present invention can be deposited by a sputtering method, such layers may be deposited by another method, e.g., a thermal CVD method that is one of CVD methods. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that the pressure in a deposition chamber is set to an atmospheric pressure or a reduced pressure and a source gas and an oxidizer are supplied to the deposition chamber at a time and react with each other in the vicinity of the substrate or over the substrate in the deposition chamber.

Deposition by an ALD method may be performed in such a manner that the pressure in a deposition chamber is set to an atmospheric pressure or a reduced pressure, source gases for reaction are sequentially introduced into the deposition chamber, and then the sequence of the gas introduction is repeated. For example, two or more kinds of source gases are sequentially supplied to the deposition chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetitions times of the sequence of the gas introduction; therefore, an ALD method makes it possible to accurately adjust a thickness and thus is suitable for manufacturing a minute FET.

The oxide layers and the oxide semiconductor layer which are described above can be deposited by a thermal CVD method such as a MOCVD method or an ALD method. For example, in the case where an In—Ga—Zn oxide film is deposited, trimethylindium, trimethylgallium, and diethylzinc are used. Note that the chemical formula of trimethylindium is $(CH_3)_3In$. The chemical formula of trimethylgallium is $(CH_3)_3Ga$. The chemical formula of diethylzinc is $(CH_3)_2Zn$. Without limitation to the above combination, triethylgallium (chemical formula: $(C_2H_5)_3Ga$) can be used instead of trimethylgallium and dimethylzinc (chemical formula: $(C_2H_5)_2Zn$) can be used instead of diethylzinc.

For example, an oxide semiconductor film, e.g., an In—Ga—Zn oxide film is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are introduced at a time to form a Ga—O layer, and then a $Zn(CH_3)_2$ gas and an $O_3$ gas are introduced at a time to form a Zn—O layer. Note that the order of these layers is not limited to this example. A mixed compound layer such as an In—Ga—O layer, an In—Zn—O layer, a Ga—In—O layer, a Zn—In—O layer or a Ga—Zn—O layer may be formed by mixing of these gases. Note that although an $H_2O$ gas which is bubbled with an inert gas such as Ar may be used instead of an $O_3$ gas, it is preferable to use an $O_3$ gas, which does not contain H. Further, instead of an $In(GH_3)_3$ gas, an $In(C_2H_5)_3$ gas may be used. Instead of a $Ga(CH_3)_3$ gas, a $Ga(C_2H_5)_3$ gas may be used. Instead of an $In(CH_3)_3$ gas, an $In(C_2H_5)_3$ may be used. Furthermore, a $Zn(CH_3)_2$ gas may be used.

<2. Transistor>

A transistor including the multilayer film 106 in which a channel is formed in the oxide semiconductor layer 106b is described below.

<2-1. Transistor Structure (1)>

In this section, a top-gate transistor is described.

<2-1-1. Transistor Structure (1-1)>

Here, a top-gate top-contact (TGTC) structure transistor, which is one kind of top-gate transistor, is described with reference to FIGS. 21A to 21D.

Figure 21A:
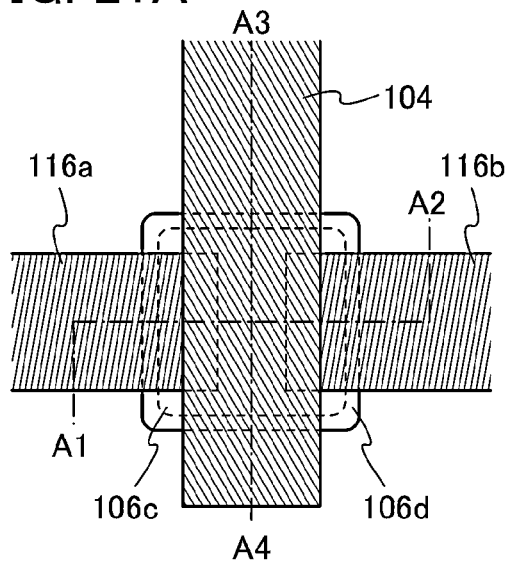
FIGS. 21A to 21D are a top view and cross-sectional views illustrating a semiconductor device of one embodiment of the present invention.
Figure 21C:
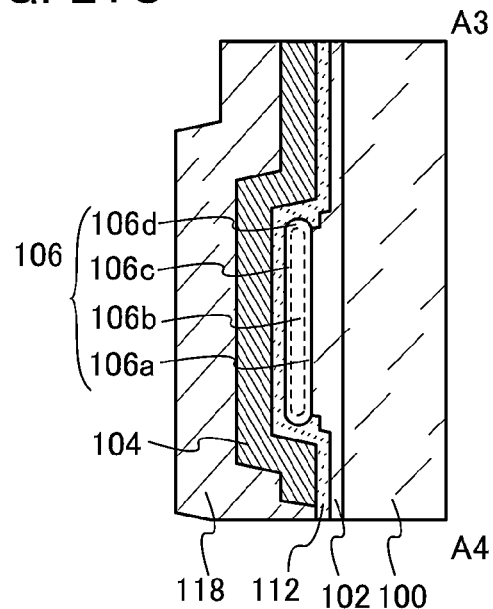
Figure 21B:
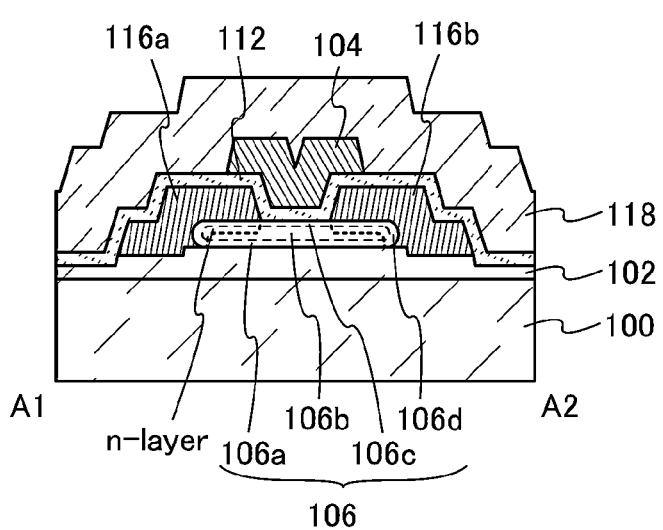
Figure 21D:
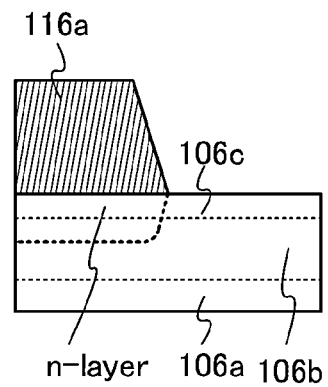

FIGS. 21A to 21D are a top view and cross-sectional views of the TGTC transistor. FIG. 21A is the top view of the transistor. FIG. 21B is the cross-sectional view taken along dashed-dotted line A1-A2 in FIG. 21A. FIG. 21D is an enlarged view of the vicinity of the source electrode 116a and the multilayer film 106 in FIG. 21B. FIG. 21C is the cross-sectional view taken along dashed-dotted line A3-A4 in FIG. 21A.

The transistor illustrated in FIG. 21B includes the base insulating film 102 provided over the substrate 100; the multilayer film 106 including the oxide layer 106a provided over the base insulating film 102, the oxide semiconductor layer 106b provided over the oxide layer 106a, the oxide layer 106c provided over the oxide semiconductor layer 106b, and the oxide layer 106d provided in contact with at least the side surface of the oxide semiconductor layer 106b; the source electrode 116a and a drain electrode 116b provided over the base insulating film 102 and the multilayer film 106; a gate insulating film 112 provided over the multilayer film 106, the source electrode 116a, and the drain electrode 116b; a gate electrode 104 provided over the gate insulating film 112; and a protective insulating film 118 provided over the gate insulating film 112 and the gate electrode 104. Note that the transistor does not necessarily include the base insulating film 102 and/or the protective insulating film 118.

Note that depending on the kind of a conductive film used for the source electrode 116a and the drain electrode 116b, oxygen might be removed from part of the multilayer film 106 or a mixed layer (a layer formed in such a manner that a metal element that is a main component of the conductive film is mixed into the multilayer film 106) might be formed, so that a source region and a drain region might be formed between a channel and the source and drain electrodes 116a and 116b in the multilayer film 106. The source region and the drain region are each denoted as an "n-layer" with a dotted line in FIG. 21B.

A channel formation region in the transistor illustrated in FIGS. 21A to 21D is part of the multilayer film 106 which is located between the source electrode 116a and the drain electrode 116b and overlaps with the gate electrode 104. Here, a main path of current flowing in the oxide semiconductor layer 106b is referred to as the channel.

As illustrated in FIG. 21C, the oxide layer 106d is provided on the side surface of the oxide semiconductor layer 106b including the channel of the transistor. If the protective film is not provided on the side surface of the oxide semiconductor layer 106b, oxygen vacancies or the like easily occur and the impurity concentration becomes high in the side surface. When many oxygen vacancies or impurities exist in the side surface, a second transistor having a different threshold voltage seems to be formed at the side in some cases, which leads to electrical characteristic variation of the transistor. Since the oxide layer 106d protects the side surface of the oxide semiconductor layer 106b in the transistor in FIGS. 21A to 21D, oxygen vacancies do not occur in the side surface and the impurity concentration of the side surface are not increased. Therefore, the transistor can have sable electric characteristics.

In FIG. 21C, the base insulating film 102 includes three regions having different thicknesses. Specifically, among the three regions, a first region which is in contact with the oxide layer 106a has the largest thickness, a second region which is the same as the periphery of the oxide layer 106d (see FIG. 21A) or is located outside the periphery of the oxide layer 106d has the second largest thickness, and a third region which is located outside the second region has the smallest thickness.

Figure 22A:
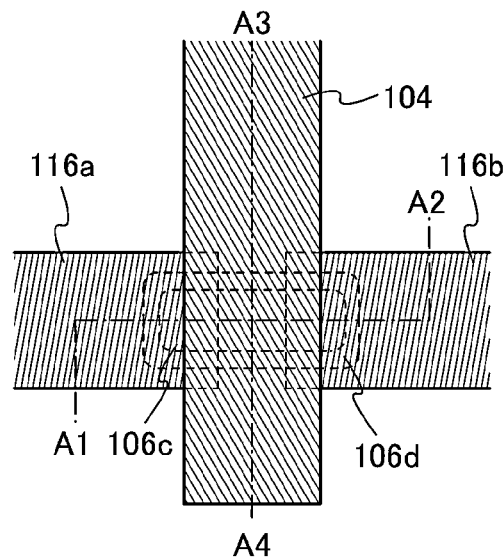
FIGS. 22A to 22C are a top view and cross-sectional views illustrating a semiconductor device of one embodiment of the present invention.
Figure 22C:
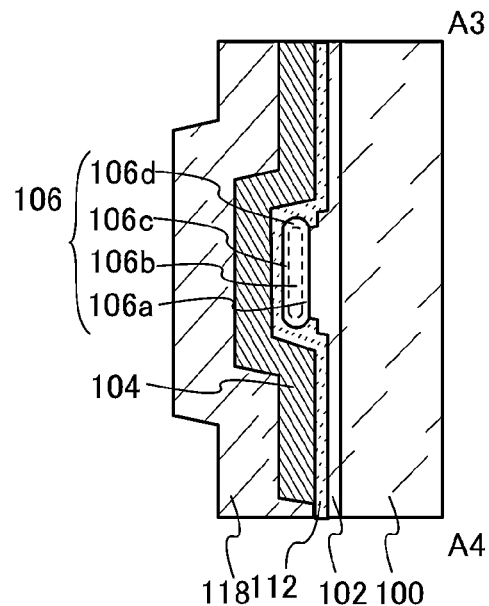
Figure 22B:
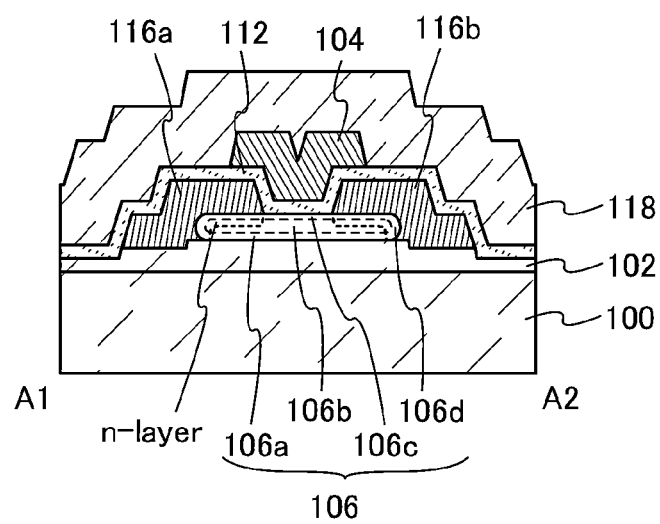

Note that as in the transistor illustrated in FIGS. 22A to 22C, the multilayer film 106 may be provided within the width of the source electrode 116a and the drain electrode 116b (the length in the channel width direction). In the transistor illustrated in FIGS. 22A to 22C, the multilayer film 106 is shielded from light by the gate electrode 104, the source electrode 116a, the drain electrode 116b, and the like, and thus a change in electrical characteristics due to light is not likely occur.

For the multilayer film 106, the description in the above section of the multilayer film 106 is referred to. The transistor in FIGS. 21A to 21D is a transistor in which the channel is formed in the oxide semiconductor layer 106b in the multilayer film 106. The oxide semiconductor layer 106b has a wide band gap and is substantially intrinsic. Therefore, the transistor in FIGS. 21A to 21D has extremely small leakage current (also referred to as small off-state current) when the transistor is off. Specifically, in a transistor having a channel length of 3 μm and a channel width of 10 μm, the off-state current can be lower than $1 \times 10^{-20}$ A, preferably lower than $1 \times 10^{-22}$ A, further preferably lower than $1 \times 10^{-24}$ A. That is, the on/off ratio of the transistor can be greater than or equal to 15 digits and less than or equal to 50 digits, preferably greater than or equal to 20 digits and less than or equal to 50 digits, further preferably greater than or equal to 20 digits and less than or equal to 150 digits.

Since the oxide layer 106d having a curved surface is provided on the side surface of the multilayer film 106 as part of the multilayer film 106 and the base insulating film 102 including the three regions having different thicknesses is provided in the transistor illustrated in FIGS. 21A to 21D, step coverage with a film formed over the multilayer film 106 is increased and a crack of the film and generation of a cavity are prevented. Accordingly, the entry of impurities from the outside due through a crack of a film or a cavity is not caused, so that the transistor having stable electrical characteristics can be obtained.

There is no particular limitation on the substrate 100. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 100. Still alternatively, any of these substrates further provided with a semiconductor element may be used as the substrate 100.

In the case where a large glass substrate such as the 5th generation (1000 mm×1200 mm or 1300 mm×1500 mm), the 6th generation (1500 mm×1800 mm), the 7th generation (1870 mm×2200 mm), the 8th generation (2200 mm×2500 mm), the 9th generation (2400 mm×2800 mm), or the 10th generation (2880 mm×3130 mm) is used as the substrate 100, minute processing is sometimes difficult due to shrinkage of the substrate 100 caused by heat treatment or the like in a manufacturing process of a semiconductor device. Therefore, in the case where the above-described large glass substrate is used as the substrate 100, a substrate which is unlikely to shrink through the heat treatment is preferably used. For example, as the substrate 100, it is possible to use a large glass substrate in which the amount of shrinkage after heat treatment which is performed for an hour at 400° C., preferably 450° C., more preferably 500° C. is less than or equal to 10 ppm, preferably less than or equal to 5 ppm, more preferably less than or equal to 3 ppm.

Further alternatively, a flexible substrate may be used as the substrate 100. Note that as a method for forming a transistor over a flexible substrate, there is also a method in which, after a transistor is formed over a non-flexible substrate, the transistor is separated from the non-flexible substrate and transferred to the substrate 100 which is a flexible substrate. In that case, a separation layer is preferably provided between the non-flexible substrate and the transistor.

The base insulating film 102 may be formed with a single layer or a stack of layers using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

For example, the base insulating film 102 is a multilayer film including a silicon nitride layer as a first layer and a silicon oxide layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in ESR is less than or equal to $3 \times 10^{17}$ spins/cm$^3$, preferably less than or equal to $5 \times 10^{16}$ spins/cm$^3$ is used. As the silicon oxide layer, a silicon oxide layer containing excess oxygen is used. As the silicon nitride layer, a silicon nitride layer from which hydrogen and ammonia are less likely to be released is used. The amount of discharge of hydrogen or ammonia may be measured by TDS. Further, as the silicon nitride layer, a silicon nitride layer which does not transmit or hardly transmits oxygen is used.

Note that the excess oxygen refers to oxygen which can move in an oxide layer, an oxide semiconductor layer, a silicon oxide layer, a silicon oxynitride layer, and the like by heat treatment; oxygen contained in excess of the stoichiometric composition; or oxygen which has a function of entering oxygen vacancies to reduce the oxygen vacancies.

The silicon oxide layer containing excess oxygen means a silicon oxide layer from which oxygen can be released by heat treatment or the like. An insulating film containing excess oxygen means an insulating film from which oxygen is released by heat treatment.

Here, a film from which oxygen is released by heat treatment may release oxygen, the amount of which is higher than or equal to $1 \times 10^{18}$ atoms/cm$^3$, higher than or equal to $1 \times 10^{19}$ atoms/cm$^3$, or higher than or equal to $1 \times 10^{20}$ atoms/cm$^3$ in TDS analysis (converted into the number of oxygen atoms).

Here, a method to measure the amount of released oxygen using TDS analysis is described.

The total amount of released gas from a measurement sample in TDS is proportional to the integral value of the ion intensity of the released gas. Then, a comparison with a reference sample is made, whereby the total amount of released gas can be calculated.

For example, the number of released oxygen molecules ($N_{O2}$) from a measurement sample can be calculated according to Formula (2) using the TDS results of a silicon wafer containing hydrogen at a predetermined density, which is the reference sample, and the TDS results of the measurement sample. Here, all gases having a mass number of 32 which are obtained in the TDS analysis are assumed to originate from an oxygen molecule. $CH_3OH$, which is given as a gas having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2} = \frac{N_{H2}}{S_{H2}} \times S_{O2} \times \alpha \quad \text{[Formula 2]}$$

$N_{H2}$ is the value obtained by conversion of the number of hydrogen molecules desorbed from the standard sample into densities. $S_{H2}$ is the integral value of ion intensity when the standard sample is subjected to TDS analysis. Here, the reference value of the standard sample is set to $N_{H2}/S_{H2}$. $S_{O2}$ is the integral value of ion intensity when the measurement sample is analyzed by TDS. $\alpha$ is a coefficient affecting the ion intensity in the TDS analysis. Refer to Japanese Published Patent Application No. H6-275697 for details of Formula (2). Note that the amount of released oxygen was measured with a thermal desorption spectroscopy apparatus produced by ESCO Ltd., EMD-WA1000S/W using a silicon wafer containing hydrogen atoms at $1 \times 10^{16}$ atoms/cm$^2$ as the standard sample.

Further, in the TDS analysis, oxygen is partly detected as an oxygen atom. The ratio between oxygen molecules and oxygen atoms can be calculated from the ionization rate of the oxygen molecules. Note that, since the above $\alpha$ includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen when converted into oxygen atoms is twice the number of the released oxygen molecules.

Further, the film from which oxygen is released by heat treatment may contain a peroxide radical. Specifically, the spin density attributed to a peroxide radical is $5 \times 10^{17}$ spins/cm$^3$ or higher. Note that the film containing a peroxide radical may have an asymmetric signal at a g-factor of around 2.01 generated in ESR.

The insulating film containing excess oxygen may be formed using oxygen-excess silicon oxide ($SiO_x$ (X>2)). In the oxygen-excess silicon oxide ($SiO_x$ (X>2)), the number of oxygen atoms per unit volume is more than twice the number of silicon atoms per unit volume. The number of silicon atoms and the number of oxygen atoms per unit volume are measured by Rutherford backscattering spectrometry (RBS).

The source electrode 116a and the drain electrode 116b may be formed using a single layer or a stacked layer of a conductive film containing one or more kinds of aluminum, titanium, chromium, cobalt, nickel, copper, yttrium, zirconium, molybdenum, ruthenium, silver, tantalum, and tungsten. Note that the source electrode 116a and the drain electrode 116b may have the same composition or different compositions.

The gate insulating film 112 may be formed using a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The gate insulating film 112 may be, for example, a multilayer film including a silicon nitride layer as a first layer and a silicon oxide layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in electron spin resonance (ESR) is less than or equal to $3 \times 10^{17}$ spins/cm$^3$, preferably less than or equal to $5 \times 10^{16}$ spins/cm$^3$ is used. As the silicon oxide layer, a silicon oxide layer having excess oxygen is preferably used. As the silicon nitride layer, a silicon nitride layer from which hydrogen and ammonia are less likely to be released is used. The amount of discharge of hydrogen or ammonia may be measured by TDS.

The gate insulating film 112 has an optimal thickness depending on the shapes of the oxide layer 106a and the base insulating film 102. Here, the thickness of the oxide layer 106a is represented by $H_{S1}$, a difference in thickness between the second region and the third region of the base insulating film 102 is represented by $H_{O1}$, and a difference in thickness between the first region and the second region is represented by $H_{O2}$. In this case, the thickness of the gate insulating film 112 is greater than or equal to $H_{S1}$, preferably greater than or equal to $(H_{S1}+H_{O2})$, further preferably greater than or equal to $(H_{S1}+H_{O2}+H_{O1})$. The thickness of the gate insulating film 112 is less than or equal to 100 nm, preferably less than or equal to 50 nm, further preferably less than or equal to 30 nm, still further preferably less than or equal to 20 nm. By setting the thickness of the gate insulating film 112 within the above range, an electric field can be applied from the gate electrode 104 to the oxide semiconductor layer 106b through the oxide layer 106d; therefore, speedy switching between on and off of the transistor is performed, so that the transistor can operate at high speed.

The gate electrode 104 may be formed using a single layer or a stacked layer of a conductive film containing one or more kinds of aluminum, titanium, chromium, cobalt, nickel, copper, yttrium, zirconium, molybdenum, ruthenium, silver, tantalum, and tungsten.

Note that the structure is not limited to that illustrated in FIG. 21A in which the edge of the multilayer film 106 is located on the outsider side of the gate electrode 104, and a structure in which the edge of the multilayer film 106 is located on the inner side of the gate electrode 104 may be employed. With such a structure, when light irradiation is performed from the substrate 100 side, generation of carriers in the multilayer film 106 due to light can be prevented.

Note that although the edge of the multilayer film 106 is located on the outer side of the gate electrode 104 in FIG. 21A, the edge of the multilayer film 106 may be located on the inner side of the gate electrode 104 to prevent generation of carriers in the multilayer film 106 due to light.

The protective insulating film 118 may be formed using a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The protective insulating film 118 may be, for example, a multi-layer film including a silicon oxide layer as a first layer and a silicon nitride layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in ESR is less than or equal to $3 \times 10^{17}$ spins/cm$^3$, preferably less than or equal to $5 \times 10^{16}$ spins/cm$^3$ is used. As the silicon nitride layer, a silicon nitride layer from which hydrogen and ammonia are less likely to be released is used. The amount of discharge of hydrogen or ammonia may be measured by TDS. Further, as the silicon nitride layer, a silicon nitride layer which does not transmit or hardly transmits oxygen is used.

Alternatively, the protective insulating film 118 may be, for example, a multilayer film including a first silicon oxide layer as a first layer, a second silicon oxide layer as a second layer, and a silicon nitride layer as a third layer. In that case, the first silicon oxide layer and/or the second silicon oxide layer may be a silicon oxynitride layer. In addition, the silicon nitride layer may be a silicon nitride oxide layer. As the first silicon oxide layer, a silicon oxide layer whose defect density is low is preferably used. Specifically, a silicon oxide layer whose spin density attributed to a signal with a g factor of 2.001 in ESR is less than or equal to $3 \times 10^{17}$ spins/cm$^3$, preferably less than or equal to $5 \times 10^{16}$ spins/cm$^3$ is used. As the second silicon oxide layer, a silicon oxide layer having excess oxygen is used. As the silicon nitride layer, a silicon nitride layer from which hydrogen and ammonia are less likely to be released is used. Further, as the silicon nitride layer, a silicon nitride layer which does not transmit or hardly transmits oxygen is used.

In the case where at least one of the base insulating film 102, the gate insulating film 112, and the protective insulating film 118 is the insulating film containing excess oxygen, oxygen vacancies in the oxide semiconductor layer 106b can be reduced owing to the excess oxygen.

In the above-described transistor, the channel is formed in the oxide semiconductor layer 106b of the multi-layer film 106; thus, the transistor has stable electrical characteristics and a high field-effect mobility. Since the oxide layer 106d having a curved surface is provided on the side surface of the multilayer film 106 as part of the multilayer film 106, and the base insulating film 102 including the three regions having different thicknesses is provided in the transistor, step coverage with a film formed over the multilayer film 106 is increased, so that the transistor has more stable electrical characteristics.

Figure 23A:
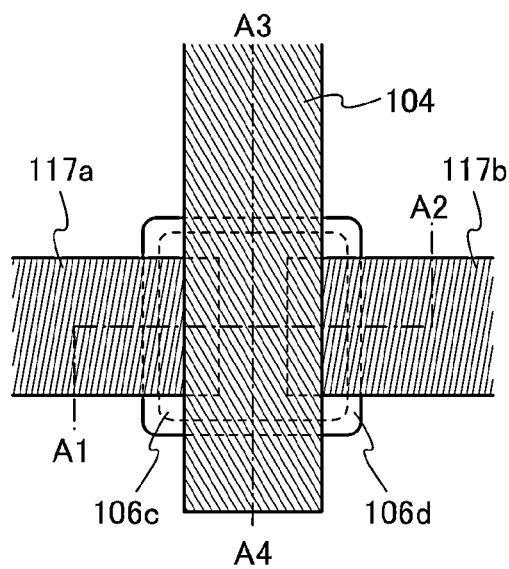
FIGS. 23A to 23C are a top view and cross-sectional views illustrating a semiconductor device of one embodiment of the present invention.
Figure 23C:
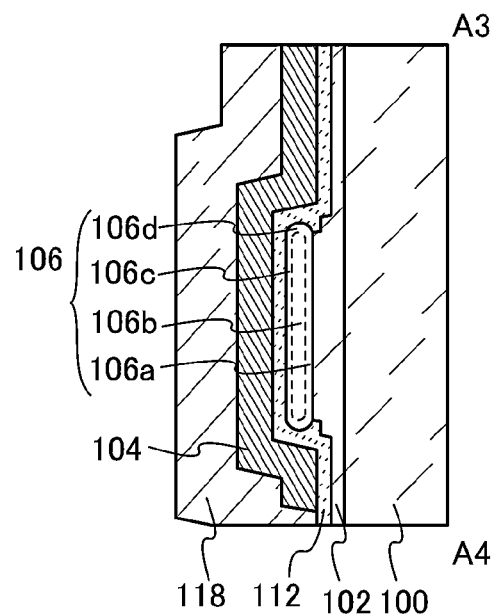
Figure 23B:
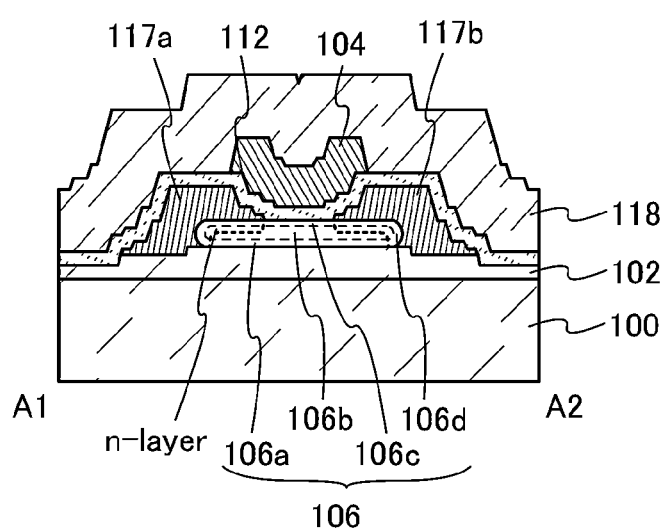

FIGS. 23A to 23C illustrate a transistor which includes different source and drain electrodes from the transistor in FIGS. 21A to 21D.

In FIGS. 23A to 23C, a source electrode 117a and a drain electrode 117b are provided instead of the source electrode 116a and the drain electrode 116b.

Note that the source electrode 117a and the drain electrode 117b have steps at their edges, and thus step coverage with the gate insulating film 112 or the like is high, so that leakage current generated between the gate electrode 104 and the source and drain electrodes 117a and 117b can be reduced.

Note that the source electrode 117a and the drain electrode 117b are each not limited to a single layer, but may have a stacked-layer structure. For example, when the first layer has a thickness of 50 nm or less, minute processing using an electron beam can be performed only on the first layer. Accordingly, the structure of the transistor in FIGS. 23A to 23C is more suitable for miniaturization than the structure of the transistor in FIGS. 21A to 21D.

The description of FIGS. 21A to 21D can be referred to for the other structures and thus description of the other structures is omitted.

<2-1-2. Manufacturing Method of Transistor Structure (1-1)>

Here, a method for manufacturing the transistor illustrated in FIGS. 21A to 21D is described with reference to FIGS. 24A to 24C and FIGS. 25A and 25B.

First, the substrate 100 is prepared.

Next, an insulating film to be the base insulating film 102 is formed.

Here, a case where the insulating film to be the base insulating film 102 has a three-layer structure is described. First, a silicon nitride layer is deposited. Next, a first silicon oxide layer is deposited. Then, treatment for adding oxygen ions to the silicon oxide layer may be performed. The treatment for adding oxygen ions may be performed with an ion doping apparatus or a plasma treatment apparatus. As the ion doping apparatus, an ion doping apparatus with a mass separation function may be used. As a source material of oxygen ions, an oxygen gas such as $^{16}O_2$ or $^{18}O_2$, a nitrous oxide gas, an ozone gas, or the like may be used. Next, a second silicon oxide layer is deposited, whereby the insulating film to be the base insulating film 102 is formed.

The silicon nitride layer is preferably deposited by a plasma CVD method. Specifically, the deposition is performed under conditions where the substrate temperature is higher than or equal to 180° C. and lower than or equal to 400° C., preferably higher than or equal to 200° C. and lower than or equal to 370° C.; a deposition gas containing silicon, a nitrogen gas, and an ammonia gas are used; the pressure is greater than or equal to 20 Pa and less than or equal to 250 Pa, preferably greater than or equal to 40 Pa and less than or equal to 200 Pa; and a high-frequency power is supplied.

Note that the flow rate of the nitrogen gas is greater than or equal to 5 times and less than or equal to 50 times, preferably greater than or equal to 10 times and less than or equal to 50 times the flow rate of the ammonia gas. Note that the ammonia gas can promote decomposition of the deposition gas containing silicon and the nitrogen gas. This is because the ammonia gas is dissociated by plasma energy and thermal energy, and energy generated by the dissociation contributes to decomposition of bonding of the deposition gas containing silicon and bonding of the nitrogen gas.

Accordingly, a silicon nitride layer which releases a small amount of a hydrogen gas and a small amount of an ammonia gas can be deposited according to the above method. Further, since the silicon nitride layer contains a small amount of hydrogen, the silicon nitride layer is dense and hydrogen, water, and oxygen do not penetrate or hardly penetrate the silicon nitride layer.

The first silicon oxide layer is preferably deposited by a plasma CVD method. Specifically, the deposition is performed under conditions where the substrate temperature is higher than or equal to 160° C. and lower than or equal to 350° C., preferably higher than or equal to 180° C. and lower than or equal to 260° C.; a deposition gas containing silicon and an oxidation gas are used; the pressure is greater than or equal to 100 Pa and less than or equal to 250 Pa, preferably greater than or equal to 100 Pa and less than or equal to 200 Pa; and a high-frequency power of higher than or equal to 0.17 W/cm$^2$ and lower than or equal to 0.5 W/cm², preferably higher than or equal to 0.25 W/cm² and lower than or equal to 0.35 W/cm² is supplied to electrodes.

By the above method, decomposition efficiency of the gas in plasma is increased, so that oxygen radicals are increased and oxidation of the gas proceeds; accordingly, the first silicon oxide layer which contains excess oxygen can be deposited.

The second silicon oxide layer is preferably deposited by a plasma CVD method, which is one kind of CVD method. Specifically, the deposition is performed under conditions where the substrate temperature is higher than or equal to 180° C. and lower than or equal to 400° C., preferably higher than or equal to 200° C. and lower than or equal to 370° C.; a deposition gas containing silicon and an oxidation gas are used; the pressure is greater than or equal to 20 Pa and less than or equal to 250 Pa, preferably greater than or equal to 40 Pa and less than or equal to 200 Pa; and a high-frequency power is supplied. Note that typical examples of the deposition gas containing silicon include silane, disilane, trisilane, and silane fluoride. Examples of the oxidation gas include oxygen, ozone, nitrous oxide, and nitrogen dioxide.

Note that when the flow rate of the oxidation gas is 100 times that of the deposition gas containing silicon, the hydrogen content of the second silicon oxide layer can be reduced and dangling bonds can be reduced.

In the above manner, the second silicon oxide layer with a low defect density is deposited. That is, a spin density of the second silicon oxide layer which is attributed to a signal with a g factor of 2.001 in ESR can be less than or equal to $3 \times 10^{17}$ spins/cm³, or less than or equal to $5 \times 10^{16}$ spins/cm³.

Next, the multilayer film 106 which includes the oxide layer 106a, the oxide semiconductor layer 106b provided over the oxide layer 106a, the oxide layer 106c provided over the oxide semiconductor layer 106b, and the oxide layer 106d provided in contact with at least the side surface of the oxide semiconductor layer 106b is formed. At this time, the insulating film to be the base insulating film 102 is partly etched to be the base insulating film 133 (see FIG. 24A). Descriptions of FIGS. 3A to 3C, FIGS. 4A to 4C, FIGS. 5A to 5B, FIGS. 6A to 6C and FIGS. 7A to 7C are referred to for formation methods of the base insulating film 133 and the multilayer film 106.

Then, a conductive film to be as the source electrode 116a and the drain electrode 116b is deposited. The conductive film to be the source electrode 116a and the drain electrode 116b may be formed using any of the conductive films given as examples of the source electrode 116a and the drain electrode 116b by a sputtering method, a chemical vapor deposition (CVD) method, a molecular beam epitaxy (MBE) method, an atomic layer deposition (ALD) method, or a pulsed laser deposition (PLD) method.

Figure 24A:
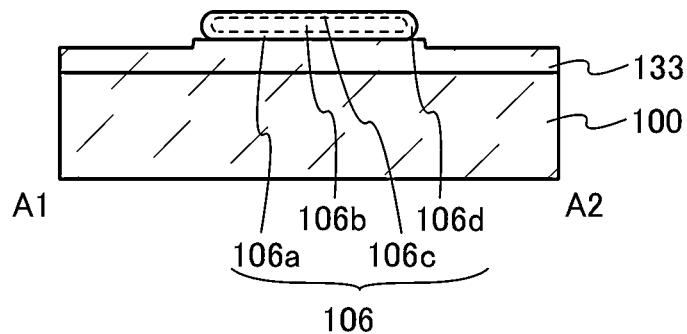
FIGS. 24A to 24C are cross-sectional views illustrating a method for manufacturing a semiconductor device of one embodiment of the present invention.
Figure 24B:
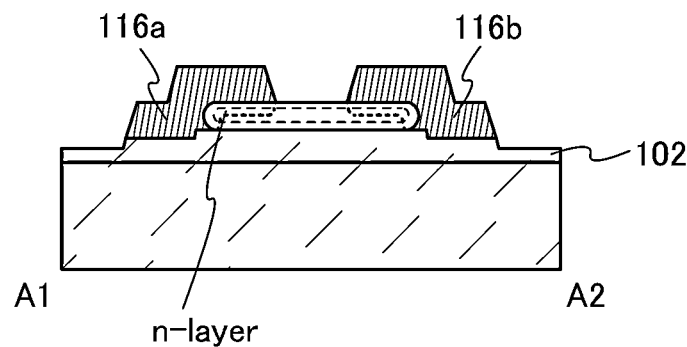

Then, the conductive film to be the source electrode 116a and the drain electrode 116b is partly etched, whereby the source electrode 116a and the drain electrode 116b are formed and the base insulating film 133 is partly etched to be the base insulating film 102 (see FIG. 24B). The base insulating film 102 is partly etched by two separate etching steps and thus includes three regions having different thicknesses.

Figure 24C:
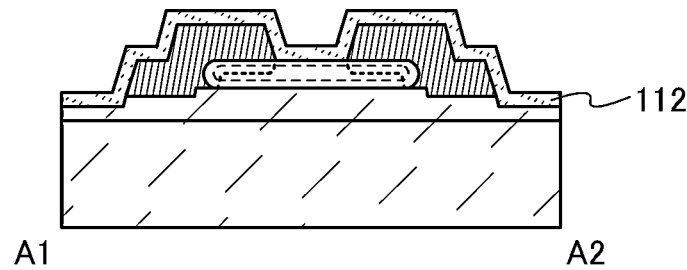

Next, the gate insulating film 112 is deposited (see FIG. 24C). The gate insulating film 112 may be formed using any of the above insulating films which can be used for the gate insulating film 112 by a sputtering method, a CVD method, an MBE method, an ALD method, or a PLD method. Since the oxide layer 106d having a curved surface is provided on the side surface of the multilayer film 106 as part of the multilayer film 106 and the base insulating film 102 has the three regions having different thicknesses, coverage with the gate insulating film 112 is high and thus a shape defect is not likely to occur.

Then, a conductive film to be the gate electrode 104 is formed. The conductive film to be the gate electrode 104 is formed using any of the conductive films described as the conductive films used as the gate electrode 104 by a sputtering method, a CVD method, an MBE method, an ALD method, or a PLD method.

Figure 25A:
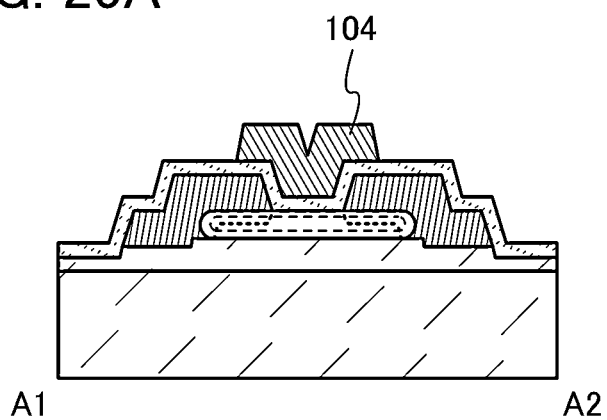
FIGS. 25A and 25B are cross-sectional views illustrating a manufacturing method of a semiconductor device of an embodiment of the present invention.

Next, the conductive film to be the gate electrode 104 is partly etched to form the gate electrode 104 (see FIG. 25A).

Figure 25B:
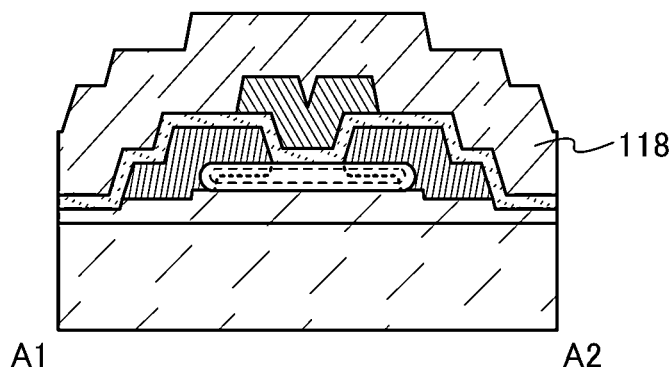

Next, the protective insulating film 118 is formed (see FIG. 25B). The protective insulating film 118 can be formed using an insulating film selected from the insulating films given as examples of the protective insulating film 118 and can be formed by a sputtering method, a CVD method, an MBE method, an ALD method, or a PLD method. Since the oxide layer 106d having a curved surface is provided on the side surface of the multilayer film 106 as part of the multilayer film 106 and the base insulating film 102 has the three regions having different thicknesses, coverage with the protective insulating film 118 is high and thus a shape defect is not likely to occur.

Here, the case where the protective insulating film 118 has a three-layer structure is described. First, a first silicon oxide layer is formed. Next, a second silicon oxide layer is formed. Then, treatment for adding oxygen ions to the second silicon oxide layer is preferably performed. The treatment for adding oxygen ions may be performed with an ion doping apparatus or a plasma treatment apparatus. As the ion doping apparatus, an ion doping apparatus with a mass separation function may be used. As a source material of oxygen ions, an oxygen gas such as $^{16}O_2$ or $^{18}O_2$, a nitrous oxide gas, an ozone gas, or the like may be used. Then, a silicon nitride layer is formed. In this manner, the protective insulating film 118 may be formed.

The first silicon oxide layer is preferably deposited by a plasma CVD method that is one kind of CVD method. Specifically, the deposition is performed under conditions where the substrate temperature is higher than or equal to 180° C. and lower than or equal to 400° C., preferably higher than or equal to 200° C. and lower than or equal to 370° C.; a deposition gas containing silicon and an oxidation gas are used; the pressure is higher than or equal to 20 Pa and lower than or equal to 250 Pa, preferably higher than or equal to 40 Pa and lower than or equal to 200 Pa; and a high-frequency power is supplied to electrodes. Note that typical examples of the deposition gas containing silicon include silane, disilane, trisilane, and silane fluoride. Examples of the oxidation gas include oxygen, ozone, nitrous oxide, and nitrogen dioxide.

Note that when the flow rate of the oxidation gas is 100 times or more that of the deposition gas containing silicon, the hydrogen content of the first silicon oxide layer can be reduced and dangling bonds can also be reduced.

In the above manner, the first silicon layer having a small defect density is deposited. That is, a spin density of the first silicon oxide layer which is attributed to a signal with a g factor of 2.001 in ESR can be less than or equal to $3 \times 10^{17}$ spins/cm³, or less than or equal to $5 \times 10^{16}$ spins/cm³.

The second silicon oxide layer is preferably deposited by a plasma CVD method. Specifically, the deposition is performed under conditions where the substrate temperature is higher than or equal to 160° C. and lower than or equal to 350° C., preferably higher than or equal to 180° C. and lower than or equal to 260° C.; a deposition gas containing silicon and an oxidation gas are used; the pressure is higher than or equal to 100 Pa and lower than or equal to 250 Pa, preferably higher than or equal to 100 Pa and lower than or equal to 200 Pa; and a high-frequency power of higher than or equal to 0.17 W/cm$^2$ and lower than or equal to 0.5 W/cm$^2$, preferably higher than or equal to 0.25 W/cm$^2$ and lower than or equal to 0.35 W/cm$^2$ is supplied to electrodes.

By the above method, decomposition efficiency of the gas in plasma is increased, so that oxygen radicals are increased and oxidation of the gas proceeds; accordingly, the second silicon oxide layer which contains excess oxygen can be deposited.

The silicon nitride layer is preferably deposited by a plasma CVD method. Specifically, the deposition is performed under conditions where the substrate temperature is higher than or equal to 180° C. and lower than or equal to 400° C., preferably higher than or equal to 200° C. and lower than or equal to 370° C.; a deposition gas containing silicon, a nitrogen gas, and an ammonia gas are used; the pressure is higher than or equal to 20 Pa and lower than or equal to 250 Pa, preferably higher than or equal to 40 Pa and lower than or equal to 200 Pa; and a high-frequency power is supplied.

Note that the flow rate of the nitrogen gas is greater than or equal to 5 times and less than or equal to 50 times, preferably greater than or equal to 10 times and less than or equal to 50 times the flow rate of the ammonia gas. Note that the ammonia gas can promote decomposition of the deposition gas containing silicon and the nitrogen gas. This is because the ammonia gas is dissociated by plasma energy and thermal energy, and energy generated by the dissociation contributes to decomposition of bonding of the deposition gas containing silicon and bonding of the nitrogen gas.

Accordingly, a silicon nitride layer which releases a small amount of a hydrogen gas and a small amount of an ammonia gas can be deposited according to the above method. Further, since the silicon nitride layer contains a small amount of hydrogen, the silicon nitride layer is dense and hydrogen, water, and oxygen do not penetrate or hardly penetrate the silicon nitride layer.

Next, heat treatment is preferably performed. The heat treatment is performed at a temperature higher than or equal to 250° C. and lower than or equal to 650° C., preferably higher than or equal to 300° C. and lower than or equal to 500° C. The heat treatment is performed in an inert gas atmosphere, an atmosphere containing an oxidation gas at 10 ppm or more, preferably 1% or more, more preferably 10% or more, or under reduced pressure. Alternatively, the heat treatment may be performed in such a manner that heat treatment is performed in an inert gas atmosphere, and then another heat treatment is performed in an atmosphere containing an oxidation gas at 10 ppm or more, preferably 1% or more, further preferably 10% or more in order to compensate desorbed oxygen. By the heat treatment, excess oxygen is released from at least one of the base insulating film 102, the gate insulating film 112, and the protective insulating film 118; thus, oxygen vacancies in the multilayer film 106 can be reduced. Note that in the multilayer film 106, an oxygen vacancy captures an adjacent oxygen atom, so that the oxygen vacancy seems to move. Therefore, excess oxygen can reach the oxide semiconductor layer 106b through the oxide layer 106a, the oxide layer 106c, the oxide layer 106d, or the like.

In the above manner, the transistor can be manufactured.

The transistor has stable electrical characteristics because oxygen vacancies in the oxide semiconductor layer 106b of the multilayer film 106 are reduced. Further, since the oxide layer 106d having a curved surface is provided on the side surface of the multilayer film 106 as part of the multilayer film 106 and the base insulating film 102 has the three regions having different thicknesses, coverage with the gate insulating film 112, the protective insulating film 118, or the like is high and thus a shape defect is not likely to occur. Accordingly productivity can be improved.

<2-2. Transistor Structure (2)>

In this section, a bottom-gate transistor is described.

<2-2-1. Transistor Structure (2-1)>

Here, a bottom-gate top-contact (BGTC) structure transistor, which is one kind of bottom-gate transistor, is described with reference to FIGS. 26A to 26D.

Figure 26A:
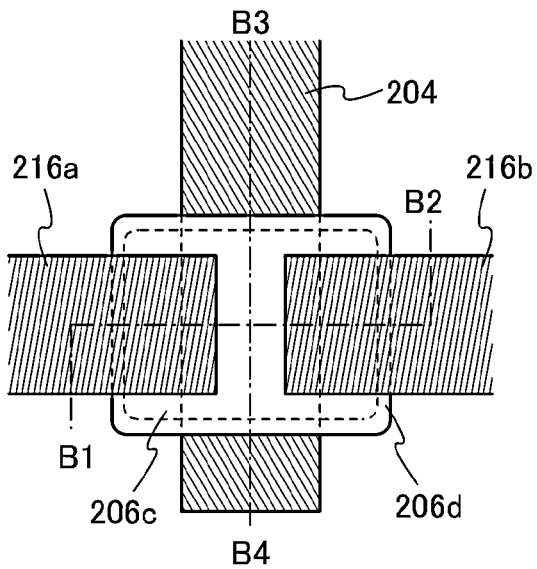
FIGS. 26A to 26D are a top view and cross-sectional views illustrating a semiconductor device of one embodiment of the present invention.
Figure 26C:
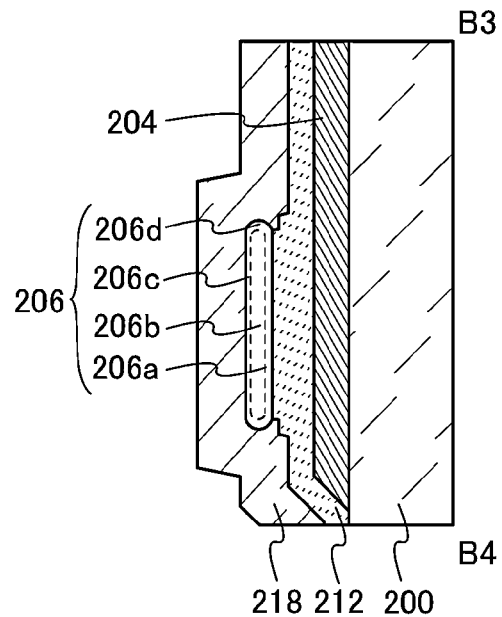
Figure 26B:
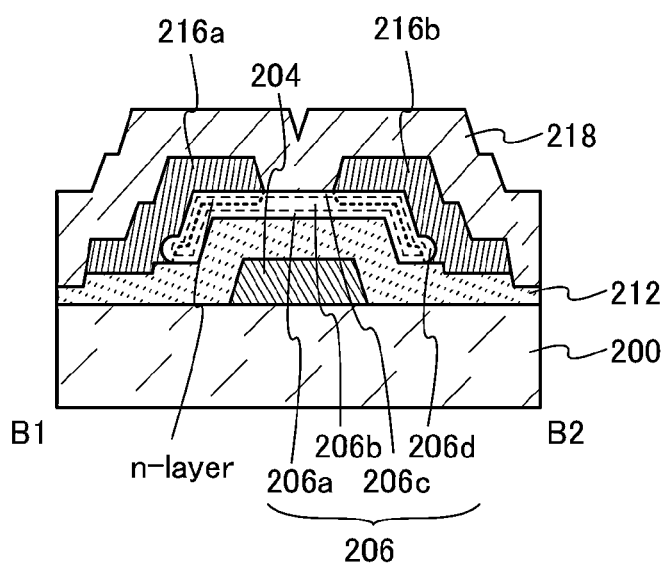
Figure 26D:
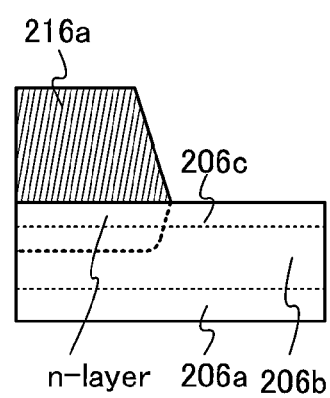

FIGS. 26A to 26D are a top view and cross-sectional views of the BGTC transistor. FIG. 26A is the top view of the transistor. FIG. 26B is the cross-sectional view taken along dashed-dotted line B1-B2 in FIG. 26A. FIG. 26D is an enlarged view of the vicinity of the source electrode 216a and the multilayer film 206 in FIG. 26B. FIG. 26C is the cross-sectional view taken along dashed-dotted line B3-B4 in FIG. 26A.

The transistor illustrated in FIG. 26B includes a gate electrode 204 provided over a substrate 200; a gate insulating film 212 provided over the gate electrode 204; a multilayer film 206 including an oxide layer 206a provided over the gate insulating film 212, an oxide semiconductor layer 206b provided over the oxide layer 206a, an oxide layer 206c provided over the oxide semiconductor layer 206b, and an oxide layer 206d provided in contact with at least the side surface of the oxide semiconductor layer 206b; a source electrode 216a and a drain electrode 216b provided over the gate insulating film 212 and the multilayer film 206; and a protective insulating film 218 provided over the multilayer film 206, the source electrode 216a, and the drain electrode 216b. Note that there is a case where the oxide layer 206a, the oxide layer 206b, and the oxide layer 206d cannot be strictly distinguished from each other; therefore, boundaries between them are illustrated in some cases.

Note that depending on the kind of a conductive film used for the source electrode 216a and the drain electrode 216b, oxygen might be removed from part of the multilayer film 206 or a mixed layer (a layer formed in such a manner that a metal element that is a main component of the conductive film is mixed into the multilayer film 206) might be formed, so that a source region and a drain region might be formed in the multilayer film 206 between a channel and the source and drain electrodes 216a and 216b. The source region and the drain region are each denoted as an "n-layer" with a dotted line in FIG. 26B.

A channel formation region in the transistor illustrated in FIGS. 26A to 26D is part of the multilayer film 206 which is located between the source electrode 216a and the drain electrode 216b and overlaps with the gate electrode 204. Here, a main path of current flowing in the oxide semiconductor layer 206b is referred to as the channel.

As illustrated in FIG. 26C, the oxide layer 206d is provided on the side surface of the oxide semiconductor layer 206b including the channel of the transistor. If the protective film is not provided on the side surface of the oxide semiconductor layer 206b, oxygen vacancies or the like easily occur and the impurity concentration becomes high in the side surface. When many oxygen vacancies or impurities exist in the side surface, a second transistor having a different threshold voltage seems to be formed at the side in some cases, which leads to electrical characteristic variation of the transistor. Since the oxide layer 206d protects the side surface of the oxide semiconductor layer 206b in the transistor in FIGS. 26A to 26D, oxygen vacancies do not occur in the side surface and the impurity concentration of the side surface are not increased. Therefore, the transistor can have sable electric characteristics.

In FIG. 26C, the gate insulating film 212 includes three regions having different thicknesses. Specifically, among the three regions, a first region which is in contact with the oxide layer 206a has the largest thickness, a second region which is in the periphery of the oxide layer 206d (see FIG. 26A) or is located outside the periphery of the oxide layer 206d has the second largest thickness, and a third region which is located outside the second region has the smallest thickness.

Figure 27A:
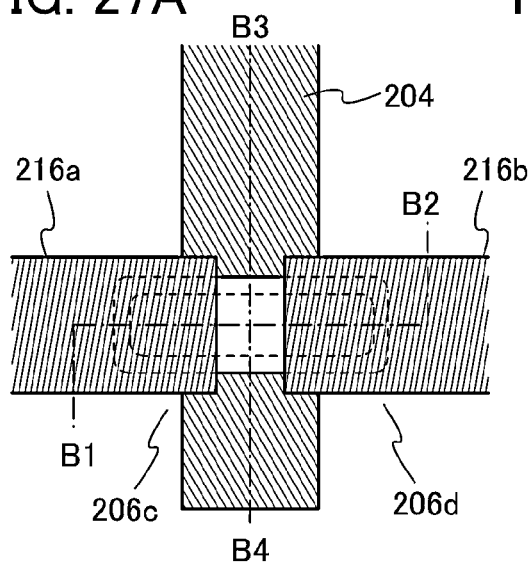
FIGS. 27A to 27C are a top view and cross-sectional views illustrating a semiconductor device of one embodiment of the present invention.
Figure 27C:
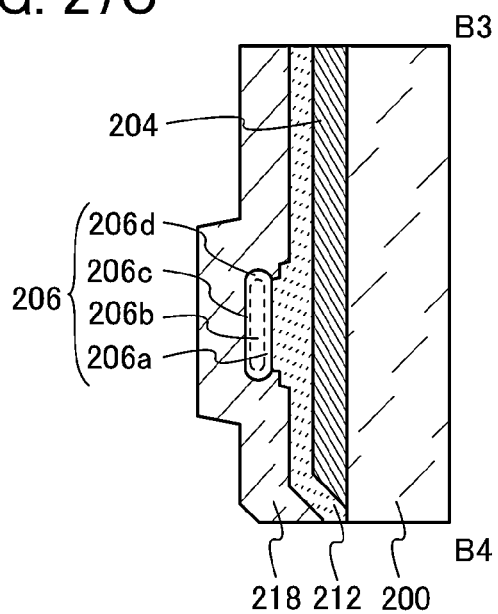
Figure 27B:
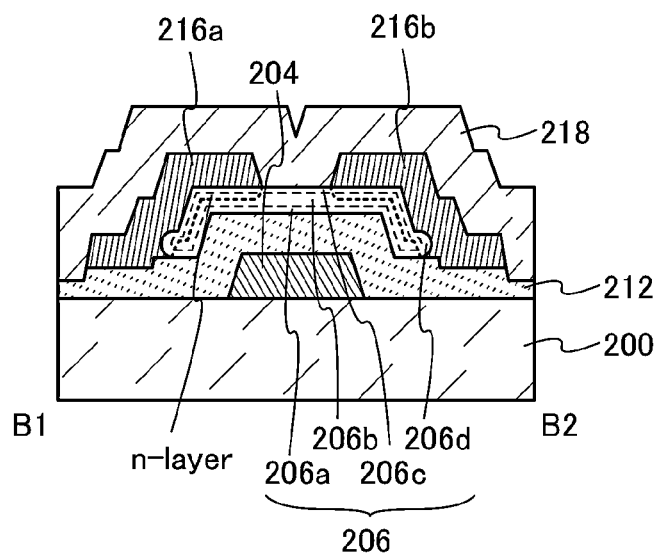

Note that as in the transistor illustrated in FIGS. 27A to 27C, the multilayer film 206 may be provided within the width of the source electrode 216a and the drain electrode 216b (the length in the channel width direction). In the transistor illustrated in FIGS. 27A to 27C, the multilayer film 206 is shielded from light by the source electrode 216a, the drain electrode 216b, and the like, and thus a change in electrical characteristics due to light is not likely occur.

For the multilayer film 206, the description of the multilayer film 106 is referred to. Specifically, the oxide layer 206a, the oxide semiconductor layer 206b, the oxide layer 206c, and the oxide layer 206d correspond to the oxide layer 106a, the oxide semiconductor layer 106b, the oxide layer 106c, and the oxide layer 106d, respectively. The transistor in FIGS. 26A to 26D is a transistor in which the channel is formed in the oxide semiconductor layer 206b in the multilayer film 206. The oxide semiconductor layer 206b has a wide band gap and is substantially intrinsic. Therefore, the transistor in FIGS. 26A to 26D has extremely small leakage current (also referred to as small off-state current) when the transistor is off. Specifically, in a transistor having a channel length of 3 μm and a channel width of 10 μm, the off-state current can be lower than $1 \times 10^{-20}$ A, preferably lower than $1 \times 10^{-22}$ A, further preferably lower than $1 \times 10^{-24}$ A. That is, the on/off ratio of the transistor can be greater than or equal to 20 digits and less than or equal to 150 digits.

For the substrate 200, the description of the substrate 100 is referred to. For the source electrode 216a and the drain electrode 216b, the description of the source electrode 116a and the drain electrode 116b is referred to. For the gate insulating film 212, the description of the gate insulating film 112 is referred to. For the gate electrode 204, the description of the gate electrode 104 is referred to. For the protective insulating film 218, the description of the protective insulating film 118 is referred to.

Since the oxide layer 206d having a curved surface is provided on the side surface of the multilayer film 206 as part of the multilayer film 206 and the gate insulating film 212 including the three regions having different thicknesses is provided in the transistor illustrated in FIGS. 26A to 26D, step coverage with a film formed over the multilayer film 206 and the gate insulating film 212 is increased and a crack of the film and generation of a cavity are prevented. Accordingly, the entry of impurities from the outside due through a crack of a film or a cavity is not caused, so that the transistor having stable electrical characteristics can be obtained.

<2-2-2. Fabrication Method of Transistor Structure (2-1)>

Here, a method for manufacturing the transistor is described with reference to FIGS. 28A to 28C and FIGS. 29A and 29B.

First, the substrate 200 is prepared.

Next, a conductive film to be the gate electrode 204 is formed. For the method for forming the conductive film to be the gate electrode 204, the description of the method for forming the conductive film to be the gate electrode 104 is referred to.

Figure 28A:
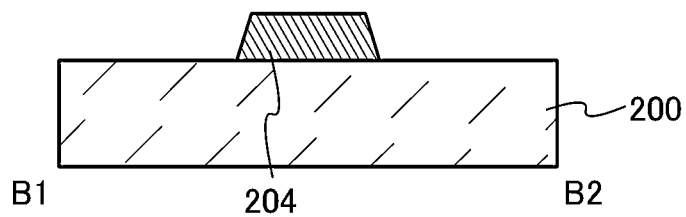
FIGS. 28A to 28C are cross-sectional views illustrating a method for manufacturing a semiconductor device of one embodiment of the present invention.

Next, the conductive film to be the gate electrode 204 is partly etched, so that the gate electrode 204 is formed (see FIG. 28A).

Figure 28B:
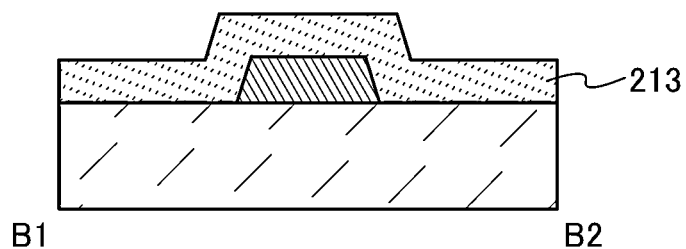
Figure 28C:
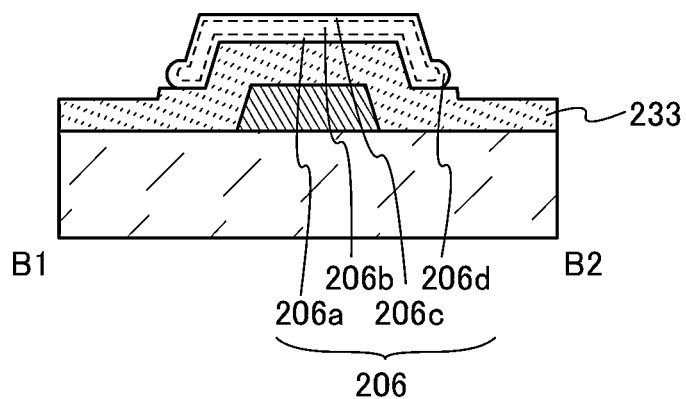

Next, a gate insulating film 213 is formed (see FIG. 28B). For the method for forming the gate insulating film 213, the description of the method for forming the gate insulating film 112 is referred to.

Next, the multilayer film 206 including the oxide layer 206a, the oxide semiconductor layer 206b provided over the oxide layer 206a, the oxide layer 206c provided over the oxide semiconductor layer 206b, and the oxide layer 206d provided in contact with at least the side surface of the oxide semiconductor layer 206b is formed. At this time, the gate insulating film 213 is partly etched to be a gate insulating film 233 (see FIG. 28C).

Next, a conductive film to be the source electrode 216a and the drain electrode 216b is formed. For the method for forming the conductive film to be the source electrode 216a and the drain electrode 216b, the description of the method for forming the conductive film to be the source electrode 116a and the drain electrode 116b is referred to.

Figure 29A:
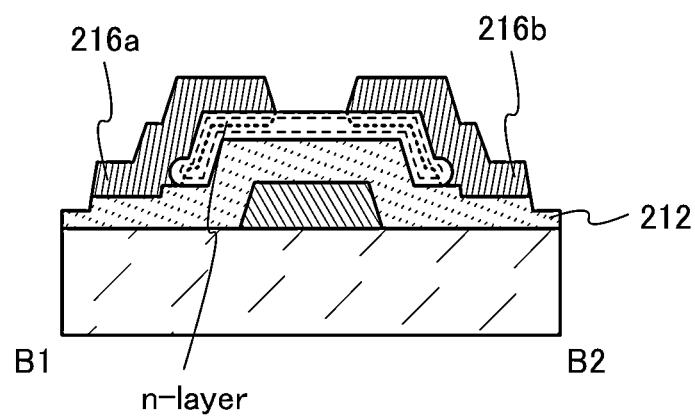
FIGS. 29A and 29B are cross-sectional views illustrating a method for manufacturing a semiconductor device of one embodiment of the present invention.

Then, the conductive film to be the source electrode 216a and the drain electrode 126b is partly etched, whereby the source electrode 216a and the drain electrode 216b are formed and the gate insulating film 233 is partly etched to be the gate insulating film 212 (see FIG. 29A). The gate insulating film 212 is partly etched by two separate etching steps and thus includes three regions having different thicknesses.

Figure 29B:
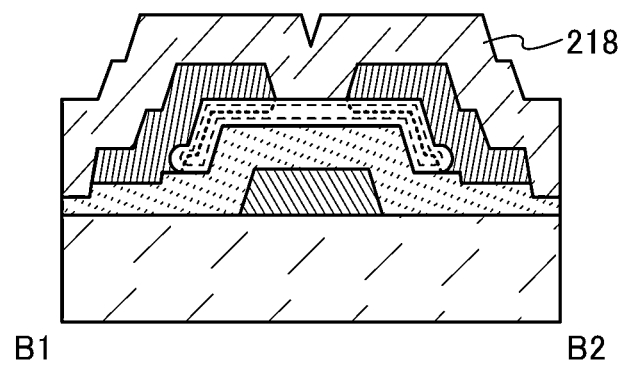

Next, the protective insulating film 218 is formed (see FIG. 29B). For the method for forming the protective insulating film 218, the description of the method for forming the protective insulating film 118 is referred to. Since the oxide layer 206d having a curved surface is provided on the side surface of the multilayer film 206 as part of the multilayer film 206 and the gate insulating film 212 has the three regions having different thicknesses, coverage with the protective insulating film 218 is high and thus a shape defect is not likely to occur.

Next, heat treatment is preferably performed. The heat treatment is performed at a temperature higher than or equal to 250° C. and lower than or equal to 650° C., preferably higher than or equal to 300° C. and lower than or equal to 500° C. The heat treatment is performed in an inert gas atmosphere, an atmosphere containing an oxidation gas at 10 ppm or more, preferably 1% or more, more preferably 10% or more, or under reduced pressure. Alternatively, the heat treatment may be performed in such a manner that heat treatment is performed in an inert gas atmosphere, and then another heat treatment is performed in an atmosphere containing an oxidation gas at 10 ppm or more, preferably 1% or more, further preferably 10% or more in order to compensate desorbed oxygen. By the heat treatment, excess oxygen is released from at least one of the gate insulating film 212 and the protective insulating film 218; thus, oxygen vacancies in the multilayer film 206 can be reduced. Note that in the multilayer film 206, an oxygen vacancy captures an adjacent oxygen atom, so that the oxygen vacancy seems to move. Therefore, excess oxygen can reach the oxide semiconductor layer 206b through the oxide layer 206a, the oxide layer 206c, the oxide layer 206d, or the like.

In the above manner, the BGTC transistor can be manufactured.

The transistor has stable electrical characteristics because oxygen vacancies in the oxide semiconductor layer 206b of the multilayer film 206 are reduced. Further, since the oxide layer 206d having a curved surface is provided on the side surface of the multilayer film 206 as part of the multilayer film 206 and the gate insulating film 212 has the three regions having different thicknesses, coverage with the protective insulating film 218 or the like is high and thus a shape defect is not likely to occur. Accordingly productivity can be improved.

<3. Application Products>

In this section, examples of a semiconductor device of one embodiment of the present invention are described.

Note that description of layers of a multilayer film of a transistor is omitted below in some cases. Further, description of steps (regions having different thicknesses) of a film serving as a base (e.g., a base insulating film or a gate insulating film), which are generated at the time of forming the multilayer film, is omitted in some cases.

<3-1. Microcomputer>

The transistor described above can be applied to microcomputers which are mounted on variety of electronic appliances.

A structure and operation of a fire alarm as an example of an electronic appliance on which the microcomputer is mounted are described below with reference to FIG. 30, FIG. 31, FIGS. 32A to 32C, and FIG. 33A.

A fire alarm in this specification refers to any device which raises an alarm over fire occurrence instantly, and for example, a residential fire alarm, an automatic fire alarm system, and a fire detector used for the automatic fire alarm system are included in its category.

Figure 30:
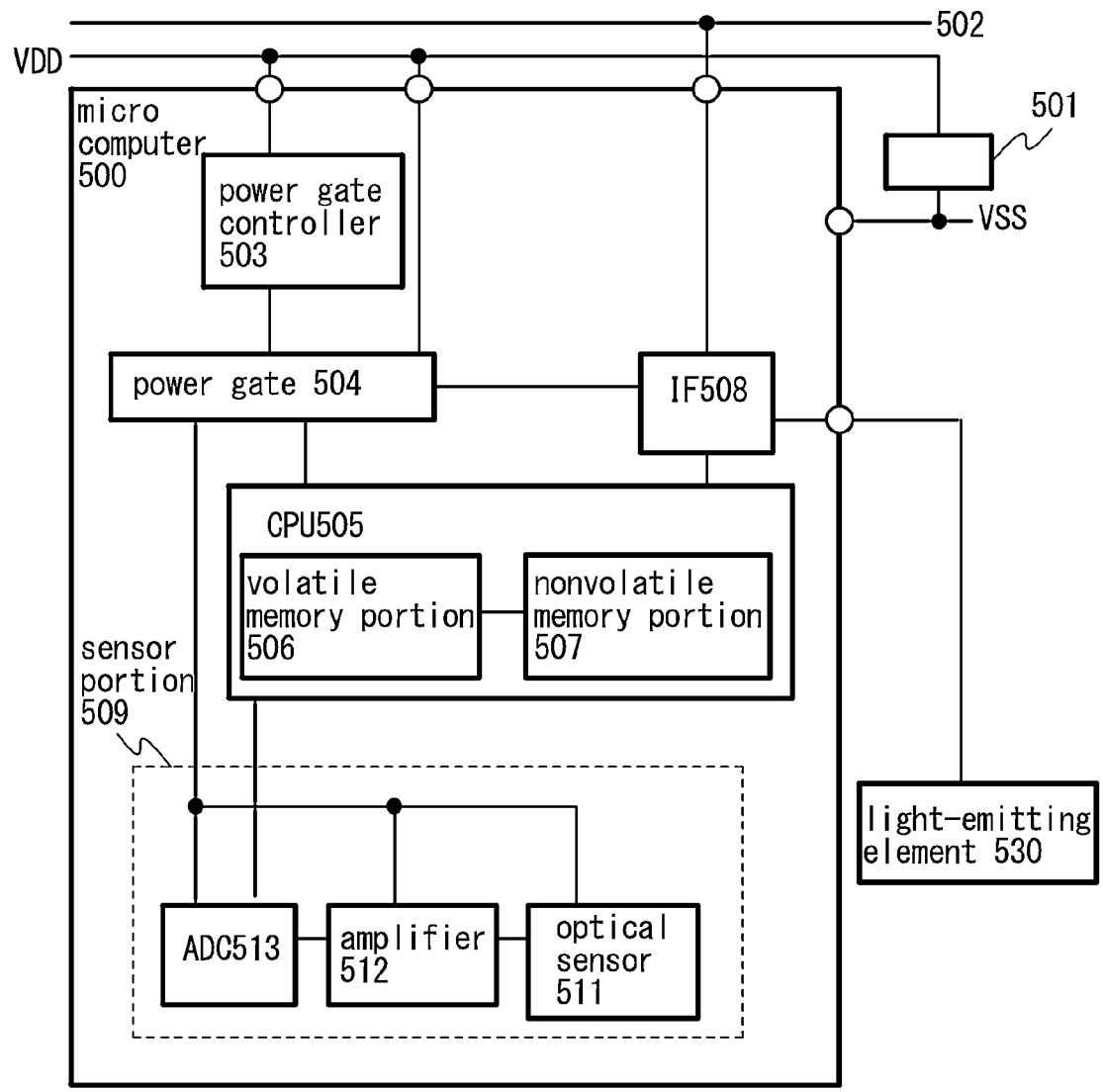
FIG. 30 is a block diagram illustrating an example of a semiconductor device of one embodiment of the present invention.

An alarm device illustrated in FIG. 30 includes at least a microcomputer 500. Here, the microcomputer 500 is provided in the alarm device. The microcomputer 500 includes a power gate controller 503 electrically connected to a high potential power supply line VDD, a power gate 504 electrically connected to the high potential power supply line VDD and the power gate controller 503, a CPU (Central Processing Unit) 505 electrically connected to the power gate 504, and a sensor portion 509 electrically connected to the power gate 504 and the CPU 505. Further, the CPU 505 includes a volatile memory portion 506 and a nonvolatile memory portion 507.

The CPU 505 is electrically connected to a bus line 502 through an interface 508. The interface 508 as well as the CPU 505 is electrically connected to the power gate 504. As a bus standard of the interface 508, an I²C bus can be used, for example. A light-emitting element 530 electrically connected to the power gate 504 through the interface 508 is provided in the alarm device.

The light-emitting element 530 is preferably an element which emits light with high directivity, and for example, an organic EL element, an inorganic EL element, or an LED can be used.

The power gate controller 503 includes a timer and controls the power gate 504 with the use of the timer. The power gate 504 allows or stops supply of power from the high potential power supply line VDD to the CPU 505, the sensor portion 509, and the interface 508, in accordance with the control by the power gate controller 503. Here, as an example of the power gate 504, a switching element such as a transistor can be given.

With the use of the power gate controller 503 and the power gate 504, power is supplied to the sensor portion 509, the CPU 505, and the interface 508 in a period during which the amount of light is measured, and supply of power to the sensor portion 509, the CPU 505, and the interface 508 can be stopped during an interval between measurement periods. The alarm device operates in such a manner, whereby power consumption can be reduced compared with the case where power is continuously supplied to the above structures.

In the case where a transistor is used as the power gate 504, it is preferable to use a transistor with an extremely low off-state current and is used for the nonvolatile memory portion 507, for example, the above transistor including a multilayer film including an oxide semiconductor layer. With the use of such a transistor, leakage current can be reduced when supply of power is stopped by the power gate 504, so that a reduction in power consumption of the alarm device can be achieved.

A direct-current power source 501 may be provided in the alarm device so that power is supplied from the direct-current power source 501 to the high potential power supply line VDD. An electrode of the direct-current power source 501 on a high potential side is electrically connected to the high potential power supply line VDD, and an electrode of the direct-current power source 501 on a low potential side is electrically connected to a low potential power supply line VSS. The low potential power supply line VSS is electrically connected to the microcomputer 500. Here, the high potential power supply line VDD is supplied with a high potential H. The low potential power supply line VSS is supplied with a low potential L, e.g., a ground potential (GND).

In the case where a battery is used as the direct-current power source 501, for example, a battery case including an electrode electrically connected to the high potential power supply line VDD, an electrode electrically connected to the low potential power supply line VSS, and a housing which can hold the battery, is provided in a housing. Note that the alarm device does not necessarily include the direct-current power source 501 and may have, for example, a structure in which power is supplied from an alternate-current power source provided outside the alarm device through a wiring.

As the above battery, a secondary battery such as a lithium ion secondary battery (also called a lithium ion storage battery or a lithium ion battery) can be used. Further, a solar battery is preferably provided to charge the secondary battery.

The sensor portion 509 measures a physical quantity relating to an abnormal situation and transmits a measurement value to the CPU 505. A physical quantity relating to an abnormal situation depends on the usage of the alarm device, and in an alarm device functioning as a fire alarm, a physical quantity relating to a fire is measured. Accordingly, the sensor portion 509 measures the amount of light as a physical quantity relating to a fire and senses smoke.

The sensor portion 509 includes an optical sensor 511 electrically connected to the power gate 504, an amplifier 512 electrically connected to the power gate 504, and an AD converter 513 electrically connected to the power gate 504 and the CPU 505. The light-emitting element 530, the optical sensor 511, the amplifier 512, and the AD converter 513 operate when the power gate 504 allows supply of power to the sensor portion 509.

Figure 31:
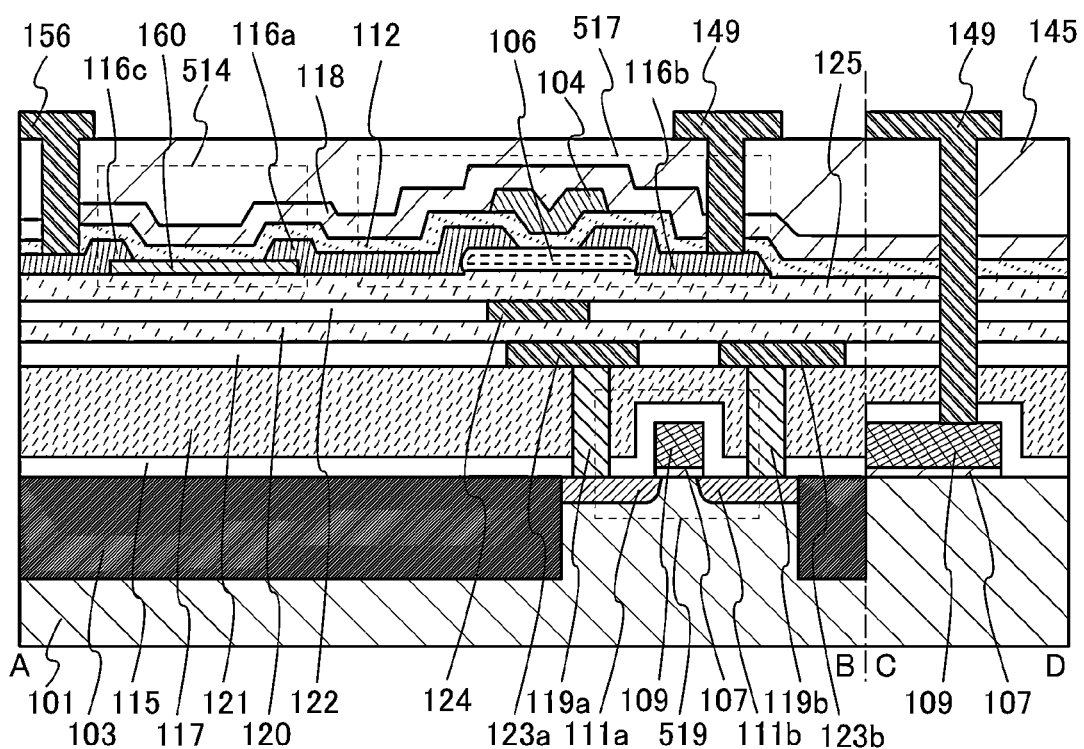
FIG. 31 is a cross-sectional view illustrating an example of a semiconductor device of one embodiment of the present invention.

FIG. 31 illustrates part of the cross section of the alarm device. An n-channel transistor 519 includes element isolation regions 103 in a p-type semiconductor substrate 101, a gate insulating film 107, a gate electrode 109, n-type impurity regions 111a and 111b, an insulating film 115, and an insulating film 117. The n-channel transistor 519 is formed using a semiconductor such as single crystal silicon, so that the n-channel transistor 519 can operate at high speed. Accordingly, a volatile memory portion of a CPU that can achieve high-speed access can be formed.

In addition, contact plugs 119a and 119b are formed in openings which are formed by partly etching the insulating films 115 and 117, and an insulating film 121 having groove portions is formed over the insulating film 117 and the contact plugs 119a and 119b. Wirings 123a and 123b are formed in the groove portions of the insulating film 121. An insulating film 120 is formed over the insulating film 121 and the wirings 123a and 123b by a sputtering method, a CVD method, or the like, and an insulating film 122 having a groove portion is formed over the insulating film 120. An electrode 124 is formed in the groove portion of the insulating film 122. The electrode 124 functions as a back gate electrode of a second transistor 517. The electrode 124 can control the threshold voltage of the second transistor 517.

Moreover, an insulating film 125 is formed over the insulating film 122 and the electrode 124 by a sputtering method, a CVD method, or the like.

The second transistor 517 and a photoelectric conversion element 514 are provided over the insulating film 125. The second transistor 517 includes the multilayer film 106; the source electrode 116a and the drain electrode 116b in contact with the top surface of the multilayer film 106; the gate insulating film 112; the gate electrode 104; and the protective insulating film 118. Moreover, an insulating film 145 covers the photoelectric conversion element 514 and the second transistor 517, and a wiring 149 in contact with the drain electrode 116b is formed over the insulating film 145. The wiring 149 functions as a node which electrically connects the drain electrode of the second transistor 517 to the gate electrode 109 of the n-channel transistor 519.

The optical sensor 511 includes the photoelectric conversion element 514, a capacitor, a first transistor, the second transistor 517, a third transistor, and the n-channel transistor 519. As the photoelectric conversion element 514, a photodiode can be used here, for example.

One of terminals of the photoelectric conversion element 514 is electrically connected to the low potential power supply line VSS, and the other of the terminals thereof is electrically connected to one of the source electrode and the drain electrode of the second transistor 517. The gate electrode of the second transistor 517 is supplied with an electric charge accumulation control signal Tx, and the other of the source electrode and the drain electrode thereof is electrically connected to one of a pair of electrodes of the capacitor, one of a source electrode and a drain electrode of the first transistor, and the gate electrode of the n-channel transistor 519 (hereinafter the node is referred to as a node FD in some cases). The other of the pair of electrodes of the capacitor is electrically connected to the low potential power supply line VSS. A gate electrode of the first transistor is supplied with a reset signal Res, and the other of the source electrode and the drain electrode thereof is electrically connected to the high potential power supply line VDD. One of a source electrode and a drain electrode of the n-channel transistor 519 is electrically connected to one of a source electrode and a drain electrode of the third transistor and the amplifier 512. The other of the source electrode and the drain electrode of the n-channel transistor 519 is electrically connected to the high potential power supply line VDD. A gate electrode of the third transistor is supplied with a bias signal Bias, and the other of the source electrode and the drain electrode thereof is electrically connected to the low potential power supply line VSS.

Note that the capacitor is not necessarily provided. For example, in the case where parasitic capacitance of the n-channel transistor 519 or the like is sufficiently large, a structure without the capacitor may be employed.

Further, as each of the first transistor and the second transistor 517, the transistor with an extremely low off-state current is preferably used. As the transistor with extremely low off-state current, the above transistor including a multilayer film including an oxide semiconductor layer is preferably used. With such a structure, the potential of the node FD can be held for a long time.

In the structure in FIG. 31, the photoelectric conversion element 514 is electrically connected to the second transistor 517 and is provided over the insulating film 125.

The photoelectric conversion element 514 includes a semiconductor film 160 over the insulating film 125, and the source electrode 116a and an electrode 116c which are in contact with the top surface of the semiconductor film 160. The source electrode 116a is an electrode functioning as the source electrode or the drain electrode of the second transistor 517 and electrically connects the photoelectric conversion element 514 to the second transistor 517.

Over the semiconductor film 160, the source electrode 116a, and the electrode 116c, the gate insulating film 112, the protective insulating film 118, and the insulating film 145 are provided. Further, a wiring 156 is formed over the insulating film 145 and is in contact with the electrode 116c through an opening provided in the gate insulating film 112, the protective insulating film 118, and the insulating film 145.

The electrode 116c can be formed in the same step as the source electrode 116a and the drain electrode 116b, and the wiring 156 can be formed in the same step as the wiring 149.

As the semiconductor film 160, a semiconductor film which can perform photoelectric conversion is provided, and for example, silicon, germanium, or the like can be used. In the case of using silicon, the semiconductor film 160 functions as a photosensor which senses visible light. Further, there is a difference, between silicon and germanium, in wavelengths of electromagnetic waves that can be absorbed. When the semiconductor film 160 includes germanium, a sensor which senses infrared ray can be obtained.

In the above manner, the sensor portion 509 including the optical sensor 511 can be incorporated into the microcomputer 500, so that the number of components can be reduced and the housing of the alarm device can be reduced.

In a fire alarm including the above-described IC chip, the CPU 505 in which a plurality of circuits including the above transistor are combined and mounted on one IC chip is used.
<3-1-1. CPU>

Figure 32A:
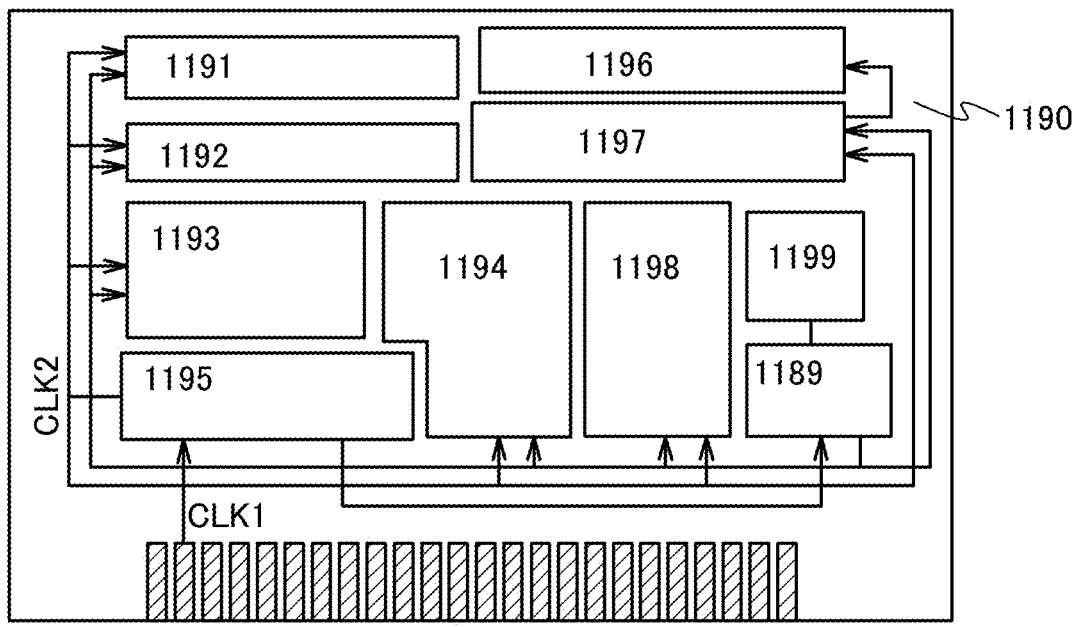
FIGS. 32A to 32C are block diagrams illustrating an example of a CPU of one embodiment of the present invention.
Figure 32B:
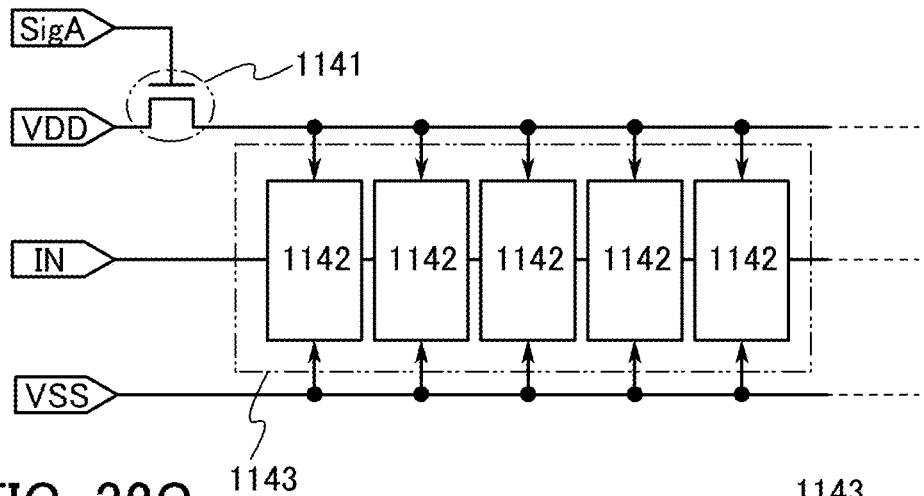
Figure 32C:
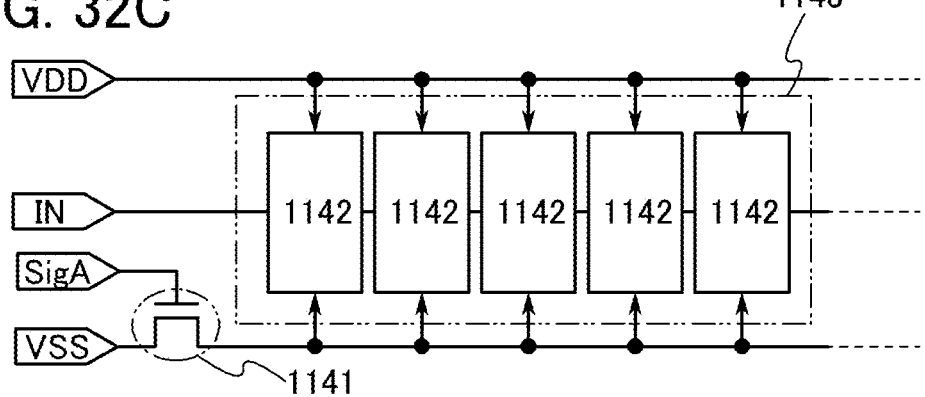

FIGS. 32A to 32C are block diagrams illustrating a specific configuration of a CPU at least partly including the above transistor.

The CPU illustrated in FIG. 32A includes an arithmetic logic unit (ALU) 1191, an ALU controller 1192, an instruction decoder 1193, an interrupt controller 1194, a timing controller 1195, a register 1196, a register controller 1197, a bus interface 1198 (Bus I/F), a rewritable ROM 1199, and an ROM interface 1189 (ROM I/F) over a substrate 1190. A semiconductor substrate, an SOI substrate, a glass substrate, or the like is used as the substrate 1190. The ROM 1199 and the ROM interface 1189 may be provided over a separate chip. Needless to say, the CPU in FIG. 32A is just an example in which the configuration has been simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 32A, a memory cell is provided in the register 1196. As the memory cell of the register 1196, the above-described transistor can be used.

In the CPU illustrated in FIG. 32A, the register controller 1197 selects operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

The power supply can be stopped by a switching element provided between a memory cell group and a node to which a power supply potential VDD or a power supply potential VSS is supplied, as illustrated in FIG. 32B or FIG. 32C. Circuits illustrated in FIGS. 32B and 32C are described below.

FIGS. 32B and 32C are each a memory device in which the above transistor is used as a switching element for controlling power supply potential supplied to memory cells.

The memory device illustrated in FIG. 32B includes a switching element 1141 and a memory cell group 1143 including a plurality of memory cells 1142. Specifically, as each of the memory cells 1142, the above transistor can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 32B, any of the above transistors is used as the switching element 1141, and the switching of the transistor is controlled by a signal SigA supplied to a gate electrode layer thereof.

Note that FIG. 32B illustrates the configuration in which the switching element 1141 includes only one transistor; however, without particular limitation thereon, the switching element 1141 may include a plurality of transistors. In the case where the switching element 1141 includes a plurality of transistors which function as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 32B, the switching element 1141 may control the supply of the low-level power supply potential VSS.

In FIG. 32C, an example of a memory device in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example here, the transistor can also be applied to an LSI such as a digital signal processor (DSP), a custom LSI, or a field programmable gate array (FPGA).

<3-1-2. Example of Installation>

Figure 33A:
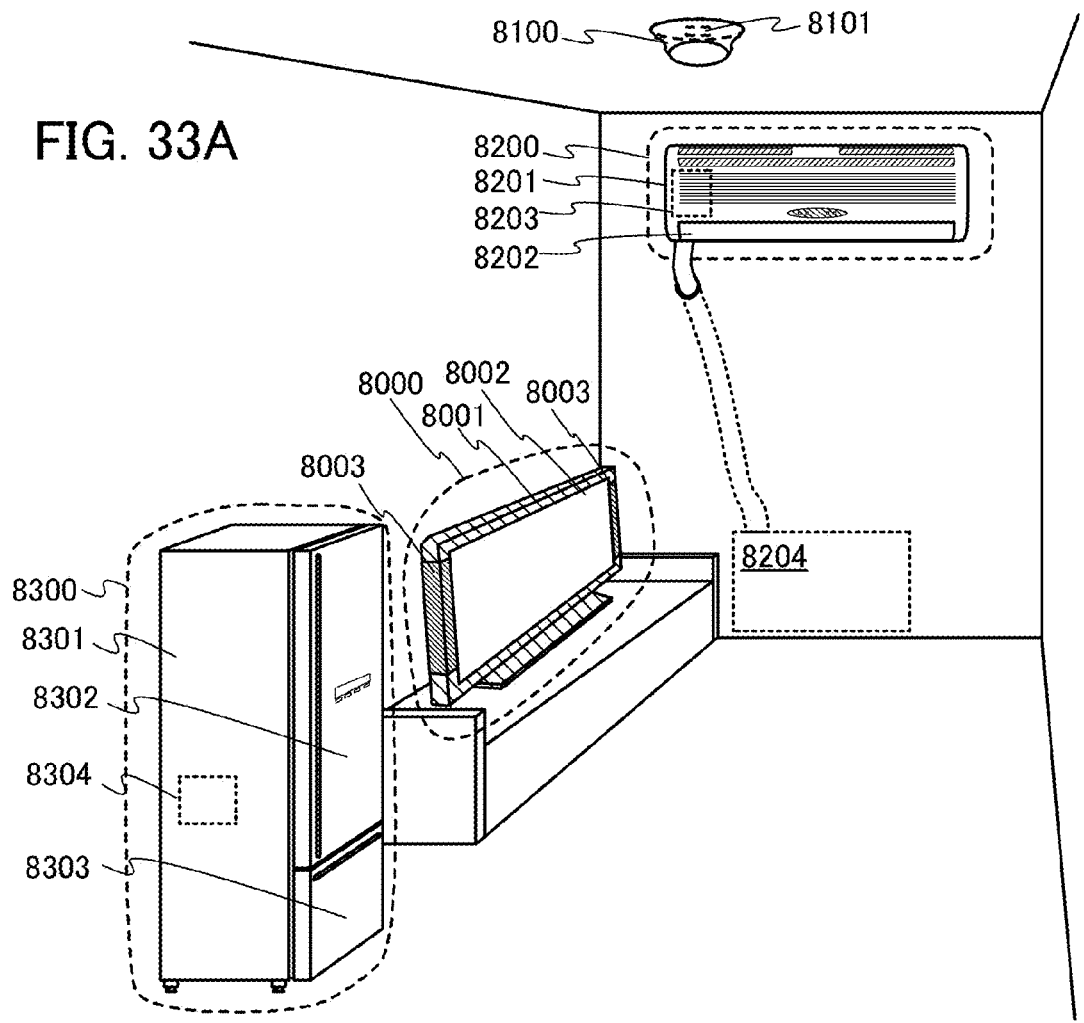
FIGS. 33A to 33C illustrate an example of an electronic appliance according to one embodiment of the present invention.

In a television set 8000 in FIG. 33A, a display portion 8002 is incorporated in a housing 8001. The display portion 8002 displays an image and a speaker portion 8003 can output sound. The above transistor can be used for the display portion 8002.

A semiconductor display device such as a liquid crystal display device, a light-emitting device in which a light-emitting element such as an organic EL element is provided in each pixel, an electrophoretic display device, a digital micromirror device (DMD), or a plasma display panel (PDP) can be used for the display portion 8002.

In addition, the television set 8000 may include a memory or a CPU for performing information communication. The above transistor, memory device, or CPU is used for the CPU or the memory, whereby a reduction in power consumption of the television set 8000 can be achieved.

In FIG. 33A, an alarm device 8100 is a residential fire alarm which includes a sensor portion and a microcomputer 8101. Note that the microcomputer 8101 includes a CPU in which the above transistor is used.

In FIG. 33A, an air conditioner which includes an indoor unit 8200 and an outdoor unit 8204 includes the CPU in which the above transistor is used. Specifically, the indoor unit 8200 includes a housing 8201, an air outlet 8202, a CPU 8203, and the like. Although the CPU 8203 is provided in the indoor unit 8200 in FIG. 33A, the CPU 8203 may be provided in the outdoor unit 8204. Alternatively, the CPU 8203 may be provided in both the indoor unit 8200 and the outdoor unit 8204. When the air conditioner includes the CPU in which the above transistor is used, a reduction in power consumption of the air conditioner can be achieved.

In FIG. 33A, an electric refrigerator-freezer 8300 includes the CPU in which the above transistor is used. Specifically, the electric refrigerator-freezer 8300 includes a housing 8301, a door for a refrigerator 8302, a door for a freezer 8303, a CPU 8304, and the like. In FIG. 33A, the CPU 8304 is provided in the housing 8301. When the electric refrigerator-freezer 8300 includes the CPU 8304 in which the above transistor is used, a reduction in power consumption of the electric refrigerator-freezer 8300 can be achieved.

Figure 33B:
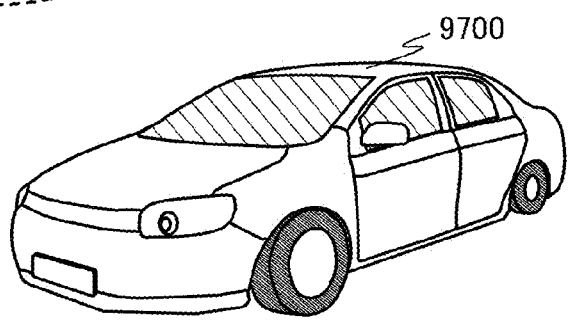
Figure 33C:
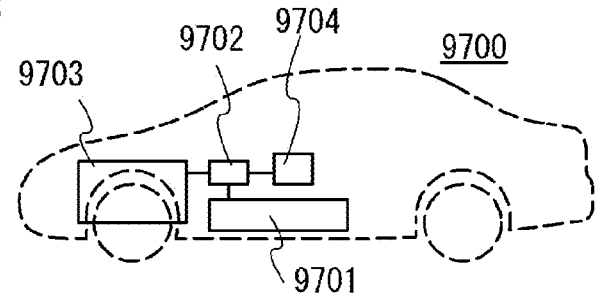

FIGS. 33B and 33C illustrate an example of an electric vehicle. An electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. When the electric vehicle 9700 includes the CPU in which the above transistor is used, a reduction in power consumption of the electric vehicle 9700 can be achieved.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

<3-2. Display Device>

In this section, a display device including the above transistor is described.

As a display element provided in the display device, a liquid crystal element (also referred to as a liquid crystal display element), a light-emitting element (also referred to as a light-emitting display element) or the like can be used. A light-emitting element includes, in its category, an element whose luminance is controlled by current or voltage, and specifically an inorganic electroluminescent (EL) element, an organic EL element, and the like. Furthermore, a display medium whose contrast is changed by an electric effect, such as electronic ink, can be used as the display element. A display device including an EL element and a display device including a liquid crystal element are described below as examples of the display device.

Note that the display device described below includes in its category a panel in which a display element is sealed and a module in which an IC such as a controller is mounted on the panel.

Further, the display device described below refers to an image display device, a display device, or a light source (including a lighting device). The display device includes any of the following modules in its category: a module provided with a connector such as an FPC or TCP; a module in which a printed wiring board is provided at the end of TCP; and a module in which an integrated circuit (IC) is mounted directly on a display element by a COG method.

<3-2-1. EL Display Device>

First, a display device using an EL element (also referred to as an EL display device) is described.

Figure 34:
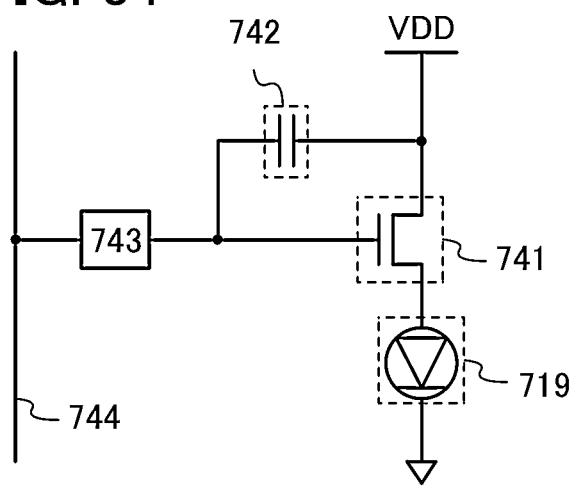
FIG. 34 is a circuit diagram illustrating an example of an EL display device of one embodiment of the present invention.

FIG. 34 is an example of the circuit diagram of a pixel of a display device including an EL element.

The EL display device illustrated in FIG. 34 includes a switching element 743, a transistor 741, a capacitor 742, and a light-emitting element 719.

A gate of the transistor 741 is electrically connected to one electrode of the switching element 743 and one electrode of the capacitor 742. A source of the transistor 741 is electrically connected to one terminal of the light-emitting element 719. A drain of the transistor 741 is electrically connected to the other electrode of the capacitor 742, to which a power source potential VDD is supplied. The other electrode of the switching element 743 is electrically connected to a signal line 744. A constant potential is supplied to the other terminal of the light-emitting element 719. The constant potential is a ground potential GND or a potential lower than the ground potential GND.

The transistor using the multilayer film including the oxide semiconductor film, which is described in the above embodiment, is used as the transistor 741. The transistor has stable electrical characteristics. Accordingly, an EL display device having high display quality can be provided.

A transistor is preferably used as the switching element 743, which enables the pixel area to be small, so that an EL display device with high resolution can be achieved. The transistor using the multilayer film including the oxide semiconductor film, which is described in the above embodiment, may be used as the switching element 743; accordingly, the switching element 743 can be formed by the same process as the transistor 741, which leads to an improvement in the productivity of the EL display device.

Figure 35A:
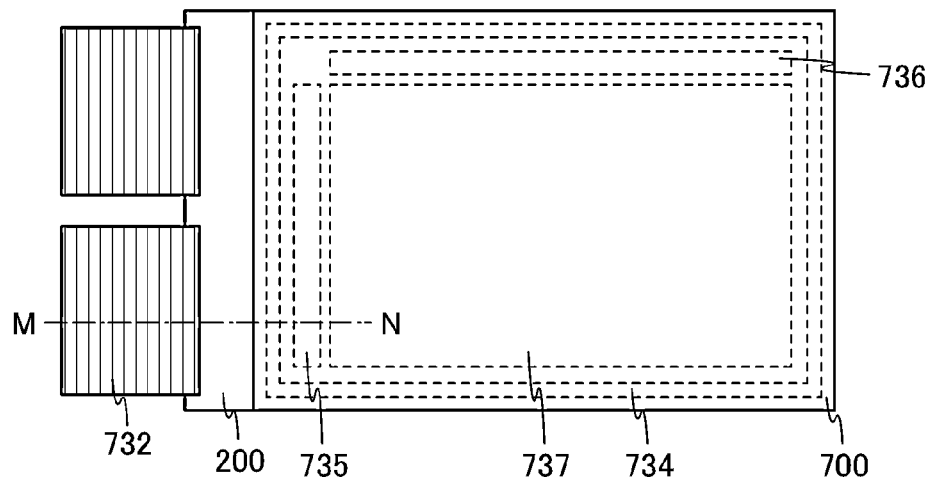
FIGS. 35A to 35C are a top view and cross-sectional views illustrating an example of an EL display device of one embodiment of the present invention.

FIG. 35A is a top view of an EL display device. The EL display device includes a substrate 200, a substrate 700, a seal material 734, a driver circuit 735, a driver circuit 736, a pixel 737, and an FPC 732. The seal material 734 is provided between the substrate 200 and the substrate 700 so as to surround the pixel 737, the driver circuit 735, and the driver circuit 736. The driver circuit 735 and/or the driver circuit 736 may be provided outside the seal material 734.

Figure 35B:
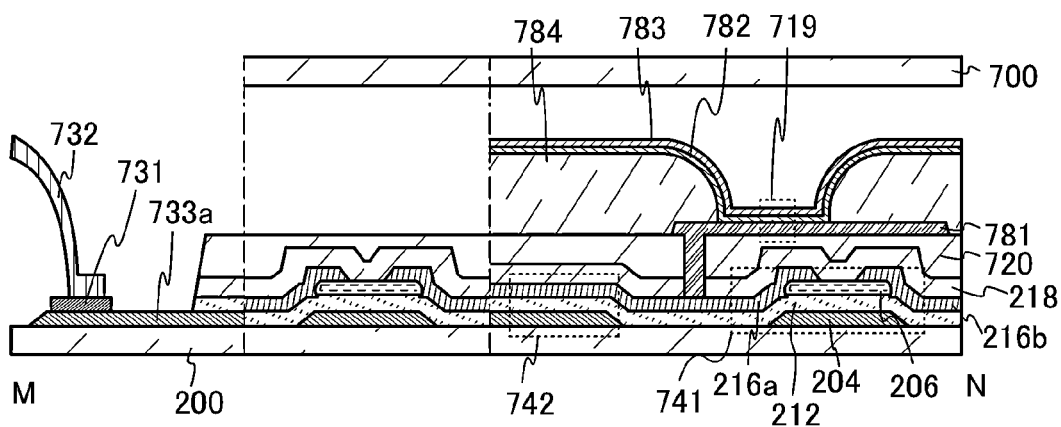

FIG. 35B is a cross-sectional view of the display device including an EL element taken along dashed-dotted line M-N in FIG. 35A. The FPC 732 is connected to a wiring 733a through a terminal 731. The wiring 733a is the same layer as the gate electrode 204.

FIG. 35B illustrates the example in which the transistor 741 and the capacitor 742 are provided in the same plane. With such a structure, the capacitor 742 can be fabricated in the same planes as the gate electrode, the gate insulating film, and the source (drain) electrode of the transistor 741. Such provision of the transistor 741 and the capacitor 742 in the same plane leads to shortening of the manufacturing process of the EL display device and an improvement of the productivity.

FIG. 35B illustrates the example in which the transistor illustrated in FIGS. 26A to 26D is applied to the transistor 741. Therefore, for components of the transistor 741 other than the components described below, refer to the description of FIGS. 26A to 26D and the like.

An insulating film 720 is provided over the transistor 741 and the capacitor 742.

Here, an opening reaching the source electrode 216a of the transistor 741 is provided in the insulating film 720 and the protective insulating film 218.

An electrode 781 is provided over the insulating film 720. The electrode 781 is in contact with the source electrode 216a of the transistor 741 though the opening provided in the insulating film 720 and the protective insulating film 218.

Over the electrode 781, a bank 784 having an opening reaching the electrode 781 is provided.

Over the bank 784, a light-emitting layer 782 in contact with the electrode 781 through the opening provided in the bank 784 is provided.

An electrode 783 is provided over the light-emitting layer 782.

A region where the electrode 781, the light-emitting layer 782, and the electrode 783 overlap with one another serves as the light-emitting element 719.

For the insulating film 720, refer to the description of the protective insulating film 118. A resin film made of a polyimide resin, an acrylic resin, an epoxy resin, a silicone resin, or the like may be used as the insulating film 720.

Figure 35C:
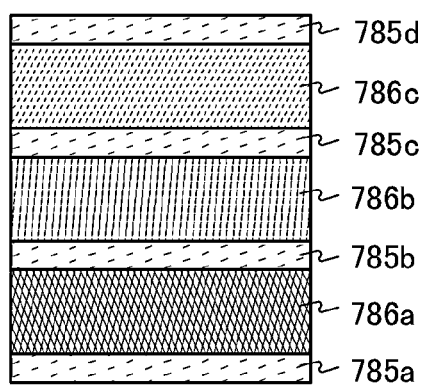

The light-emitting layer 782 is not limited to one layer and may be a stacked layer of plural kinds of light-emitting layers. For example, a structure illustrated in FIG. 35C may be used. FIG. 35C illustrates a structure in which an intermediate layer 785a, a light-emitting layer 786a, an intermediate layer 785b, a light-emitting layer 786b, an intermediate layer 785c, a light-emitting layer 786c, and an intermediate layer 785d are stacked in this order. By using light-emitting layers whose emission colors are appropriate as the light-emitting layer 786a, the light-emitting layer 786b, and the light-emitting layer 786c, the light-emitting element 719 can be provided with high color rendering properties or high luminous efficiency.

White light may be provided by stacking plural kinds of light-emitting layers. Although not illustrated in FIG. 35B, a structure in which white light is extracted through a coloring layer may be employed.

Although the structure in which three light-emitting layers and four intermediate layers are provided is illustrated here, the number of light-emitting layers and the number of intermediate layers can be changed as appropriate without being limited thereto. For example, the light-emitting layer may be formed with the intermediate layer 785a, the light-emitting layer 786a, the intermediate layer 785b, the light-emitting layer 786b, and the intermediate layer 785c. Alternatively, the light-emitting layer may be formed with the intermediate layer 785a, the light-emitting layer 786a, the intermediate layer 785b, the light-emitting layer 786b, the light-emitting layer 786c, and the intermediate layer 785d, and the intermediate layer 785c may be omitted.

The intermediate layer can be formed using a stacked-layer structure of a hole-injection layer, a hole-transport layer, an electron-transport layer, an electron-injection layer, or the like. Not all of these layers need to be provided in the intermediate layer; these layers may be selected as appropriate. Further, layers having the same functions may be provided to overlap with each other. Further, an electron-relay layer or the like may be added as appropriate as the intermediate layer, in addition to a carrier generation layer.

As the electrode 781, a conductive film having visible light permeability may be used. Having visible light permeability means to have an average transmittance of 70% or more, particularly 80% or more in the visible light region (e.g., the range of wavelength of from 400 nm to 800 nm).

As the electrode 781, for example, an oxide film such as an In—Zn—W oxide film, an In—Sn oxide film, an In—Zn oxide film, an indium oxide film, a zinc oxide film, or a tin oxide film may be used. Further, a slight amount of Al, Ga, Sb, F, or the like may be added to the above-described oxide film. A metal thin film having a thickness thin enough to transmit light (preferably, approximately 5 nm to 30 nm) can also be used. For example, an Ag film, a Mg film, or an Ag—Mg alloy film with a thickness of 5 nm may be used.

Alternatively, a film on which visible light is reflected efficiently is preferably used as the electrode 781. For example, a film containing lithium, aluminum, titanium, magnesium, lanthanum, silver, silicon, or nickel may be used as the electrode 781.

As the electrode 783, any of the films described for the electrode 781 can be used. Note that in the case where the electrode 781 has visible light permeability, it is preferable that the electrode 783 reflect visible light efficiently, and in the case where the electrode 781 reflects visible light efficiently, it is preferable that the electrode 783 have visible light permeability.

Although the electrodes 781 and 783 are provided in accordance with the structure illustrated in FIG. 35B, the positions of the electrodes 781 and 783 may be replaced with each other. It is preferable to use a conductive film having a high work function for the electrode which functions as an anode, and a conductive film having a low work function for the electrode which functions as a cathode. However, in the case where a carrier generation layer is provided in contact with the anode, a variety of conductive films can be used for the anode regardless of their work functions.

For the bank 784, refer to the description of the protective insulating film 118. A resin film made of a polyimide resin, an acrylic resin, an epoxy resin, a silicone resin, or the like may be used as the bank 784.

The transistor 741 connected to the light-emitting element 719 has stable electrical characteristics. Accordingly, an EL display device having high display quality can be provided.

Figure 36A:
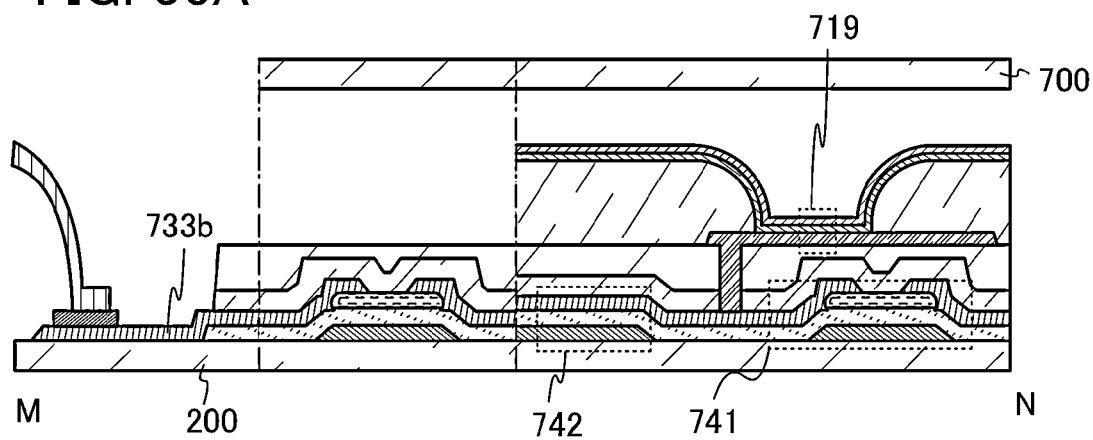
FIGS. 36A and 36B are cross-sectional views illustrating examples of an EL display device of one embodiment of the present invention.
Figure 36B:
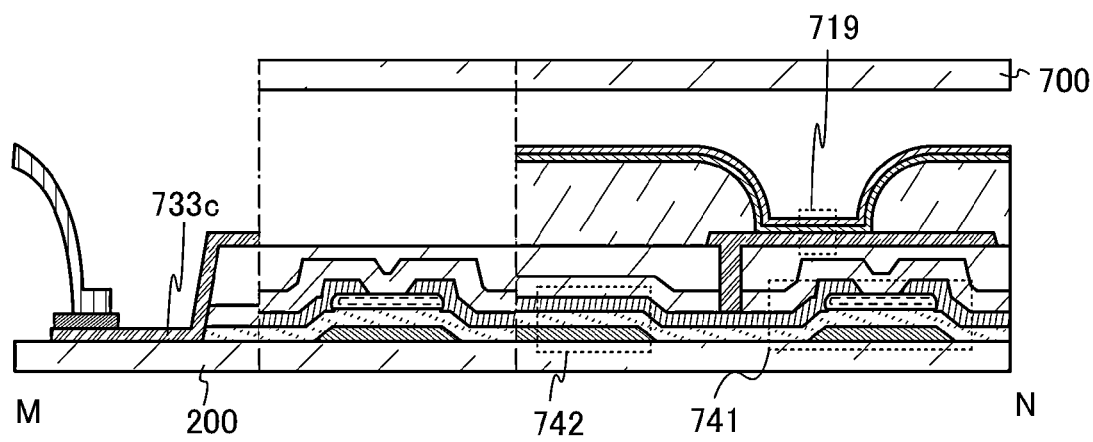

FIGS. 36A and 36B are examples of the cross-sectional view of an EL display device, which are partly different from FIG. 35B. Specifically, the wiring connected to the FPC 732 is different in them. In FIG. 36A, the FPC 732 is connected to a wiring 733b through the terminal 731. The wiring 733b is the same layer as the source electrode 216a and the drain electrode 216b. In FIG. 36B, the FPC 732 is connected to a wiring 733c through the terminal 731. The wiring 733c is the same layer as the electrode 781.

<3-2-2. Liquid Crystal Display Device>

Next, a display device including a liquid crystal element (also referred to as a liquid crystal display device) is described.

Figure 37:
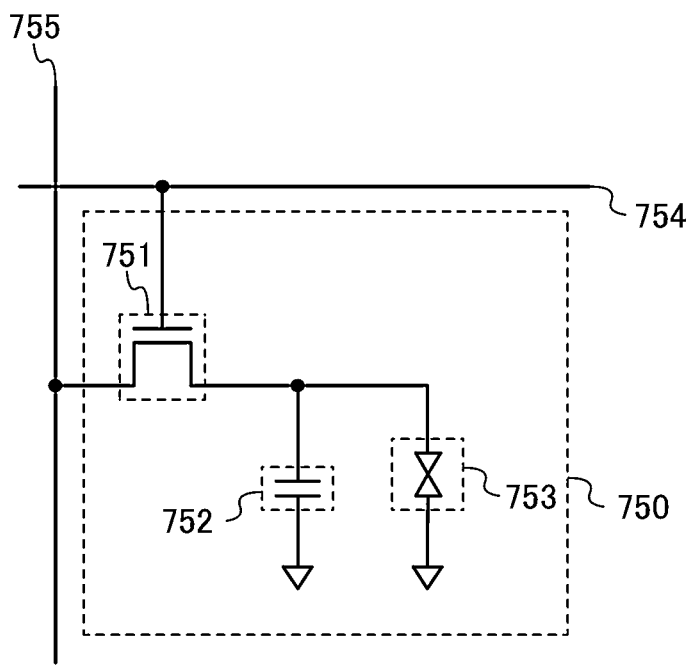
FIG. 37 is a circuit diagram illustrating an example of a liquid crystal display device of one embodiment of the present invention.

FIG. 37 is a circuit diagram illustrating a configuration example of the pixel of a liquid crystal display device. A pixel 750 shown in FIG. 37 includes a transistor 751, a capacitor 752, and an element (hereinafter also referred to as liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring to which a common potential is supplied.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the other electrode of the liquid crystal element 753.

Figure 38A:
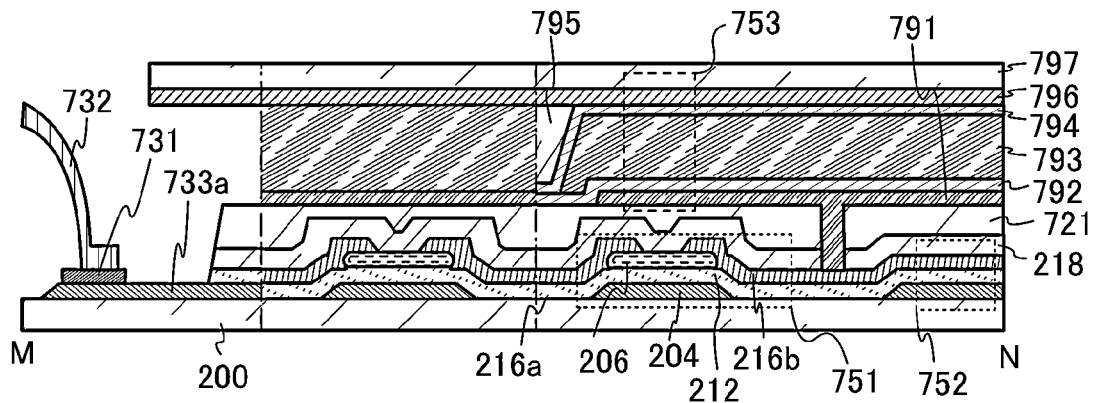
FIGS. 38A to 38C are cross-sectional views each illustrating an example of a liquid crystal display device of one embodiment of the present invention.

The top view of the liquid crystal display device is similar to that of the EL display device. A cross-sectional view of the liquid crystal display device taken along dashed-dotted line M-N in FIG. 35A is illustrated in FIG. 38A. In FIG. 38A, the FPC 732 is connected to the wiring 733a through the terminal 731. The wiring 733a is the same layer as the gate electrode 204.

FIG. 38A illustrates the example in which the transistor 751 and the capacitor 752 are provided in the same plane. With such a structure, the capacitor 752 can be fabricated in the same planes as the gate electrode, the gate insulating film, and the source (drain) electrode of the transistor 751. Such provision of the transistor 751 and the capacitor 752 in the same plane leads to shortening of the manufacturing process of the liquid crystal display device and an improvement of the productivity.

The transistor described in the above embodiment can be applied to the transistor 751. FIG. 38A illustrates an example in which the transistor illustrated in FIGS. 26A to 26D is applied to the transistor 751. Therefore, for components of the transistor 751 other than the components described below, refer to the description of FIGS. 26A to 26D and the like.

The off-state current of the transistor 751 can be made extremely small. Therefore, charge retained in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided.

An insulating film 721 is provided over the transistor 751 and the capacitor 752.

Here, an opening reaching the drain electrode 216b of the transistor 751 is provided in the insulating film 721 and the protective insulating film 218.

An electrode 791 is provided over the insulating film 721. The electrode 791 is in contact with the drain electrode 216b of the transistor 751 though the opening provided in the insulating film 721 and the protective insulating film 218.

An insulating film 792 which functions as an alignment film is provided over the electrode 791.

A liquid crystal layer 793 is provided over the insulating film 792.

An insulating film 794 which functions as an alignment film is provided over the liquid crystal layer 793.

A spacer 795 is provided over the insulating film 794.

An electrode 796 is provided over the spacer 795 and the insulating film 794.

A substrate 797 is provided over the electrode 796.

For the insulating film 721, refer to the description of the protective insulating film 218. A resin film made of a polyimide resin, an acrylic resin, an epoxy resin, a silicone resin, or the like may be used as the insulating film 721.

For the liquid crystal layer 793, a thermotropic liquid crystal, a low-molecular liquid crystal, a high-molecular liquid crystal, a high-molecular distributed liquid crystal, a ferroelectric liquid crystal, an anti-ferroelectric liquid crystal, or the like may be used. Such a liquid crystal exhibits a cholesteric phase, a smectic phase, a cubic phase, a chiral nematic phase, an isotropic phase, or the like depending on conditions.

A liquid crystal exhibiting a blue phase may be used as the liquid crystal layer 793. In that case, the insulating films 792 and 794, which function as alignment films, may be omitted.

As the electrode 791, a conductive film having visible light permeability may be used.

As the electrode 791, for example, an oxide film such as an In—Zn—W oxide film, an In—Sn oxide film, an In—Zn oxide film, an indium oxide film, a zinc oxide film, or a tin oxide film may be used. Further, a slight amount of Al, Ga, Sb, F, or the like may be added to the above-described oxide film. A metal thin film having a thickness thin enough to transmit light (preferably, approximately 5 nm to 30 nm) can also be used.

Alternatively, a film on which visible light is reflected efficiently is preferably used as the electrode 791. For example, a film containing aluminum, titanium, chromium, copper, molybdenum, silver, tantalum, or tungsten may be used as the electrode 791.

As the electrode 796, any of the films described for the electrode 791 can be used. Note that in the case where the electrode 791 has visible light permeability, it is preferable that the electrode 796 reflects visible light efficiently, and in the case where the electrode 791 reflects visible light efficiently, it is preferable that the electrode 796 have visible light permeability.

Although the electrodes 791 and 796 are provided in accordance with the structure illustrated in FIG. 38A, the positions of the electrodes 791 and 796 may be replaced with each other.

Each of the insulating films 792 and 794 may be formed using an organic compound or an inorganic compound.

The spacer 795 may be formed using an organic compound or an inorganic compound. The spacer 795 can have any shape such as a column shape or spherical shape.

A region where the electrode 791, the insulating film 792, the liquid crystal layer 793, the insulating film 794, and the electrode 796 overlap with one another serves as the liquid crystal element 753.

Glass, resin, metal, or the like may be used for the substrate 797. The substrate 797 may be flexible.

Figure 38B:
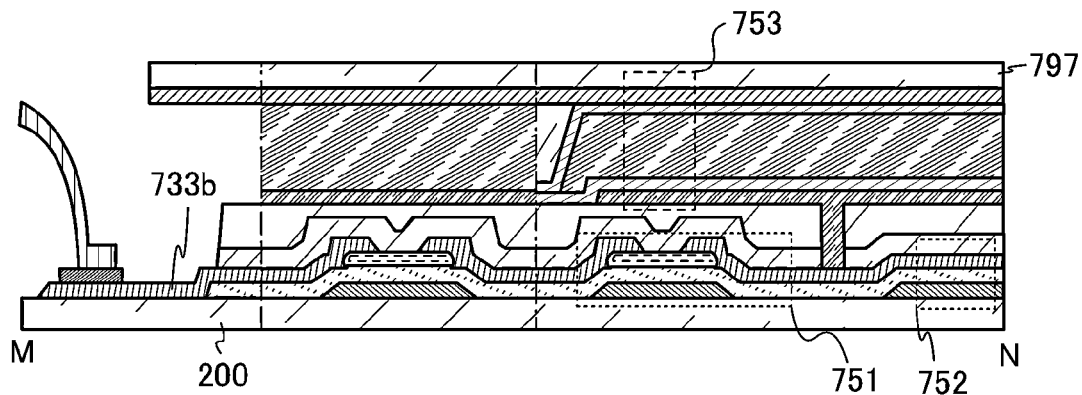
Figure 38C:
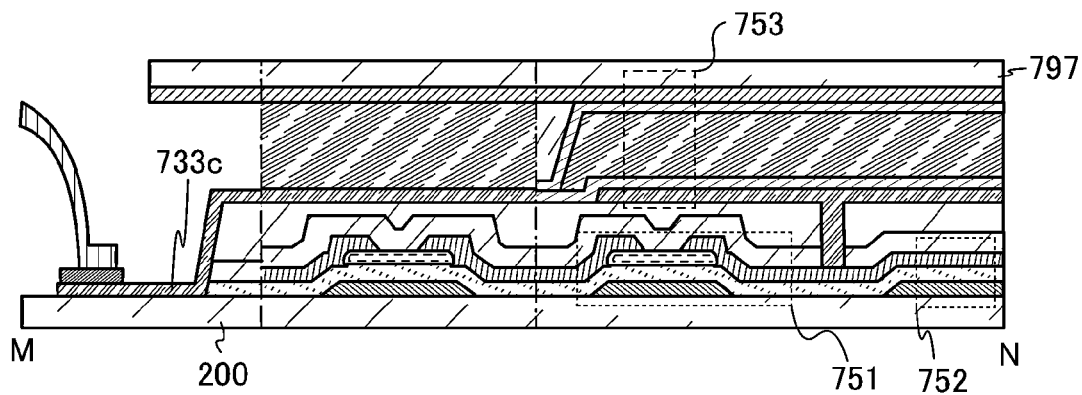

FIGS. 38B and 38C are examples of the cross-sectional view of a liquid crystal display device, which are partly different from FIG. 38A. Specifically, the wiring connected to the FPC 732 is different in them. In FIG. 38B, the FPC 732 is connected to the wiring 733b through the terminal 731. The wiring 733b is the same layer as the source electrode 216a and the drain electrode 216b. In FIG. 38C, the FPC 732 is connected to the wiring 733c through the terminal 731. The wiring 733c is the same layer as the electrode 791.

The transistor 751 connected to the liquid crystal element 753 has stable electrical characteristics. Therefore, a liquid crystal display device having high display quality can be provided. Since the transistor 751 can have extremely low off-state current, a liquid crystal display device with low power consumption can be provided.

Operation modes of liquid crystal are described below, using examples. Driving methods of a liquid crystal of a liquid crystal display device include a vertical electric field method where voltage is applied perpendicular to a substrate and a horizontal electric field method where voltage is applied in parallel to a substrate.

First, FIGS. 39A1 and 39A2 are cross-sectional schematic views each illustrating a pixel structure of a liquid crystal display device of a TN mode.

A liquid crystal layer 3100 is sandwiched between a substrate 3101 and a substrate 3102 which are arranged so as to face each other. A polarizing plate 3103 is formed on the substrate 3101 side and a polarizing plate 3104 is formed on the substrate 3102 side. The absorption axis of the polarizing plate 3103 and the absorption axis of the polarizing plate 3104 are in a cross nicol state.

Although not illustrated, a backlight and the like are provided outside the polarizing plate 3104. An electrode 3108 and an electrode 3109 are provided on the substrate 3101 and the substrate 3102, respectively. The electrode 3108 on the side opposite to the backlight, that is, on the viewing side, is formed so as to have a light-transmitting property.

In the case where a liquid crystal display device having such a structure is in a normally white mode, when a voltage is applied between the electrode 3108 and the electrode 3109 (referred to as a vertical electric field method), liquid crystal molecules 3105 are aligned vertically as illustrated in FIG. 39A1. Thus, light from the backlight cannot pass through the polarizing plate 3103, which leads to black display.

When no voltage is applied between the electrode 3108 and the electrode 3109, the liquid crystal molecules 3105 are aligned horizontally and twisted on a plane surface as illustrated in FIG. 39A2. As a result, light from the backlight can pass through the polarizing plate 3103, which leads to white display. The gray scale can be expressed by adjusting the voltage applied between the electrode 3108 and the electrode 3109. Thus, predetermined image display is performed.

When a coloring layer is provided, full color display can be performed. The coloring layer can be provided on either the substrate 3101 side or on the substrate 3102 side.

A known molecule may be used for a liquid crystal molecule used for a TN mode.

FIGS. 39B1 and 39B2 are cross-sectional schematic views each illustrating a pixel structure of a liquid crystal display device of a VA mode. In the VA mode, the liquid crystal molecules 3105 are aligned such that they are perpendicular to the substrate when there is no electric field.

In a manner similar to that in FIGS. 39A1 and 39A2, the electrode 3108 and the electrode 3109 are provided on the substrate 3101 and the substrate 3102, respectively. The electrode 3108 on the side opposite to the backlight, that is, on the viewing side, is formed so as to have a light-transmitting property. The polarizing plate 3103 is formed on the substrate 3101 side and the polarizing plate 3104 is formed on the substrate 3102 side. The absorption axis of the polarizing plate 3103 and the absorption axis of the polarizing plate 3104 are in a cross nicol state.

When a voltage is applied between the electrode 3108 and the electrode 3109 (the vertical electric field method) in a liquid crystal display device having such a structure, the liquid crystal molecules 3105 are aligned horizontally as illustrated in FIG. 39B1. Thus, light from the backlight can pass through the polarizing plate 3103, which leads to white display.

When no voltage is applied between the electrode 3108 and the electrode 3109, the liquid crystal molecules 3105 are aligned vertically as illustrated in FIG. 39B2. As a result, light from the backlight which is polarized by the polarizing plate 3104 passes through a cell without being influenced by birefringence of the liquid crystal molecules 3105. Thus, the light from the backlight which is polarized cannot pass through the polarizing plate 3103, which leads to black display. The gray scale can be expressed by adjusting the voltage applied between the electrode 3108 and the electrode 3109. Thus, predetermined image display is performed.

When a coloring layer is provided, full color display can be performed. The coloring layer can be provided on either the substrate 3101 side or on the substrate 3102 side.

FIGS. 39C1 and 39C2 are cross-sectional schematic views each illustrating a pixel structure of a liquid crystal display device of an MVA-mode. The MVA mode is a method in which one pixel is divided into a plurality of portions, and the portions have different alignment directions of the liquid crystal molecules 3105 and compensate the viewing angle dependencies. As illustrated in FIG. 39C1, in the MVA mode, a projection 3158 whose cross section is a triangle is provided on the electrode 3108 and a projection 3159 whose cross section is a triangle is provided on the electrode 3109 for controlling alignment. Note that the structures other than the projections are in common with the structures in the VA mode.

When a voltage is applied between the electrode 3108 and the electrode 3109 (the vertical electric field method), the liquid crystal molecules 3105 are aligned so that a long axis of the liquid crystal molecule 3105 is substantially vertical to surfaces of the projections 3158 and 3159 as illustrated in FIG. 39C1. Thus, light from the backlight can pass through the polarizing plate 3103, which leads to white display.

When no voltage is applied between the electrode 3108 and the electrode 3109, the liquid crystal molecules 3105 are aligned vertically as illustrated in FIG. 39C2. As a result, light from the backlight cannot pass through the polarizing plate 3103, which leads to black display. The gray scale can be expressed by adjusting the voltage applied between the electrode 3108 and the electrode 3109. Thus, predetermined image display is performed.

When a coloring layer is provided, full color display can be performed. The coloring layer can be provided on either the substrate 3101 side or on the substrate 3102 side.

Figure 42A:
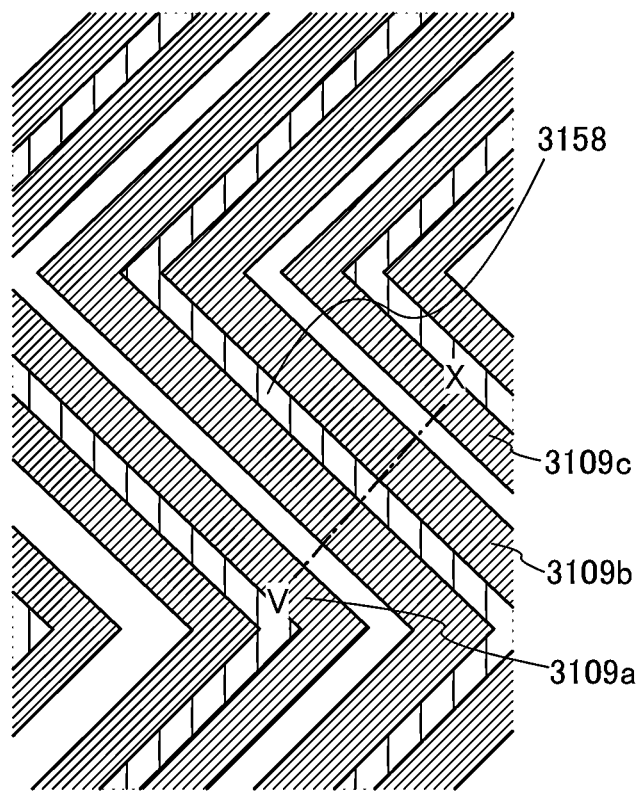
FIGS. 42A and 42B are a top view and a cross-sectional view illustrating an example of a pixel of a liquid crystal device of one embodiment of the present invention.
Figure 42B:
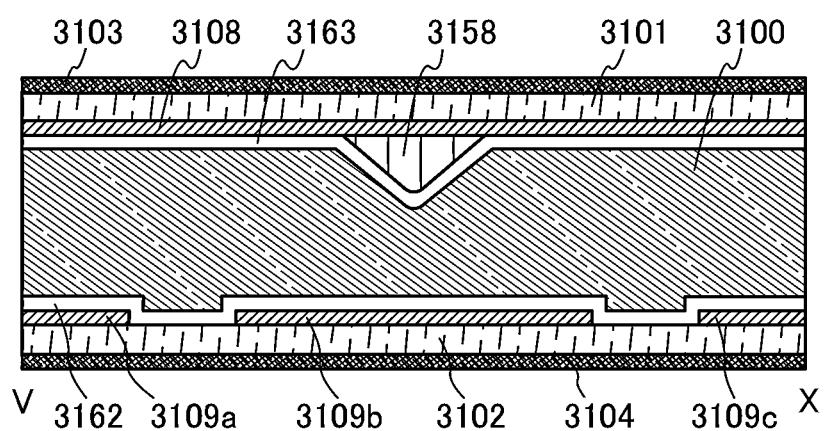

FIGS. 42A and 42B are a top view and a cross-sectional view, respectively, of another example of the MVA mode. As shown in FIG. 42A, an electrode 3109a, an electrode 3109b, and an electrode 3109c are each formed into a bent pattern like a dogleg-like shape (v-like shape). As illustrated in FIG. 42B, an insulating film 3162 and an insulating film 3163 which function as an alignment film are formed over the electrodes 3109a, 3109b, and 3109c and over the electrode 3108, respectively. A projection 3158 is formed on an electrode 3108 and over the electrode 3109b.

FIGS. 40A1 and 40A2 are cross-sectional schematic views each illustrating a pixel structure of a liquid crystal display device of an OCB mode. In the OCB mode, the liquid crystal molecules 3105 are able to take a configuration which compensates the viewing angle dependence, and such a configuration is called a bend alignment.

As in FIGS. 39A1 to 39C2, the electrode 3108 is provided on the substrate 3101 and the electrode 3109 is provided on the substrate 3102. The electrode 3108 on the side opposite to the backlight, that is, on the viewing side, is formed so as to have a light-transmitting property. The polarizing plate 3103 is formed on the substrate 3101 side, and the polarizing plate 3104 is formed on the substrate 3102 side. The absorption axis of the polarizing plate 3103 and the absorption axis of the polarizing plate 3104 are in a cross nicol state.

When voltage is applied between the electrode 3108 and the electrode 3109 (the vertical electric field method) in a liquid crystal display device having such a structure, black display is performed. At that time, the liquid crystal molecules 3105 are aligned vertically as illustrated in FIG. 40A1. Thus, light from the backlight cannot pass through the polarizing plate 3103, which leads to black display.

When no voltage is applied between the electrode 3108 and the electrode 3109, the liquid crystal molecules 3105 exist in a bend alignment state as illustrated in FIG. 40A2. As a result, light from the backlight can pass through the polarizing plate 3103, which leads to white display. The gray scale can be expressed by adjusting the voltage applied between the electrode 3108 and the electrode 3109. Thus, predetermined image display is performed.

When a coloring layer is provided, full color display can be performed. The coloring layer can be provided on either the substrate 3101 side or on the substrate 3102 side.

In such an OCB mode, alignment of the liquid crystal molecules 3105 can compensate the viewing angle dependence. Further, with a pair of stacks of polarizer-including layers, the contrast ratio can be enhanced.

FIGS. 40B1 and 40B2 are cross-sectional schematic views each illustrating a pixel structure of a liquid crystal display device of an FLC mode or an AFLC mode.

As in FIGS. 39A1 to 39C2, the electrode 3108 is provided on the substrate 3101 and the electrode 3109 is provided on the substrate 3102. The electrode 3108 on the side opposite to the backlight, that is, on the viewing side, is formed so as to have a light-transmitting property. The polarizing plate 3103 is formed on the substrate 3101 side, and the polarizing plate 3104 is formed on the substrate 3102 side. The absorption axis of the polarizing plate 3103 and the absorption axis of the polarizing plate 3104 are in a cross nicol state.

In the liquid crystal display device having such a structure, when a voltage is applied between the electrode 3108 and the electrode 3109 (referred to as a vertical electric field method), the liquid crystal molecules 3105 are aligned horizontally in a direction deviated from a rubbing direction. Thus, light from the backlight can pass through the polarizing plate 3103, which leads to white display.

When no voltage is applied between the electrode 3108 and the electrode 3109, the liquid crystal molecules 3105 are aligned horizontally along the rubbing direction as illustrated in FIG. 40B2. As a result, light from the backlight cannot pass through the polarizing plate 3103, which leads to black display. The gray scale can be expressed by adjusting the voltage applied between the electrode 3108 and the electrode 3109. Thus, predetermined image display is performed.

When a coloring layer is provided, full color display can be performed. The coloring layer can be provided on either the substrate 3101 side or on the substrate 3102 side.

A known molecule may be used for a liquid crystal molecule for an FLC mode or an AFLC mode.

FIGS. 41A1 and 41A2 are cross-sectional schematic views each illustrating a pixel structure of a liquid crystal display device of an IPS mode. The IPS mode is a mode in which the liquid crystal molecules 3105 are rotated in a plane parallel to a substrate by horizontal electric field generated by the electrodes provided for only one substrate side.

The IPS mode is characterized in that liquid crystal is controlled by a pair of electrodes provided for one substrate. Thus, a pair of electrodes 3150 and 3151 are provided over the substrate 3102. The pair of electrodes 3150 and 3151 may each have a light-transmitting property. The polarizing plate 3103 is formed on the substrate 3101 side, and the polarizing plate 3104 is formed on the substrate 3102 side. The absorption axis of the polarizing plate 3103 and the absorption axis of the polarizing plate 3104 are in a cross nicol state.

When a voltage is applied between the pair of electrodes 3150 and 3151 in the liquid crystal display device having such a structure, the liquid crystal molecules 3105 are aligned along an electric flux line deviated from a rubbing direction as illustrated in FIG. 41A1. Thus, light from the backlight can pass through the polarizing plate 3103, which leads to white display.

When no voltage is applied between the pair of electrodes 3150 and 3151, the liquid crystal molecules 3105 are aligned horizontally along the rubbing direction as illustrated in FIG. 41A2. As a result, light from the backlight cannot pass through the polarizing plate 3103, which leads to black display. The gray scale can be expressed by adjusting the voltage applied between the pair of electrodes 3150 and 3151. Thus, predetermined image display is performed.

When a coloring layer is provided, full color display can be performed. The coloring layer can be provided on either the substrate 3101 side or on the substrate 3102 side.

Figure 43A:
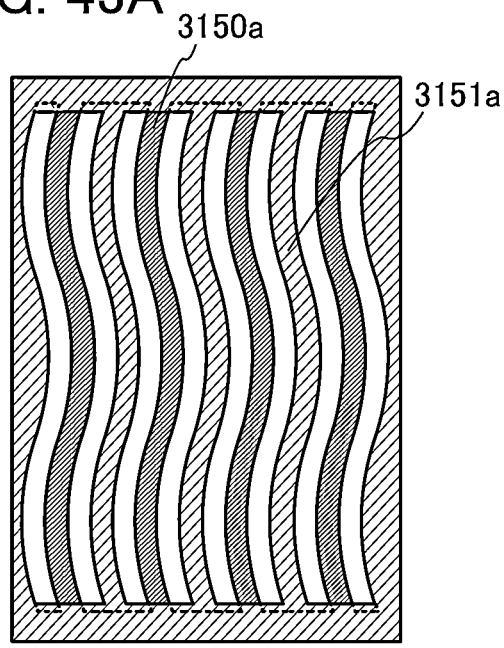
FIG. 43A to 43C are top views each illustrating an example of a pixel of a liquid crystal device of one embodiment of the present invention.
Figure 43B:
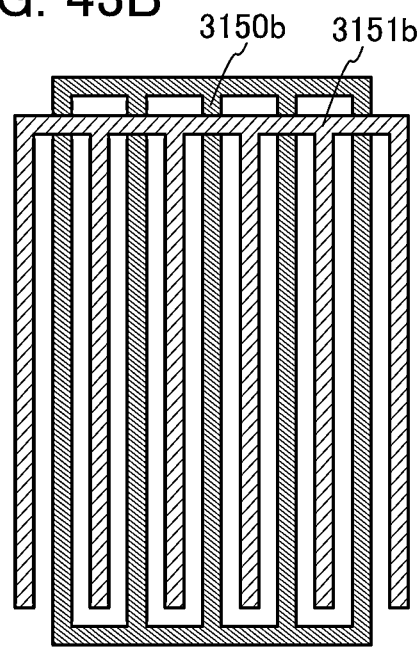
Figure 43C:
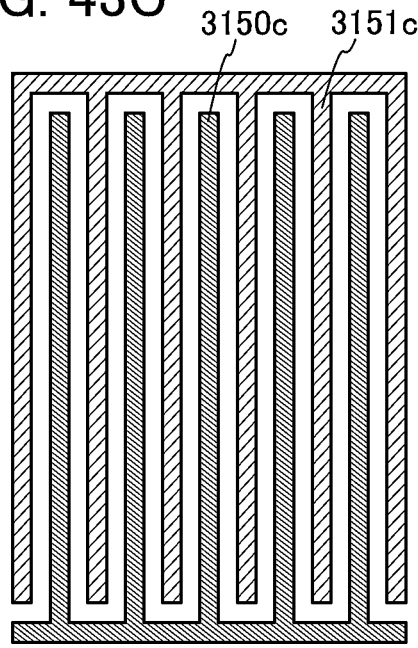

FIGS. 43A to 43C each illustrate an example of the pair of electrodes 3150 and 3151 that can be used in the IPS mode. As illustrated in top views of FIGS. 43A to 43C, the pair of electrodes 3150 and 3151 are alternatively formed. In FIG. 43A, electrodes 3150a and 3151a each have an undulating wave shape. In FIG. 43B, electrodes 3150b and 3151b each have a comb-like shape and partly overlap with each other. In FIG. 43C, electrodes 3150c and 3151c have a comb-like shape in which the electrodes are meshed with each other.

FIGS. 41B1 and 41B2 are cross-sectional schematic views each illustrating a pixel structure of a liquid crystal display device of an FFS mode. The FFS mode is also a horizontal electric field method as in the IPS mode and has a structure in which the electrode 3151 is formed over the electrode 3150 with an insulating film provided therebetween as illustrated in FIGS. 41B1 and 41B2.

The pair of electrodes 3150 and 3151 each preferably have a light-transmitting property. The polarizing plate 3103 is formed on the substrate 3101 side and the polarizing plate 3104 is formed on the substrate 3102 side. The absorption axis of the polarizing plate 3103 and the absorption axis of the polarizing plate 3104 are in a cross nicol state.

When a voltage is applied between the pair of electrodes 3150 and 3151 in a liquid crystal display device having such a structure, the liquid crystal molecules 3105 are aligned along an electric flux line deviated from a rubbing direction as illustrated in FIG. 41B1. Thus, light from the backlight can pass through the polarizing plate 3103, which leads to white display.

When no voltage is applied between the pair of electrodes 3150 and 3151, the liquid crystal molecules 3105 are aligned horizontally along the rubbing direction as illustrated in FIG. 41B2. As a result, light from the backlight cannot pass through the polarizing plate 3103, which leads to black display. The grayscale can be expressed by adjusting the voltage applied between the pair of electrodes 3150 and 3151. Thus, predetermined image display is performed.

When a coloring layer is provided e, full color display can be performed. The coloring layer can be provided on either the substrate 3101 side or on the substrate 3102 side.

Figure 44A:
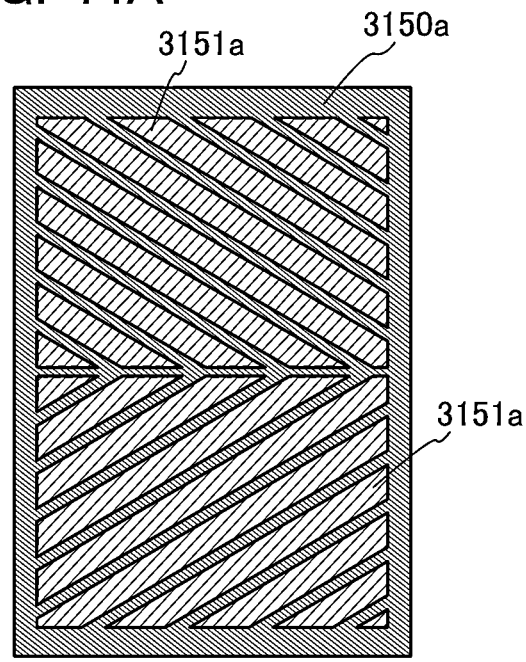
FIGS. 44A to 44C are top views each illustrating an example of a pixel of a liquid crystal device of one embodiment of the present invention.
Figure 44B:
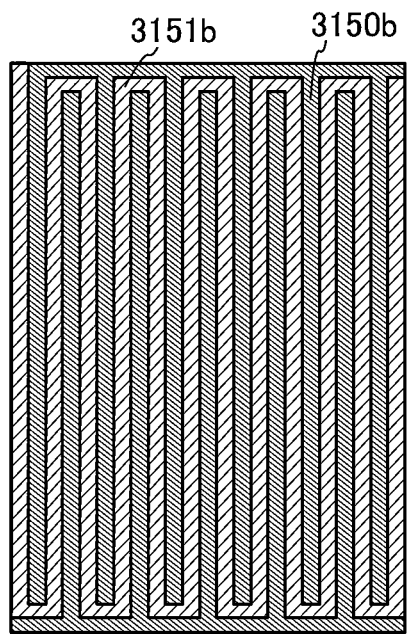
Figure 44C:
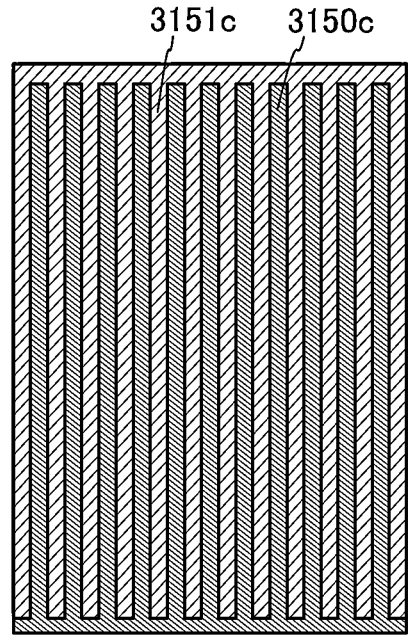

FIGS. 44A to 44C each show an example of the pair of electrodes 3150 and 3151 that can be used in the FFS mode. As illustrated in top views of FIGS. 44A to 44C, the electrode 3151 is formed with various patterns over the electrode 3150. In FIG. 44A, an electrode 3151a over an electrode 3150a has a bent dogleg-like shape (v-like shape). In FIG. 44B, an electrode 3151b over an electrode 3150b has a comb-like shape in which the electrodes are meshed with each other. In FIG. 44C, an electrode 3151c over an electrode 3150c has a comb-like shape.

A known molecule may be used as a liquid crystal molecule used for an IPS mode or an FFS mode.

Another liquid crystal mode such as a PVA mode, an ASM mode, or a TBA mode may be employed.

In the liquid crystal display device, a black matrix (a light-blocking layer), an optical member (an optical substrate) such as a polarizing member, a retardation member, or an anti-reflection member, and the like are provided as appropriate. For example, circular polarization may be employed by using a polarizing substrate and a retardation substrate. In addition, a backlight, a side light, or the like may be used as a light source.

In addition, it is possible to employ a time-division display method (also called a field-sequential driving method) with the use of a plurality of light-emitting diodes (LEDs) as a backlight. By employing a field-sequential driving method, color display can be performed without using a coloring layer.

As a display method in the pixel portion, a progressive method, an interlace method, or the like is employed. Further, color elements controlled in a pixel at the time of color display are not limited to three colors: R, G, and B (R, G, and B correspond to red, green, and blue, respectively). For example, R, G, B, and W (W corresponds to white), or R, G, B, and one or more of yellow, cyan, magenta, and the like can be used. Further, the sizes of display regions may be different between respective dots of color elements. The present invention is not limited to the application to a liquid crystal display device for color display but can also be applied to a liquid crystal display device for monochrome display.

Example 1

In this example, a transistor using a multilayer film including an oxide semiconductor layer was formed and cross-sectional observation with an electron microscope and measurement of electrical characteristics were performed.

Example Sample 1 and Example Sample 2 were prepared in the following manner. Note that Example Sample 1 and Example Sample 2 are each a TGTC transistor illustrated in FIGS. 21A to 21D. Accordingly, hereinafter, the descriptions using FIGS. 3A to 3C, FIG. 4A to 4C, FIGS. 5A and 5B, FIGS. 21A to 21D, FIGS. 24A to 24C, FIGS. 25A and 25B, and the like are referred to for Example Sample 1 and Example Sample 2.

First, Example Sample 1 is described.

A glass substrate was used as the substrate 100.

As the base insulating film 102, a silicon oxynitride film was used.

A method for forming the oxide layer 106a, the oxide semiconductor layer 106b, the oxide layer 106c, and the oxide layer 106d is described below.

First, as the oxide layer 136a, a 5-nm-thick oxide layer was deposited by a sputtering method using an In—Ga—Zn oxide (having an atomic ratio of In:Ga:Zn=1:3:2) target. Note that an argon gas (flow rate: 30 sccm) and an oxygen gas (flow rate: 15 sccm) were used as a deposition gas, the pressure was set to 0.4 Pa, the substrate temperature was set to 200° C., and a DC power of 0.5 kW was applied.

As the oxide semiconductor layer 136b, a 5-nm-thick oxide semiconductor layer was deposited by a sputtering method using an In—Ga—Zn oxide (having an atomic ratio of In:Ga:Zn=3:1:2) target. Note that an argon gas (flow rate: 30 sccm) and an oxygen gas (flow rate: 15 sccm) were used as a deposition gas, the pressure was set to 0.4 Pa, the substrate temperature was set to 200° C., and a DC power of 0.5 kW was applied.

As the oxide layer 136c, a 5-nm-thick oxide layer was deposited by a sputtering method using an In—Ga—Zn oxide (having an atomic ratio of In:Ga:Zn=1:1:1) target. Note that an argon gas (flow rate: 30 sccm) and an oxygen gas (flow rate: 15 sccm) were used as a deposition gas, the pressure was set to 0.4 Pa, the substrate temperature was set to 300° C., and a DC power of 0.5 kW was applied.

Next, the resist mask 140 was formed over the oxide layer 136c. Then, the oxide layer 136c, the oxide semiconductor layer 136b, and the oxide layer 136a were etched by a dry etching method to be the oxide layer 106c, the oxide semiconductor layer 106b, and the oxide layer 106a, respectively, and at the same time, the oxide layer 106d serving as a sidewall protective film was formed in contact with at least the side surface of the oxide semiconductor layer 106b.

Note that conditions of the dry etching were as follows: a boron trichloride gas (flow rate: 60 sccm) and a chlorine gas (flow rate: 20 sccm) were used as an etching gas, the pressure was 1.9 Pa, the ICP power was 450 W, the substrate bias power was 100 W, and the substrate temperature was 70° C. Further, ashing treatment was performed for three minutes, under conditions where an oxygen gas (flow rate: 300 sccm) was used, the pressure was 66.5 Pa, and the ICP power was 1800 W. Then, to remove the resist mask 140, treatment for three minutes was performed twice at 80° C. using "Nagase resist strip N-300" (manufactured by Nagase ChemteX Co., Ltd.).

A tungsten film was used for the source electrode 116a and the drain electrode 116b.

A silicon oxynitride film was used as the gate insulating film 112.

A multilayer film including a tantalum nitride layer and a tungsten layer provided on the tantalum nitride layer was used for the gate electrode 104.

An aluminum oxide layer and a silicon oxynitride film provided on the aluminum oxide layer were used for the protective insulating film 118.

In the above manner, Example Sample 1 was prepared.

Figure 45A:
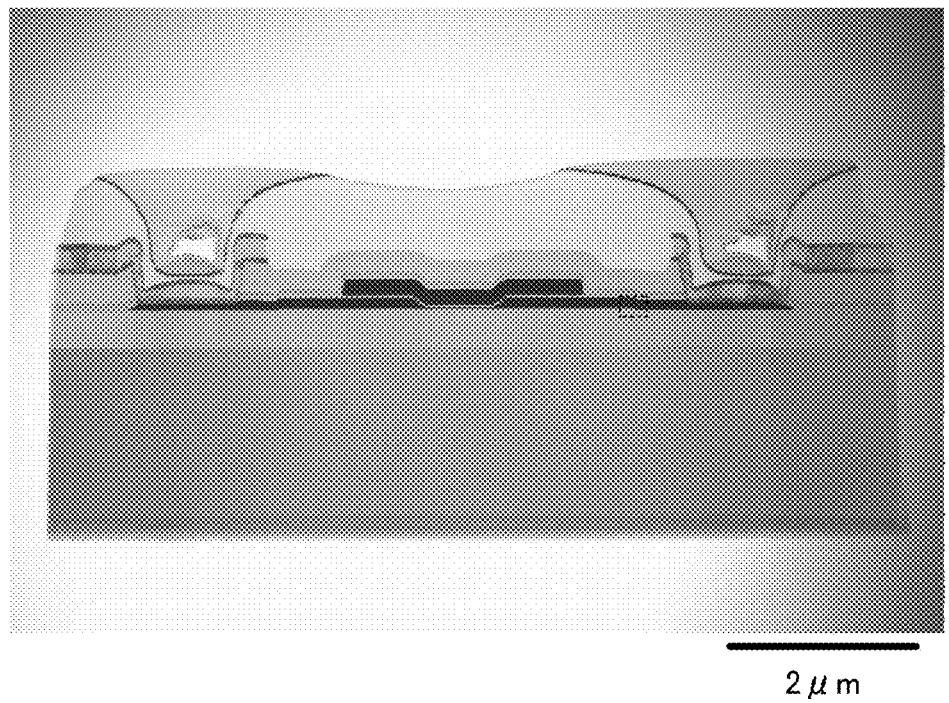
FIGS. 45A and 45B are cross-sectional observation images of a transistor obtained with STEM.
Figure 45B:
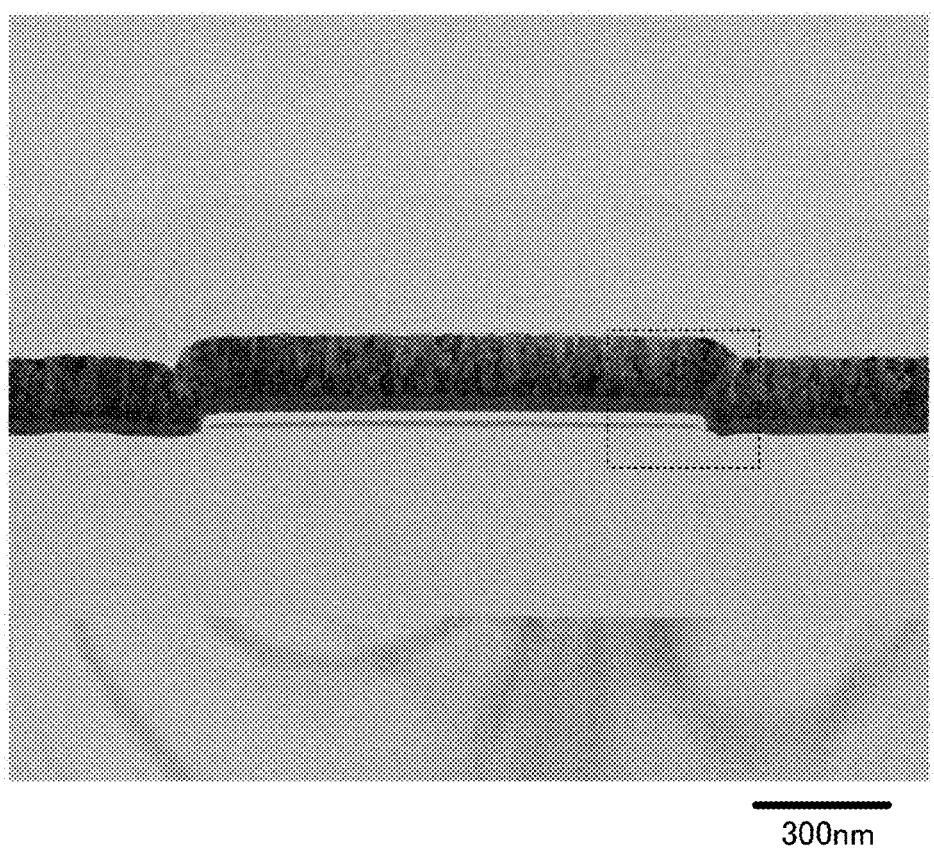
Figure 46A:
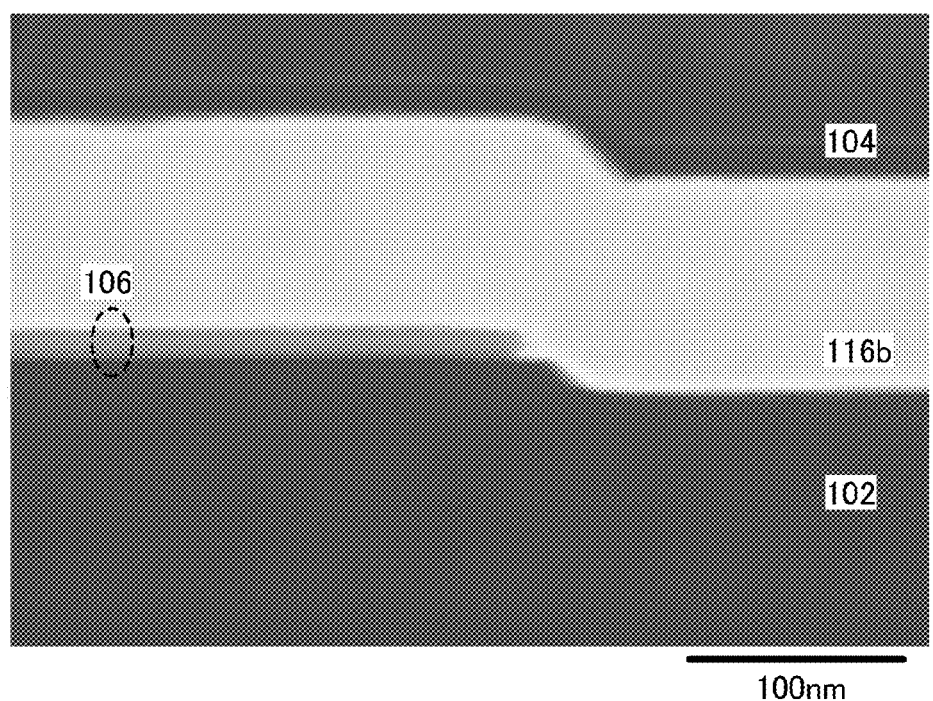
FIGS. 46A and 46B are cross-sectional observation images of a transistor obtained with STEM.
Figure 46B:
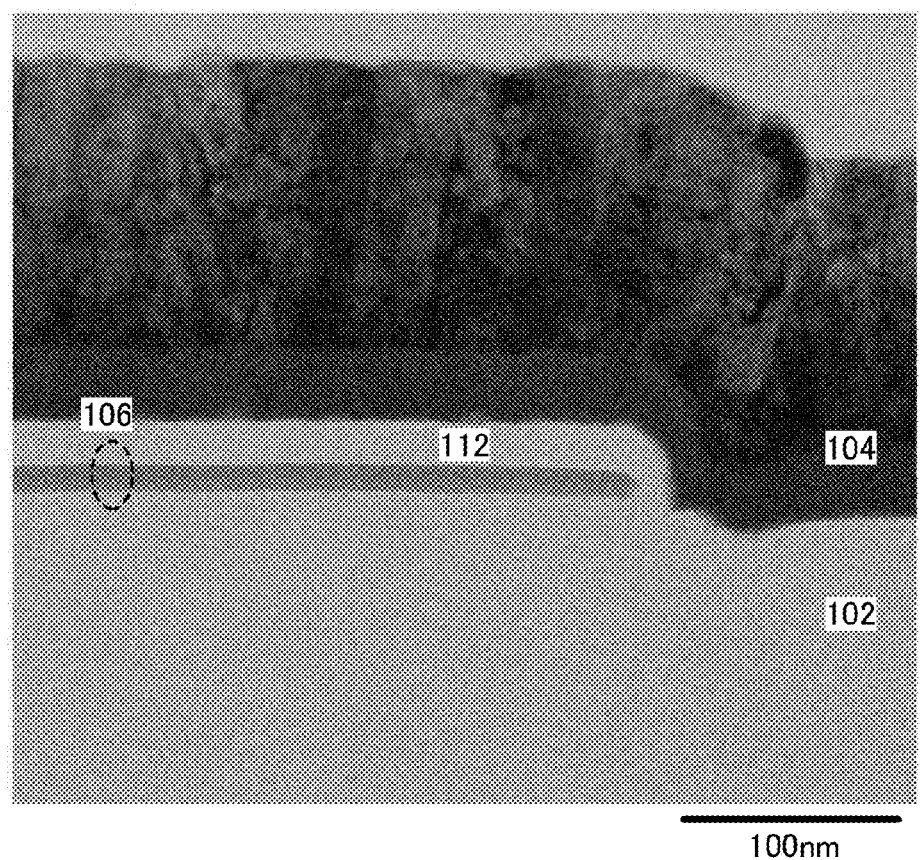

Cross-sectional observation images of Example Sample 1 obtained with a scanning transmission electron microscope (STEM) are shown in FIGS. 45A and 45B and FIGS. 46A and 46B. Note that FIG. 45A is a phase contrast image with STEM (also referred to as a transmitted electron (TE) image) in the channel length direction (a direction perpendicular to a dashed dotted line A3-A4 in FIG. 21A) of the transistor that is Example Sample 1, and an enlarged image of a portion surrounded by a dashed line in FIG. 45A is shown in FIG. 46A. FIG. 46A is a Z contrast image (ZC image) with STEM of a cross section including an edge of the multilayer film 106. FIG. 45B is a bright field image with STEM in the channel width direction (a direction parallel to the dashed dotted line A3-A4 in FIG. 21A) of the transistor that is Example Sample 1, and an enlarged image of a portion surrounded by a dashed line in FIG. 45B is shown in FIG. 46B. Note that FIG. 46B is a TE image with STEM of a cross section including an edge of the multilayer film 106.

FIG. 45A and FIG. 46A show that the edge of the multilayer film 106 has a curved surface in the channel length direction of the transistor that is Example Sample 1. FIG. 45B and FIG. 46B show that the edge of the multilayer film 106 has a curved surface in the channel width direction of the transistor that is Example Sample 1. That is, Example Sample 1 has a cross-sectional structure like the one illustrated in FIG. 1A. Further, FIGS. 45A and 45B and FIGS. 46A and 46B show that the base insulating film 102 of Example Sample 1 has three regions having different thicknesses, and that step coverage with the gate insulating film 112 or the like is high.

Next, Example Sample 2 is described.

A glass substrate was used as the substrate 100.

As the base insulating film 102, a silicon oxynitride film was used.

A method for forming the oxide layer 106a, the oxide semiconductor layer 106b, the oxide layer 106c, and the oxide layer 106d is described below.

First, as the oxide layer 136a, a 5-nm-thick oxide layer was deposited by a sputtering method using an In—Ga—Zn oxide (having an atomic ratio of In:Ga:Zn=1:3:2) target. Note that an argon gas (flow rate: 30 sccm) and an oxygen gas (flow rate: 15 sccm) were used as a deposition gas, the pressure was set to 0.4 Pa, the substrate temperature was set to 200° C., and a DC power of 0.5 kW was applied.

As the oxide semiconductor layer 136b, a 15-nm-thick oxide semiconductor layer was deposited by a sputtering method using an In—Ga—Zn oxide (having an atomic ratio of In:Ga:Zn=1:1:1) target. Note that an argon gas (flow rate: 30 sccm) and an oxygen gas (flow rate: 15 sccm) were used as a deposition gas, the pressure was set to 0.4 Pa, the substrate temperature was set to 300° C., and a DC power of 0.5 kW was applied.

As the oxide layer 136c, a 5-nm-thick oxide layer was deposited by a sputtering method using an In—Ga—Zn oxide (having an atomic ratio of In:Ga:Zn=1:3:1) target. Note that an argon gas (flow rate: 30 sccm) and an oxygen gas (flow rate: 15 sccm) were used as a deposition gas, the pressure was set to 0.4 Pa, the substrate temperature was set to 300° C., and a DC power of 0.5 kW was applied.

Next, the resist mask 140 was formed over the oxide layer 136c. Then, the oxide layer 136c, the oxide semiconductor layer 136b, and the oxide layer 136a were etched by a dry etching method to be the oxide layer 106c, the oxide semiconductor layer 106b, and the oxide layer 106a, respectively, and at the same time, the oxide layer 106d serving as a sidewall protective film was formed in contact with at least the side surface of the oxide semiconductor layer 106b.

Note that conditions of the dry etching were as follows: a boron trichloride gas (flow rate: 60 sccm) and a chlorine gas (flow rate: 20 sccm) were used as an etching gas, the pressure was 1.9 Pa, the ICP power was 450 W, the substrate bias power was 100 W, and the substrate temperature was 70° C. Further, ashing treatment was performed for three minutes, in which an oxygen gas (flow rate: 300 sccm) was used, the pressure was 66.5 Pa, and the ICP power was 1800 W. Then, to remove the resist mask 140, treatment for three minutes was performed twice at 80° C. using "Nagase resist strip N-300" (manufactured by Nagase ChemteX Co., Ltd.).

A tungsten film was used for the source electrode 116a and the drain electrode 116b.

A silicon oxynitride film was used as the gate insulating film 112.

A multilayer film including a tantalum nitride layer and a tungsten layer provided on the tantalum nitride layer was used for the gate electrode 104.

A silicon nitride layer and a silicon oxynitride film provided over the silicon nitride layer were used for the protective insulating film 118.

In the above manner, Example Sample 2 was prepared.

Figure 47A:
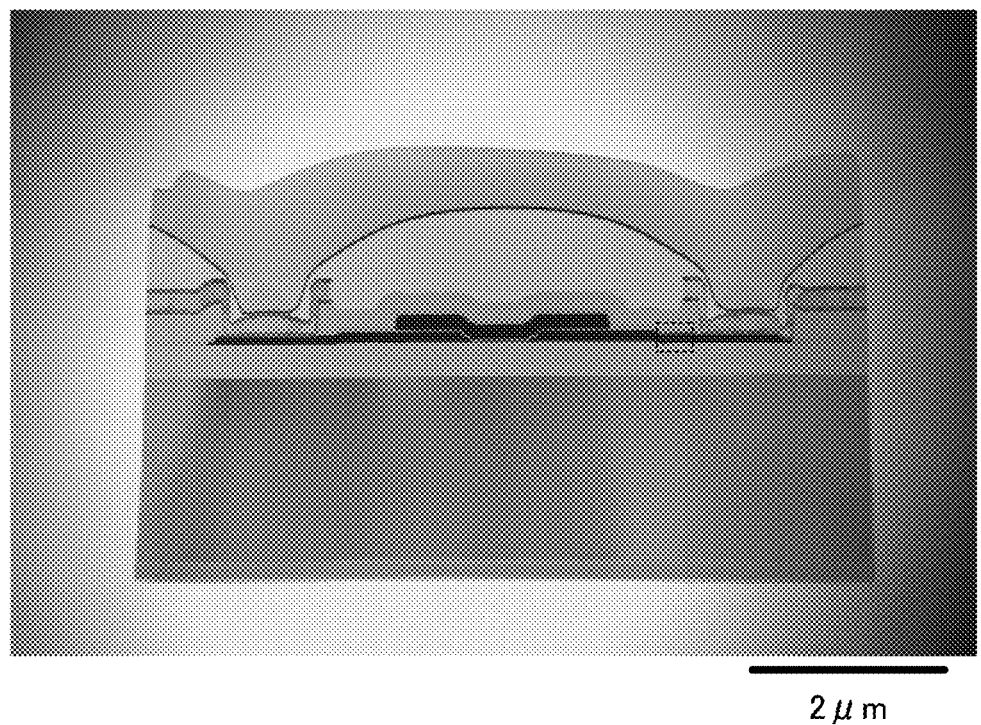
FIGS. 47A and 47B are cross-sectional observation images of a transistor obtained with STEM.
Figure 47B:
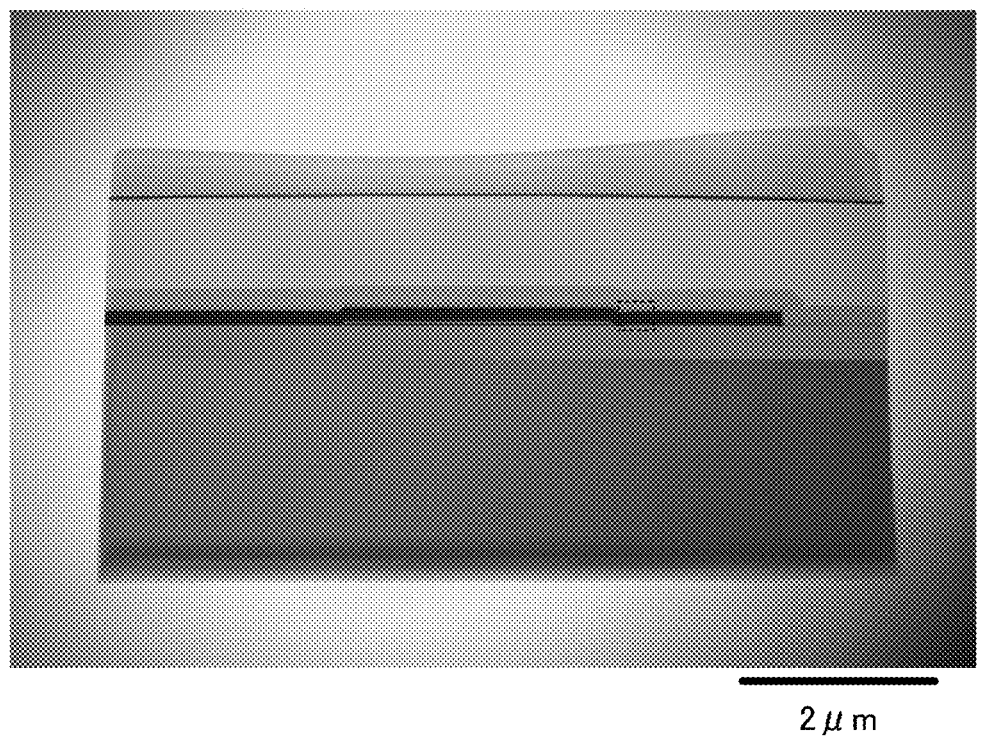
Figure 48A:
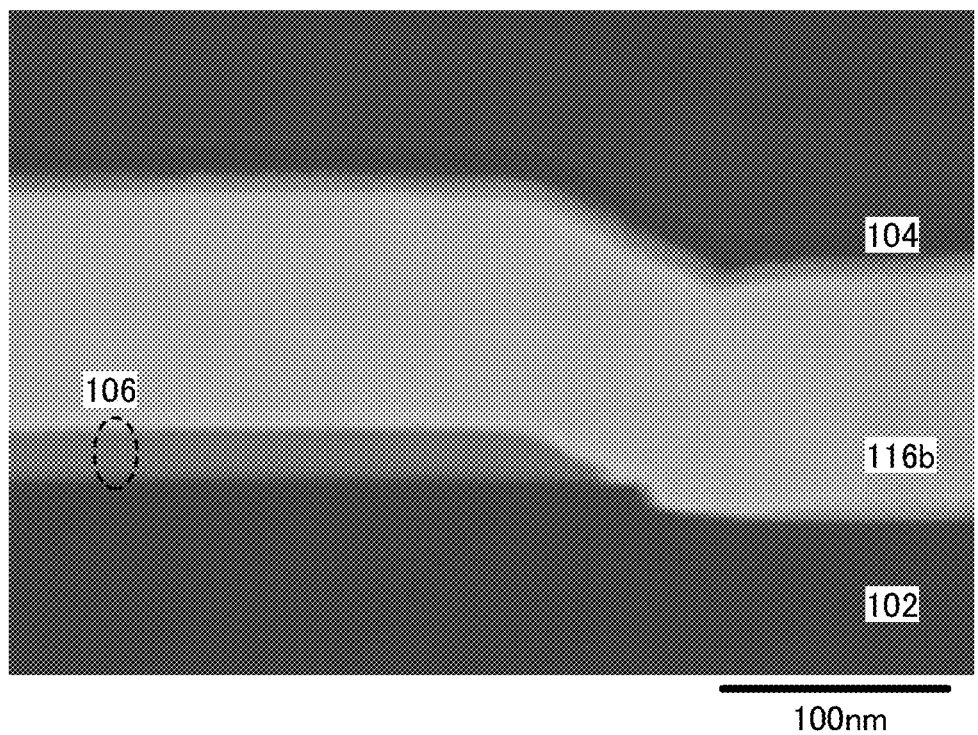
FIGS. 48A and 48B are cross-sectional observation images of a transistor obtained with STEM.
Figure 48B:
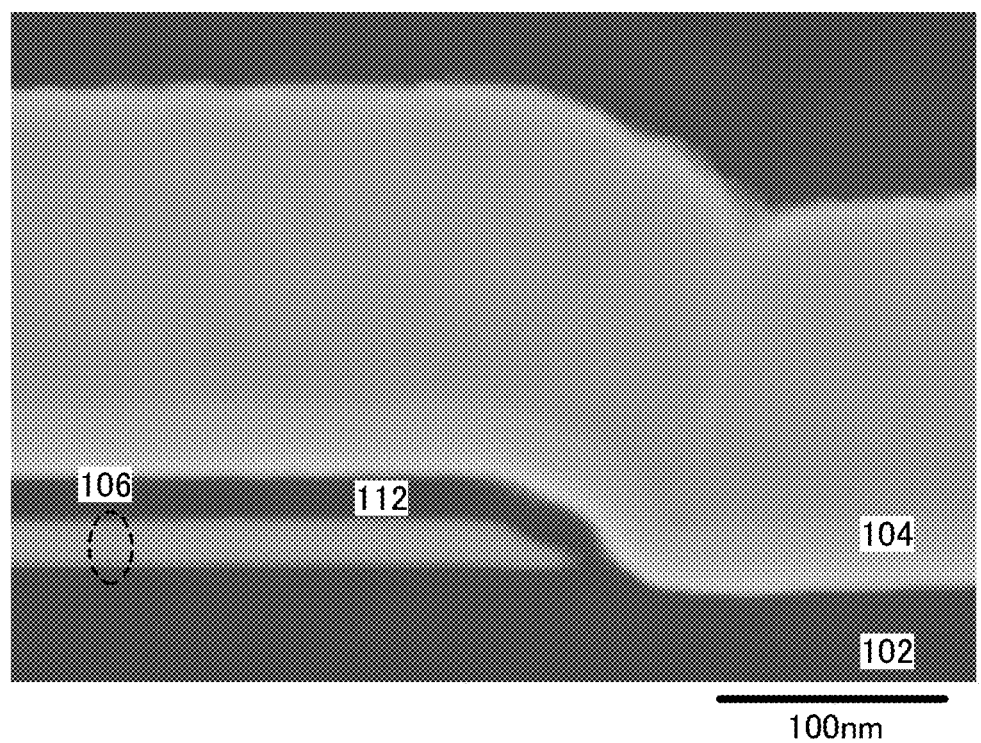

Cross-sectional observation images of Example Sample 2 obtained with STEM are shown in FIGS. 47A and 47B and FIGS. 48A and 48B. Note that FIG. 47A is a TE image obtained with STEM in the channel length direction (a direction perpendicular to the dashed dotted line A3-A4 in FIG. 21A) of the transistor that is Example Sample 2, and an enlarged image of a portion surrounded by a dashed line in FIG. 47A is shown in FIG. 48A. FIG. 48A is a ZC image with STEM of a cross section including an edge of the multilayer film 106. FIG. 47B is a TE image obtained with STEM in the channel width direction (a direction parallel to the dashed dotted line A3-A4 in FIG. 21A) of the transistor that is Example Sample 2, and an enlarged image of a portion surrounded by a dashed line in FIG. 47B is shown in FIG. 48B. Note that FIG. 48B is a ZC image with STEM of a cross section including an edge of the multilayer film 106.

FIG. 47A and FIG. 48A show that the edge (top and bottom edges) of the multilayer film 106 has a curved surface in the channel length direction of the transistor that is Example Sample 2. FIG. 47B and FIG. 48B show that the edge (top and bottom edges) of the multilayer film 106 has a curved surface in the channel width direction of the transistor that is Example Sample 2. That is, Example Sample 2 has a cross-sectional structure like the one illustrated in FIG. 1D. Further, FIGS. 47A and 47B and FIGS. 48A and 48B show that the base insulating film 102 of Example Sample 2 has three regions having different thicknesses, and that step coverage with the gate insulating film 112 or the like is high.

According to this example, it is found that the multilayer film 106 having the cross-sectional structure illustrated in FIGS. 1A to 1D can be obtained.

Next, electrical characteristics (Vg-Id characteristics) of the transistors that are Example Sample 1 and Example Sample 2 were evaluated. Vg-Id characteristics at 16 points in the plane of the substrate 100 in the transistor of Example Sample 1 were measured and the obtained results are collectively shown in FIG. 49A. Further, Vg-Id characteristics at 25 points in the plane of the substrate 100 in the transistor of Example Sample 2 were measured and the obtained results are collectively shown in FIG. 49B. Here, the drain current Id which was measured under conditions where the drain voltage was 0.1 V or 3.3 V and the gate voltage Vg was swept from −4 V to 4 V, and field-effect mobility which was measured under conditions where the drain voltage was 0.1 V and the gate voltage Vg was swept from −4 V to 4 V are shown.

Note that the transistor of Example Sample 1 has a channel length of 5 μm and a channel width of 10 μm. The transistor of Example Sample 2 has a channel length of 0.66 μm and a channel width of 10 μm.

Figure 49A:
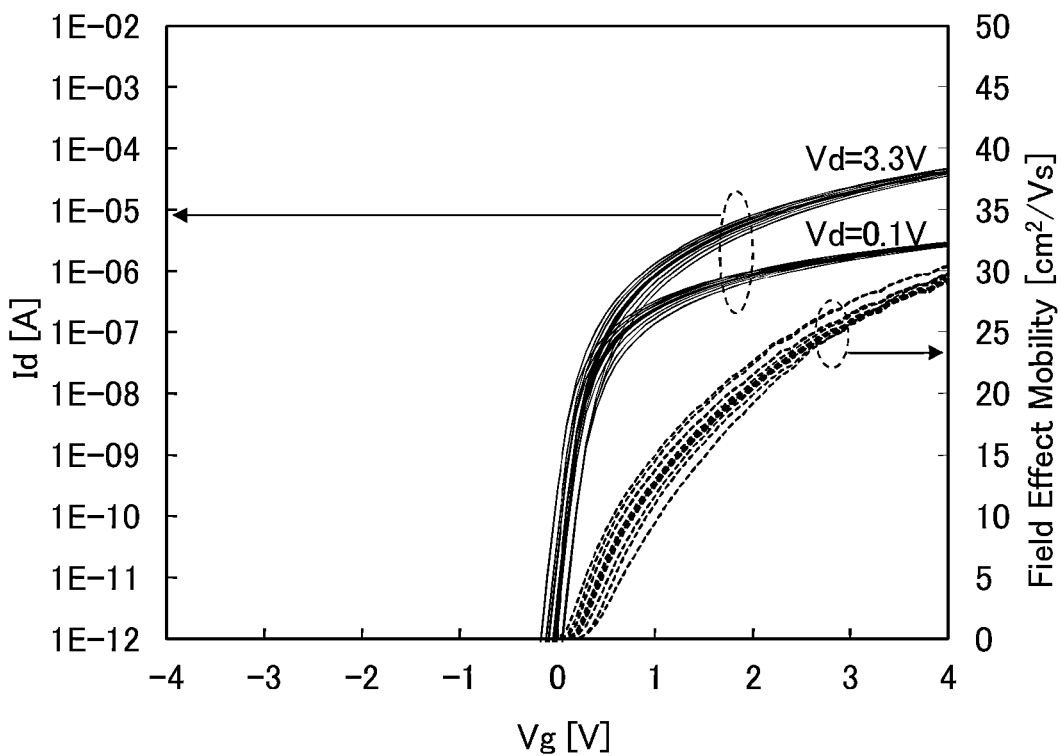
FIGS. 49A and 49B each show Vg-Id characteristics of a transistor.
Figure 49B:
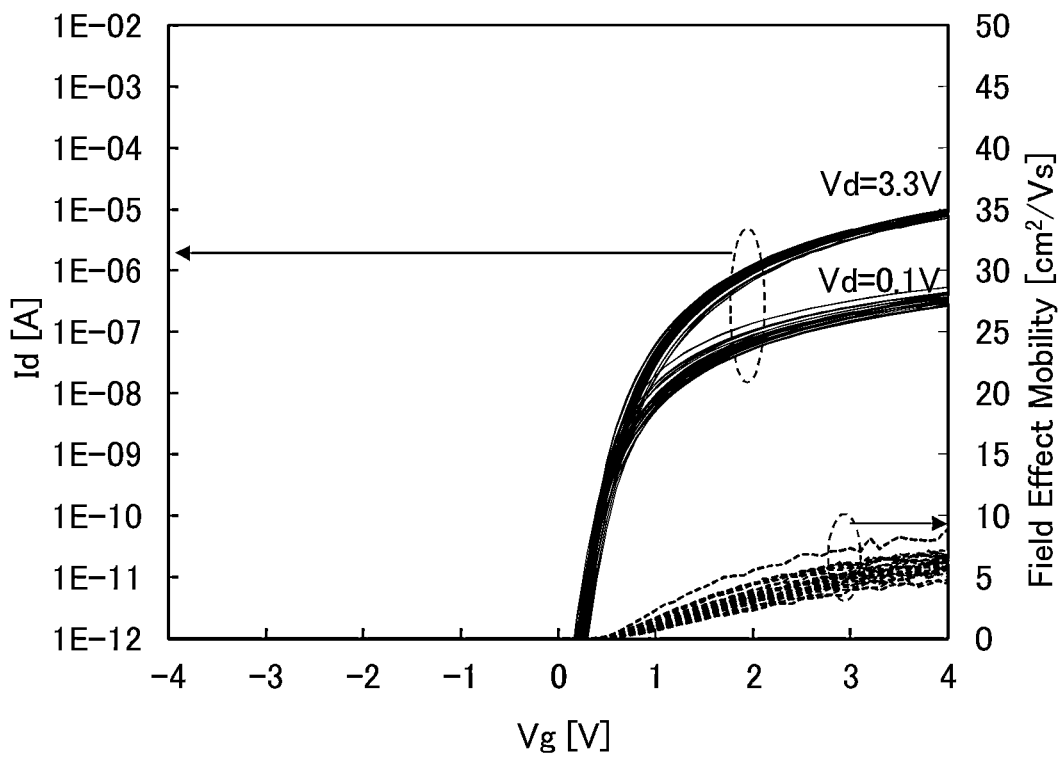

FIGS. 49A and 49B show that: the transistors of Example Sample 1 and Example Sample 2 have extremely small Vg-Id characteristic variation; the transistor of Example Sample 1 has high field-effect mobility; and the transistor of Example Sample 2 has small Vg-Id characteristic variation even when having a small channel length and has what is called a normally-off electrical characteristics in which the drain current Id is a positive value even when the gate voltage Vg is 0 V.

The above results show that the Vg-Id characteristic variation of the transistor is small because the side surface of the oxide semiconductor layer 106b is protected by the oxide layer 106d.

REFERENCE NUMERALS

70a: deposition chamber, 70b: deposition chamber, 71: atmosphere-side substrate supply chamber, 72a: load lock chamber, 72b: unload lock chamber, 73: transfer chamber, 73a: transfer chamber, 73b: transfer chamber, 74: cassette port, 75: substrate heating chamber, 76: substrate transfer robot, 80: deposition chamber, 80a: deposition chamber, 80b: deposition chamber, 80c: deposition chamber, 80d: deposition chamber, 81: atmosphere-side substrate supply chamber, 82: load and unload lock chamber, 83: transfer chamber, 84: cassette port, 85: substrate heating chamber, 86: substrate transfer robot, 87: target, 88: deposition-preventing plate, 89: glass substrate, 90: substrate stage, 92: substrate stage, 93: heating system, 94: refiner, 95a: cryopump, 95b: cryopump, 95c: turbo molecular pump, 95d: cryopump, 95e: cryopump, 95f: cryopump, 96: vacuum pump, 96a: vacuum pump, 96b: vacuum pump, 96c: vacuum pump, 97: mass flow controller, 98: gas heating system, 99: cryotrap, 100: substrate, 101: semiconductor substrate, 102: base insulating film, 103: element isolation region, 104: gate electrode, 105: oxide layer, 106: multilayer film, 106a: oxide layer, 106b: oxide semiconductor layer, 106c: oxide layer, 106d: oxide layer, 107: gate insulating film, 109: gate electrode, 111a: impurity region, 111b: impurity region, 112: gate insulating film, 115: insulating film, 116a: source electrode, 116b: drain electrode, 116c: electrode, 117: insulating film, 117a: source electrode, 117b: drain electrode, 118: protective insulating film, 118a: silicon oxide layer, 119a: contact plug, 119b: contact plug, 120: insulating film, 121: insulating film, 122: insulating film, 123a: wiring, 123b: wiring, 124: electrode, 125: insulating film, 132: base insulating film, 133: base insulating film, 136a: oxide layer, 136b: oxide semiconductor layer, 136c: oxide layer, 137d: oxide layer, 140: resist mask, 145: insulating film, 149: wiring, 150: plasma, 152: base insulating film, 156: wiring, 156a: oxide layer, 156b: oxide semiconductor layer, 156c: oxide layer, 160: semiconductor film, 200: substrate, 204: gate electrode, 206: multilayer film, 206a: oxide layer, 206b: oxide semiconductor layer, 206c: oxide layer, 206d: oxide layer, 212: gate insulating film, 213: gate insulating film, 216a: source electrode, 216b: drain electrode, 218: protective insulating film, 233: gate insulating film, 500: microcomputer, 501: direct-current power source, 502: bus line, 503: power gate controller, 504: power gate, 505: CPU, 506: volatile memory portion, 507: nonvolatile memory portion, 508: interface, 509: sensor portion, 511: optical sensor, 512: amplifier, 513: AD converter, 514: photoelectric conversion element, 517: transistor, 519: transistor, 530: light-emitting element, 700: substrate, 719: light-emitting element, 720: insulating film, 721: insulating film, 731: terminal, 732: FPC, 733*a*: wiring, 733*b*: wiring, 733*c*: wiring, 734: seal material, 735: driver circuit, 736: driver circuit, 737: pixel, 741: transistor, 742: capacitor, 743: switching element, 744: signal line, 750: pixel, 751: transistor, 752: capacitor, 753: liquid crystal element, 754: scan line, 755: signal line, 781: electrode, 782: light-emitting layer, 783: electrode, 784: bank, 785*a*: intermediate layer, 785*b*: intermediate layer, 785*c*: intermediate layer, 785*d*: intermediate layer, 786*a*: light-emitting layer, 786*b*: light-emitting layer, 786*c*: light-emitting layer, 791: electrode, 792: insulating film, 793: liquid crystal layer, 794: insulating film, 795: spacer, 796: electrode, 797: substrate, 1000: target, 1001: ion, 1002: sputtered particle, 1003: oxide semiconductor layer, 1004: amorphous film, 1005: plasma, 1141: switching element, 1142: memory cell, 1143: memory cell group, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 3100: liquid crystal layer, 3101: substrate, 3102: substrate, 3103: polarizing plate, 3104: polarizing plate, 3105: liquid crystal molecule, 3108: electrode, 3109: electrode, 3109*a*: electrode, 3109*b*: electrode, 3109*c*: electrode, 3150: electrode, 3150*a*: electrode, 3150*b*: electrode, 3150*c*: electrode, 3151: electrode, 3151*a*: electrode, 3151*b*: electrode, 3151*c*: electrode, 3158: projection, 3159: projection, 3162: insulating film, 3163: insulating film, 8100: alarm device, 8101: microcomputer, 8200: indoor unit, 8201: housing, 8202: air outlet, 8203: CPU, 8204: outdoor unit, 8300: electric refrigerator-freezer, 8301: housing, 8302: door for a refrigerator, 8303: door for a freezer, 8304: CPU, 9700: electric vehicle, 9701: 9701, 9702: control circuit, 9703: driving device, 9704: processing unit.

This application is based on Japanese Patent Application serial no. 2012-230351 filed with Japan Patent Office on Oct. 17, 2012 and Japanese Patent Application serial no. 2012-244907 filed with Japan Patent Office on Nov. 6, 2012, the entire contents of which are hereby incorporated by reference.

The invention claimed is:

1. A semiconductor device comprising:
   a multilayer film comprising an oxide semiconductor layer and an oxide layer;
   a source electrode and a drain electrode in contact with the oxide layer; and
   a gate electrode overlapping with the oxide semiconductor layer with a gate insulating film therebetween,
   wherein a thickness of the multilayer film is greater than or equal to 1/50 and less than or equal to 50 times as large as a curvature radius of a side surface of the multilayer film,
   wherein the oxide semiconductor layer and the oxide layer contain at least indium,
   wherein the oxide semiconductor layer is wrapped by the oxide layer, and
   wherein an edge of the multilayer film in a cross section has a curvature.

2. The semiconductor device according to claim 1,
   wherein the oxide semiconductor layer has a higher proportion of indium than the oxide layer.

3. The semiconductor device according to claim 1,
   wherein the oxide layer and the oxide semiconductor layer contain indium, zinc, and an element M,
   wherein the element M is one of aluminum, titanium, silicon, gallium, germanium, yttrium, zirconium, tin, lanthanum, cerium, and hafnium, and
   wherein the oxide layer has a higher proportion of the element M than the oxide semiconductor layer.

4. The semiconductor device according to claim 1,
   wherein the oxide layer has a larger energy gap than the oxide semiconductor layer.

5. The semiconductor device according to claim 1,
   wherein a gap between an energy at the bottom of a conduction band of the oxide layer and an energy at the bottom of a conduction band of the oxide semiconductor layer is greater than or equal to 0.05 eV and less than or equal to 2 eV.

6. The semiconductor device according to claim 1, further comprising a base insulating film below the multilayer film,
   wherein a region of the base insulating film overlapping with the multilayer film has a larger thickness than the other region of the base insulating film.

7. The semiconductor device according to claim 6,
   wherein the base insulating film includes a first region overlapping with the multilayer film, a second region surrounding the first region, and a third region surrounding the second region,
   wherein the second region has a smaller thickness than the first region, and
   wherein the third region has a smaller thickness than the second region.

8. A semiconductor device comprising:
   a first oxide layer;
   an oxide semiconductor layer over the first oxide layer;
   a second oxide layer over the oxide semiconductor layer;
   a third oxide layer on a side surface of the oxide semiconductor layer;
   a source electrode and a drain electrode in contact with the second oxide layer and the third oxide layer; and
   a gate electrode overlapping with the oxide semiconductor layer with a gate insulating film therebetween,
   wherein a thickness of the third oxide layer is larger than a thickness of the second oxide layer,
   wherein the oxide semiconductor layer, the first oxide layer, the second oxide layer and the third oxide layer contain at least indium, and
   wherein a side surface of the third oxide layer in a cross section has a curvature.

9. The semiconductor device according to claim 8,
   wherein a gap between an energy at the bottom of a conduction band of each of the first oxide layer, the second oxide layer and the third oxide layer and an energy at the bottom of a conduction band of the oxide semiconductor layer is greater than or equal to 0.05 eV and less than or equal to 2 eV.

10. The semiconductor device according to claim 8, wherein a total thickness of the first oxide layer, the oxide semiconductor layer and the second oxide layer is greater than or equal to 1/50 and less than or equal to 50 times as large as a curvature radius of the side surface of the third oxide layer.

11. The semiconductor device according to claim 8, further comprising a base insulating film below the first oxide layer,
    wherein a region of the base insulating film overlapping with the first oxide layer, the second oxide layer and the third oxide layer has a larger thickness than the other region of the base insulating film.

12. The semiconductor device according to claim 11,
wherein the base insulating film includes a first region overlapping with the first oxide layer, the second oxide layer and the third oxide layer, a second region surrounding the first region, and a third region surrounding the second region,
wherein the second region has a smaller thickness than the first region, and
wherein the third region has a smaller thickness than the second region.

* * * * *

UNITED STATES PATENT AND TRADEMARK OFFICE
CERTIFICATE OF CORRECTION

| | | |
|---|---|---|
| PATENT NO. | : 9,306,079 B2 | Page 1 of 1 |
| APPLICATION NO. | : 14/054110 | |
| DATED | : April 5, 2016 | |
| INVENTOR(S) | : Shunpei Yamazaki et al. | |

It is certified that error appears in the above-identified patent and that said Letters Patent is hereby corrected as shown below:

Specification

At column 10, line 16, "In, m," should be --In, M,--;

At column 31, line 23, "9.6 mm" should be --9.6 mm.--.

Signed and Sealed this
Nineteenth Day of July, 2016

Michelle K. Lee
*Director of the United States Patent and Trademark Office*